United States Patent
Liu et al.

(10) Patent No.: US 9,973,074 B2
(45) Date of Patent: May 15, 2018

(54) SEMICONDUCTOR INTEGRATED CIRCUIT DEVICE

(71) Applicant: Renesas Electronics Corporation, Tokyo (JP)

(72) Inventors: Ming Liu, Tokyo (JP); Tatsuo Nakagawa, Tokyo (JP); Kenichi Osada, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 15/489,944

(22) Filed: Apr. 18, 2017

(65) Prior Publication Data
US 2017/0222540 A1 Aug. 3, 2017

Related U.S. Application Data

(62) Division of application No. 13/862,803, filed on Apr. 15, 2013, now Pat. No. 9,658,631.

(30) Foreign Application Priority Data

Apr. 20, 2012 (JP) .................... 2012-096467

(51) Int. Cl.
*H02M 1/088* (2006.01)
*G01R 19/10* (2006.01)
(Continued)

(52) U.S. Cl.
CPC ............ *H02M 1/088* (2013.01); *G01R 19/10* (2013.01); *H02M 3/157* (2013.01); *H02M 3/158* (2013.01);
(Continued)

(58) Field of Classification Search
CPC ...... H02M 1/088; H02M 3/157; H02M 3/158; H02M 2001/0025; H03M 1/12; G01R 19/10
See application file for complete search history.

(56) References Cited

U.S. PATENT DOCUMENTS 4,092,863 A * 6/1978 Turner .................... G01K 7/14
374/169
5,638,005 A 6/1997 Rajan
(Continued)

FOREIGN PATENT DOCUMENTS

| JP | 2008-125286 | 5/2008 |
| JP | 2011-166959 | 8/2011 |
| JP | 2011-239495 | 11/2011 |

OTHER PUBLICATIONS

Stefanutti et al., Fully Digital Hysteresis Modulation With Switching-Time Prediction, IEEE Transaction S on Industry Applications, vol. 42, No. 3, May/Jun. 2006.
(Continued)

Primary Examiner — Zeev V Kitov
(74) Attorney, Agent, or Firm — Young & Thompson

(57) ABSTRACT

A conventional power supply device has a problem in miniaturization. A power supply device generates a prediction value of an error signal from first and second error signals, and controls an output voltage so that the prediction value lies between first and second threshold values. The first error signal is obtained by converting an error voltage based on the difference between the output voltage and a reference voltage at a first timing. The second error signal is obtained by converting an error voltage based on the difference between the output voltage and the reference voltage at a second timing.

8 Claims, 37 Drawing Sheets

(51) Int. Cl.
*H03M 1/12* (2006.01)
*H02M 3/157* (2006.01)
*H02M 3/158* (2006.01)
*H02M 1/00* (2006.01)

(52) U.S. Cl.
CPC ...... *H03M 1/12* (2013.01); *H02M 2001/0025* (2013.01)

(56) References Cited

U.S. PATENT DOCUMENTS

2008/0042632 A1* 2/2008 Chapuis ............... H02M 3/157
 323/283
2008/0288201 A1 11/2008 Oettinger

OTHER PUBLICATIONS

Vidal-Idiarte et al., Two-Loop Digital Sliding Mode Control of DC-DC Power Converters Based on Predictive Interpolation, IEEE Transactions on Industrial Electronics, vol. 58, No. 6, Jun. 2011.
Japanese Official Action—2012-096467—dated Jan. 28, 2016.
Chinese Official Action—2013101597231—dated Aug. 1, 2016.

\* cited by examiner

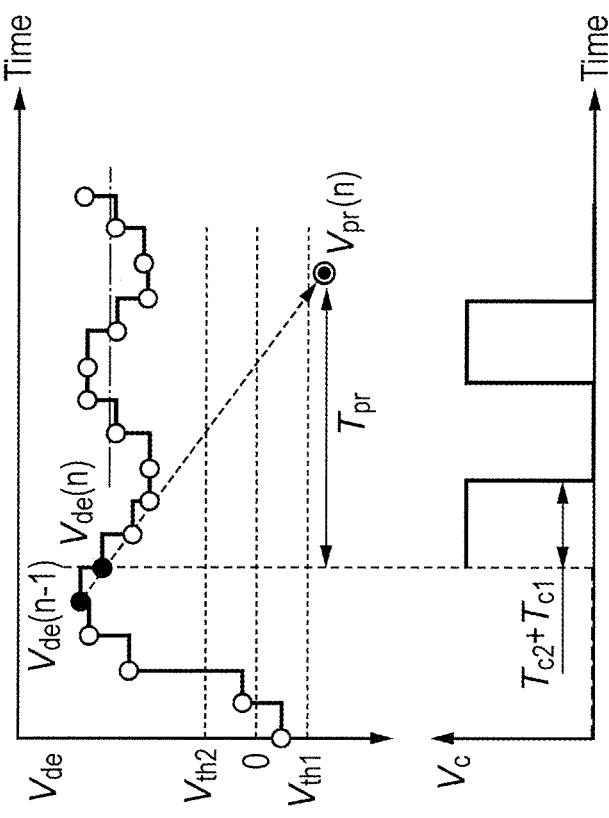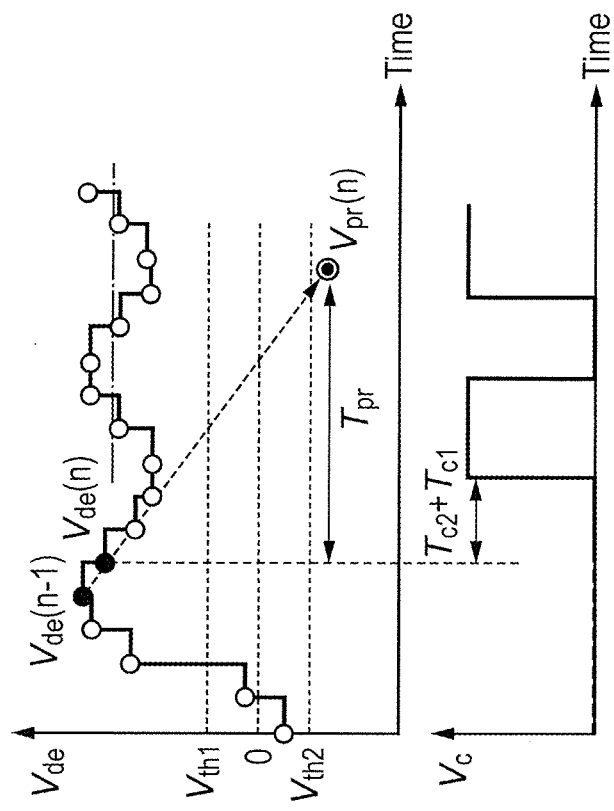

FIG. 7

| | DETERMINATION CONDITIONS | | $V_c$ |
|---|---|---|---|
| NORMAL MODE | $V_{de}(n) > V_{th2}$ | $V_{pr}(n) > V_{th1}$ | L |
| | $V_{de}(n) < V_{th1}$ | $V_{pr}(n) < V_{th2}$ | H |
| | ~ | $V_{th2} < V_{pr}(n) < V_{th1}$ | STATE HELD |
| ERRONEOUS OPERATION MODE | $V_{de}(n) > V_{th1}$ | $V_{pr}(n) < V_{th2}$ | L |
| | $V_{de}(n) < V_{th2}$ | $V_{pr}(n) > V_{th1}$ | H |

FIG. 20

| | DETERMINATION CONDITIONS | | $V_{s1}$ | $V_{s2}$ | OUTPUT OF SELECTOR |
|---|---|---|---|---|---|
| NORMAL MODE | $V_{de(n)} > V_{th2}$ | $V_{pr(n)} > V_{th1}$ | L | L | L(0%) |
| | $V_{de(n)} < V_{th1}$ | $V_{pr(n)} < V_{th2}$ | H | H | H(100%) |
| | ~ | $V_{th2} < V_{pr(n)} < V_{th1}$ | H | L | $V_{PWM}$ |
| ERRONEOUS OPERATION MODE | $V_{de(n)} > V_{th1}$ | $V_{pr(n)} < V_{th2}$ | L | L | L(0%) |
| | $V_{de(n)} < V_{th2}$ | $V_{pr(n)} > V_{th1}$ | H | H | H(100%) |

FIG. 27

| REGISTER VALUE \ USABLE FUNCTION | CMS1 | CMS2 | CMS3 | CMS4 |
|---|---|---|---|---|
| 0 | ○ | | | |
| 1 | ○ | | | ○ |
| 2 | | ○ | | |
| 3 | | ○ | | ○ |
| 4 | | | ○ | |
| 5 | | | ○ | ○ |

FIG. 31

| SETTING ITEM \ DRIVE CHANNEL | 1Ch | 2Ch | 3Ch | ... |
|---|---|---|---|---|
| CALCULATION CYCLE | T11 | T12 | T13 | |
| PRIORITY | 1 | 3 | 2 | |

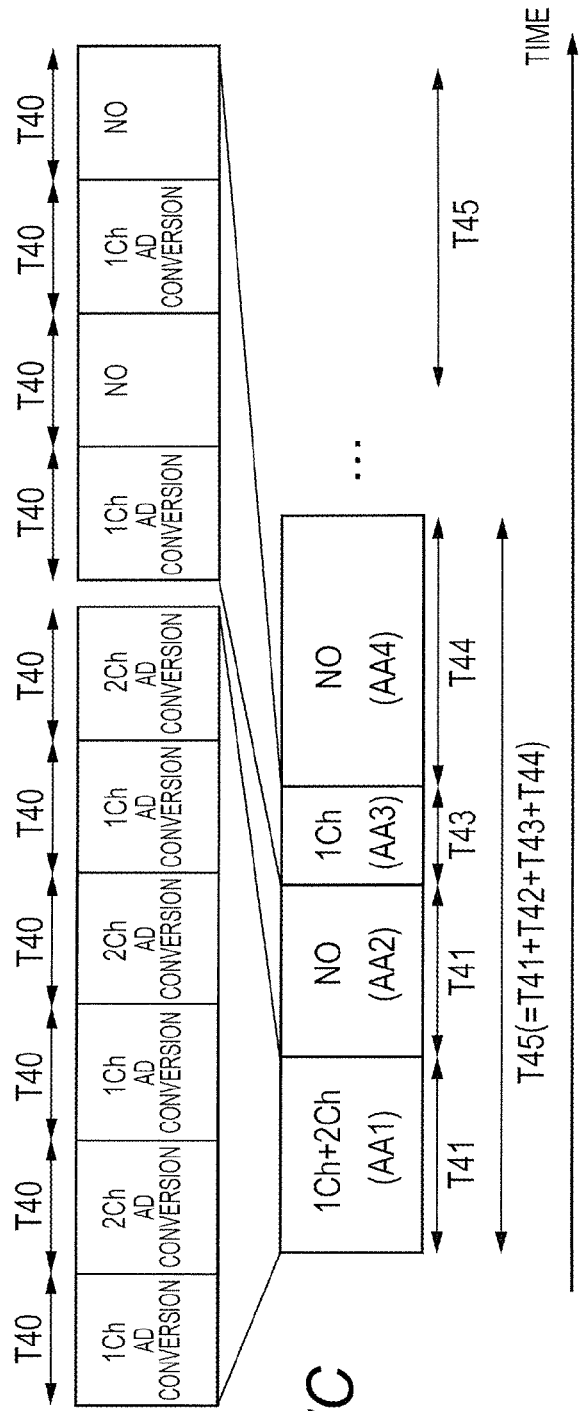

SEMICONDUCTOR INTEGRATED CIRCUIT DEVICE

BACKGROUND

The present invention relates to a semiconductor integrated circuit device and, for example, relates to a technique effective to a semiconductor integrated circuit device suitably used for a power supply device.

In recent years, various electronic devices such as cellular phones and digital home appliances are becoming smaller, lighter, and multifunctional. For power supply devices for driving those devices, demands for higher reliability, miniaturization, and higher efficiency are increasing. Since a switching power supply device has advantages such as small size and high efficiency, it is widely used as a DC power supply of various electronic devices.

Two kinds of the control methods often used for a switching power supply device are a linear control method and a non-linear control method. A representative linear control method is a PWM (Pulse Width Modulation) control method which stabilizes output voltage by adjusting the timing of turning on/off a switching element by using a PWM signal of fixed frequency. On the other hand, a representative non-linear control method is a hysteretic control method in which a deviation of output voltage from a predetermined range (hysteresis width) is detected by a hysteresis comparator, and an output of the comparator controls the on/off state of the switching element. Since the hysteretic control method has an advantage that response speed is higher than that of the PWM control method, attention is being paid to the hysteretic control method.

As the hysteretic control method, an analog control power supply device realized by analog circuits is common. However, in recent years, miniaturization of a power supply device is strongly demanded, so that development of an analog control power supply device is being advanced rapidly. An analog control power supply device performs control by using analog circuits such as an amplifier, a capacitor, and a resistor. On the other hand, a digital control power supply device digitally performs control by using an AD converter and a digital controller.

In a digital control power supply device, since a part of a control circuit is realized by digital process, parts can be reduced, and miniaturization can be expected. In recent years, a plurality of methods each realizing a digital control power supply device having high response speed by using the hysteretic control method are proposed (Non-patent literatures 1 and 2).

A digital control power supply device (non-patent literature 1) will be described. By measuring switching on and off times of the previous switching period and switching cycles, the tilt of inductor current change in the switching on and off periods is obtained as a first measurement result. A sampled inductor current value is obtained as a second measurement result. From the first and second measurement results, time reaching a control threshold is predicted. The digital control power supply device does not require a high-speed AD converter and a high-speed digital controller and realizes low power consumption.

Another digital control power supply device (non-patent literature 2) will now be described. Inductor current is sampled at two points during a switching on period, and is sampled at two points also in a switching off period. By the sampling at four points, the tilt of the inductor current change is obtained. Together with the sampled inductor current values, time reaching the control threshold is predicted. The digital control power supply device does not require a high-speed AD converter and a high-speed digital controller and realizes low power consumption.

Prior art literatures were examined on the basis of the present invention and the following related arts were found.

Japanese Unexamined Patent Publication No. 2008-125286 (patent literature 1) discloses a switching power supply which predicts a deviation of the following cycle from a deviation corresponding to the voltage value between reference voltage and output voltage and performs PWM control on the basis of the predicted deviation.

Japanese Unexamined Patent Publication No. 2011-166959 (patent literature 2) discloses a DC/DC converter of PWM control realizing improved response of power supply control by increasing the speed of PID computation by making the PID computation progressed halfway on the basis of an error signal in a plurality of past cycles.

PRIOR ART LITERATURES

Patent Literature

Patent Literature 1: Japanese Unexamined Patent Application Publication No. 2008-125286
Patent Literature 2: Japanese Unexamined Patent Application Publication No. 2011-166959

Non-Patent Literature

Non-Patent Literature 1: Stefanutti, W., Mattavelli, P., "Fully Digital Hysteresis Modulation with Switching Time Prediction", IEEE Transactions on Industry Applications, Vol. 42, No. 3, May/June 2006
Non-Patent Literature 2: Vidal-Idiarte, E., Carrejo, C. E., Calvente, J., Martinez-Salamero, L., "Two-Loop Digital Sliding Mode Control of DC-DC Power Converters based on Predicative Interpolation", IEEE Transactions on Industrial Electronics, Vol. 58, No. 6, June 2011

SUMMARY

Problem to be Solved by the Invention

An analog control power supply device using the hysteretic control method has an advantage of very high response speed but has limitation in miniaturization. Particularly, in the case where a plurality of power supply voltages is necessary for a power supply system, it is difficult to reduce parts and miniaturize the power supply circuit.

A digital control power supply device of a type of measuring an inductor current value such as the digital control power supply devices in the non-patent literatures 1 and 2 has problems of low efficiency, large number of parts, and the like for measurement of the inductor current value and current changes as will be described later. Moreover, in the case of controlling the output voltage by the digital control power supply devices in the non-patent literatures 1 and 2, a current feedback loop and a voltage feedback loop are necessary and there are problems that the circuit is complicated and miniaturization is difficult.

The other objects and novel features will become apparent from the description of the specification and the appended drawings.

Means for Solving the Problems

A power supply control method according to an embodiment controls a power supply circuit by hysteretic control using a voltage prediction value. A power supply device as an example generates a prediction value of an error signal from first and second error signals and controls output voltage so that the prediction value lies between first and second control thresholds. The first error signal is obtained by converting the error voltage based on the difference between the output voltage and reference voltage at a first timing into a digital value. The second error signal is obtained by converting error voltage based on the difference between the output voltage and the reference voltage at a second timing.

According to the embodiment, the power supply device can be miniaturized.

BRIEF DESCRIPTION OF THE DRAWINGS

FIGS. 6A and 6B are diagrams for explaining erroneous operation of the power supply control circuit and the power supply device according to the first embodiment.

FIG. 7 is a diagram for explaining operation of a hysteresis comparator in a hysteresis controller according to the first embodiment.

FIG. 20 is a diagram illustrating the operation principle of a hysteresis comparator according to the fourth embodiment.

FIG. 27 is a diagram illustrating settings of control mode setting registers.

FIG. 31 is a diagram illustrating a setting table of a power supply channel sequencer.

FIG. 37A is a configuration diagram of an AD conversion sequencer and FIGS. 37B and 37C illustrate an example of a power supply control circuit and a power supply device according to setting of the AD conversion sequencer.

DETAILED DESCRIPTION

Figure 1:
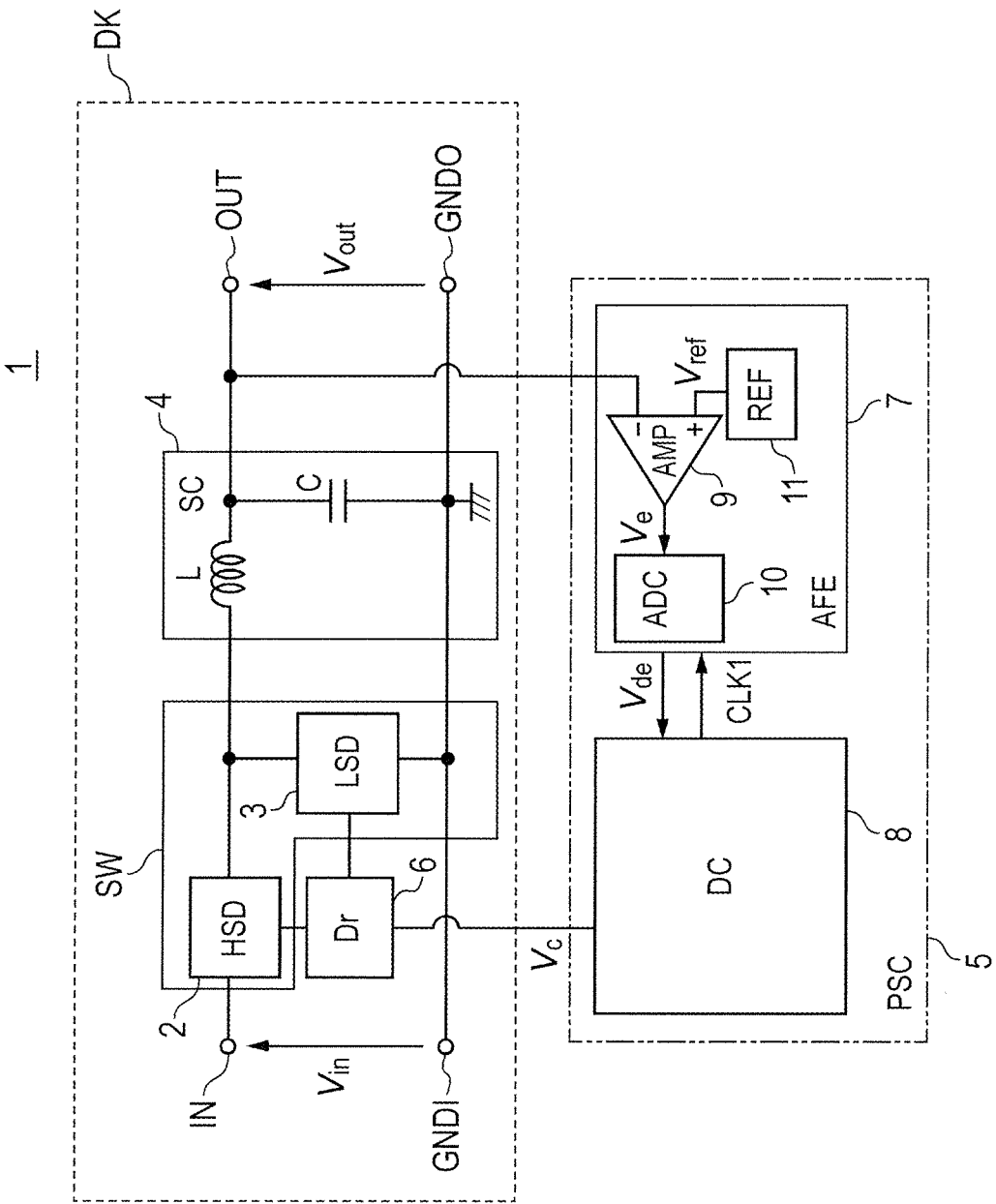
FIG. 1 is a block diagram of a power supply device according to a first embodiment.

First, what the inventors of the present invention examined on the digital control power supply devices of the non-patent literatures 1 and 2 will be described.

The digital control power supply device of the non-patent literature 1 can predict time at which a sampled inductor current value reaches a control threshold from a tilt of inductor current change obtained by the switching on/off time in the preceding switching cycle and the switching cycle. Consequently, the number of sampling times necessary per switching cycle is at least one in theory. Therefore, a high-speed AD converter and a high-speed digital controller become unnecessary, and power consumption of the power supply can be reduced. However, since the tilt of the current change for prediction is obtained by the switching on/off time in the preceding switching cycle and the switching cycle, accurate prediction cannot be made when a sudden change occurs in a load. An accurate control signal cannot be generated, so that response speed deteriorates.

The digital control power supply device of the non-patent literature 2 obtains the tilt of the inductor current change by the sampled inductor current value in a real-time manner, so that the problem of deterioration in response speed of the digital control power supply device of the non-patent literature 1 can be solved. However, in a digital control power supply device having the configuration as that of the digital control power supply device of the non-patent literature 2, both of the voltage feedback loop and the current feedback loop are used. Consequently, the circuit configuration is complicated, and it is difficult to miniaturize the circuit. Since both of the inductor current and the output voltage have to be sampled, two AD converters have to be used or one AD converter has to be used in a time sharing manner. Therefore, power consumption of the digital control power supply device itself increases.

Further, in the digital control power supply devices of the non-patent literatures 1 and 2, the tilt of an inductor current value and that of current change have to be measured. For this purpose, a method of coupling a sense resistor in series to an inductor and measuring voltage generated in the sense resistor, a method of providing an inductor for sensing in parallel to an inductor, measuring voltage induced by the inductor for sensing, and measuring a current value, and the like are considered. However, in the case of generating voltage in the sense resistor, output voltage is applied to the sense resistor, and output current flows directly in the sense resistor, so that efficiency deteriorates. In the case of providing the inductor for sensing, an inductor for sensing has to be provided as an external part, so that the number of parts in the digital control power supply device increases. In the digital control power supply devices in the non-patent literatures 1 and 2, to control the output voltage value, the voltage feedback loop becomes necessary. The digital control power supply device of the non-patent literature 2 has the voltage feedback loop as described above. Although the voltage feedback loop is not described in the digital control power supply device of the non-patent literature 1, in the case of controlling the output voltage value, the voltage feedback loop is necessary. In the case of using two loops of the voltage and current feedback loops, problems occur such that the circuit is complicated and miniaturization is difficult.

Further, what the inventors of the present invention have examined on the digital control power supply devices of the patent literatures 1 and 2 will be described.

In Japanese Unexamined Patent Application Publication No. 2008-125286, the hysteretic control method using a prediction value is not disclosed, and improvement in response of the power supply control is insufficient. In Japanese Unexamined Patent Application Publication No. 2011-166959, a technique itself of using a prediction value is not disclosed, and improvement in response of the power supply control is insufficient.

In view of the above-described matters, the following embodiments are derived.

Hereinafter, embodiments will be described in detail with reference to the drawings.

In the following embodiments, when necessary for convenience, the invention will be described by being divided into a plurality of sections or embodiments. Unless otherwise specified, they are related, one has in relations of a modification, an application example, detailed description, supplemental description, and the like of a part or all of another. In the following embodiments, in the case of mentioning the numbers and the like of elements (including the number of pieces, numerical values, quantity, range, and the like), the invention is not limited to the specific number but may employ numbers larger or smaller than the specific number except for a clearly indicated case or the case where the invention is clearly limited to a specific number in principle.

Further, in the following embodiments, the components (including the operations, timing charts, and operation steps) are not always necessary except for a clearly indicated case or a case where a component is considered to be obviously necessary. Similarly, in the following embodiments, in the case of referring to the shape, positional relation, and the like of the components, except for a clearly indicated case and a case where it is clearly considered to be different in principle, the invention includes shapes and the like close or similar to the shape and the like. The numbers and the like (including the number of pieces, numerical values, quantity, range, and the like) are also similarly handled.

In all of the drawings for explaining the embodiments, the same or related reference numerals are designated to parts or members having the same function, and their description will not be repeated. In the following embodiments, except for a necessary case, description of the same or similar parts will not be repeated in principle.

In the embodiments, analog-digital conversion will be described as AD conversion and an analog-digital converter will be described as AD converter.

In the embodiments, to some of an error signal ($V_{de}$) and a prediction value ($V_{pr}$), the sign (n) is attached. It is assumed that an error signal ($V_{de}(n)$) and a prediction value ($V_{pr}(n)$) express an error signal and a prediction value in the n-th cycle. In the embodiments, "n" denotes a natural number. Further, the expressions of an error signal ($V_{de}(n+X)$) and a prediction value ($V_{pr}(n+X)$) after X cycles express an error signal and a prediction value after X cycles using an error signal ($V_{de}(n)$) and a prediction value ($V_{pr}(n)$) in the n-th cycle as references. Similarly, the expressions of an error signal ($V_{de}(n-Y)$) and a prediction value ($V_{pr}(n-Y)$) Y cycles before express an error signal and a prediction value Y cycles before using an error signal ($V_{de}(n)$) and a prediction value ($V_{pr}(n)$) in the n-th cycle as references. In this case, "Y" denotes a natural number.

First Embodiment

1. Basic Configuration and Its Operation

In FIG. 1, a power supply device 1 has a configuration that input voltage ($V_{in}$) is supplied and output voltage ($V_{out}$) is output. The power supply device 1 includes an input power supply terminal IN, a ground-side input power supply terminal GNDI, an output power supply terminal OUT, a ground-side output power supply terminal GNDO, a switching element SW, a smoothing circuit (SC) 4, a power supply control circuit (PSC) 5, and a driver (Dr) 6. The input voltage ($V_{in}$) is applied across the input power supply terminal IN and the ground-side input power supply terminal GNDI. The output voltage ($V_{out}$) is voltage generated between the output power supply terminal OUT and the ground-side output power supply terminal GNDO. Ground voltage which is 0V is applied across the ground-side input power supply terminal GNDI and the ground-side output power supply terminal GNDO. The switching element SW includes a switching element (HSD) 2 and a switching element (LSD) 3. The switching element SW repeats on/off operation to control the output voltage ($V_{out}$) of the power supply device 1. The switching element 3 becomes the on state when the switching element 2 is in the off state to assure an output current path of the power supply device 1 and becomes the off state when the switching element 2 is in the on state. The smoothing circuit 4 has an inductor L and a capacitor C and smoothes voltage received from one switching element SW. The power supply device 1 is a DC/DC converter for converting the input voltage ($V_{in}$) to desired output voltage ($V_{out}$) by controlling the on/off state of the switching element SW by a control signal ($V_c$) which is digitally controlled. Hereinafter, a circuit illustrated in FIG. 1 and having the input power supply terminal IN, the ground-side input power supply terminal GND1, the output power supply terminal OUT, the ground-side output power supply terminal GNDO, the switching element SW, the smoothing circuit 4, and the driver 6 will be called a power supply circuit DK.

The power supply control circuit (PSC) 5 has an analog front-end circuit (AFE) 7 and a digital controller (DC) 8. The analog front-end circuit 7 has a differential amplifier (AMP) 9 as an error amplifier, an analog-digital converter (ADC) 10, and a target voltage setting circuit (REF) 11. The target voltage setting circuit 11 is a circuit for determining target voltage ($V_{ref}$) based on reference voltage for the output voltage ($V_{out}$) of the power supply device. The differential amplifier 9 amplifies the difference (error) between the output voltage ($V_{out}$) and the target voltage ($V_{ref}$) and outputs the resultant voltage as differential (error) voltage ($V_e$). The gain of the difference of the differential amplifier 9 is not always larger than one and exceeds zero. It may include one or less and include negative gain. The AD converter 10 converts the differential voltage ($V_e$) from the differential amplifier 9 to a digital value and outputs the digital value as an error signal ($V_{de}$). The digital controller 8 generates a control signal (Vc) for controlling the on/off operation of the switching element SW on the basis of the error signal ($V_{de}$) from the AD converter 10.

The driver 6 is a circuit receiving the control signal ($V_c$) which is output from the digital controller 8 and outputting a drive signal for controlling the on/off operation of the switching element SW on the basis of the control signal ($V_c$).

The coupling relations and the flow of signals are summarized as follows. The input power supply terminal IN is coupled to the switching element SW 2. The switching element SW is coupled to the ground-side input power supply terminal GNDI. One end of the inductor L is coupled to the switching element SW. The other end of the inductor L is coupled to one end of the capacitor C. One end of the capacitor C and the output power supply terminal OUT are coupled to each other. The other end of the capacitor C is coupled to the ground-side output power supply terminal GNDO.

The other end of the capacitor C and the inversion input terminal of the differential amplifier 9 are coupled to each other. The output voltage ($V_{out}$) from the other end of the capacitor C is supplied to the inversion input terminal of the differential amplifier 9. The output of the target voltage setting circuit 11 is coupled to the non-inversion input terminal of the differential amplifier 9. The target voltage ($V_{ref}$) from the target voltage setting circuit 11 is supplied to the non-inversion input terminal of the differential amplifier 9. An output of the differential amplifier 9 is coupled to the input terminal of the AD converter 10. The differential voltage ($V_e$) from the differential amplifier 9 is supplied to the AD converter 10. An output of the AD converter 10 and the input terminal of the digital controller 8 are coupled. An error signal ($V_{de}$) from the AC converter 10 is supplied to the digital controller 8.

An output of the digital controller 8 is coupled to the input terminal of the driver 6. A control signal ($V_c$) from the digital controller 8 is supplied to the driver 6. The output of the driver 6 is coupled to the switching element SW. A drive signal from the driver 6 is supplied to the switching element SW.

Since the configuration of measuring the inductor current like in the non-patent literatures 1 and 2 is not employed, the power supply device can be miniaturized.

Figure 2:
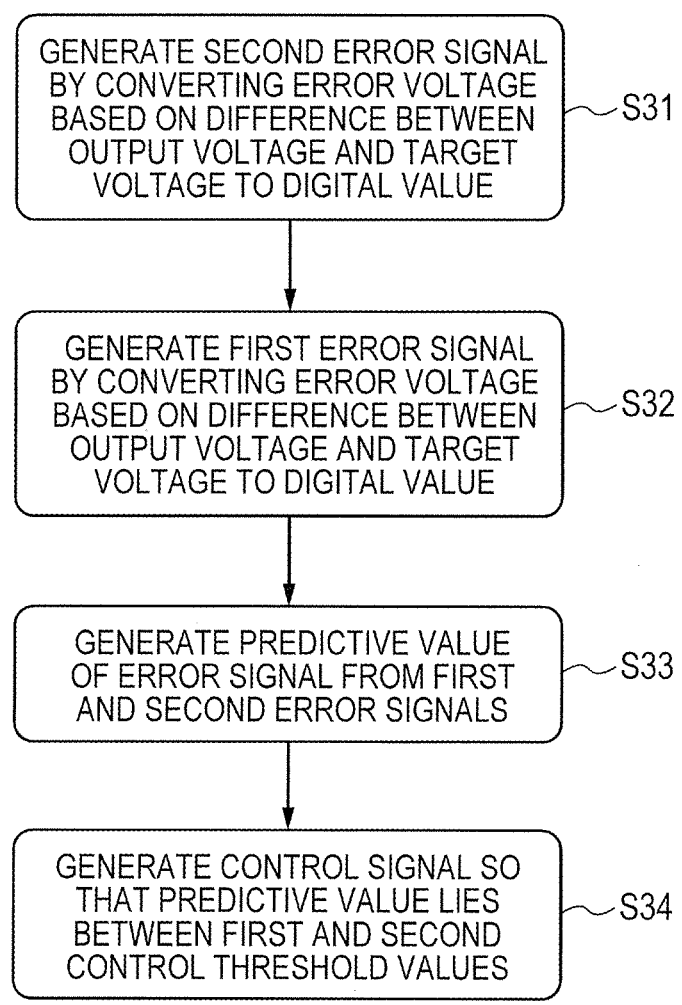
FIG. 2 illustrates a flow of basic operation of a power supply control circuit according to the first embodiment.

Next, the operation of the power supply control circuit 5 will be described. FIG. 2 illustrates the flow of basic operation of the power supply control circuit.

The differential amplifier 9 amplifies the difference between the output voltage ($V_{out}$) generated between the output power supply terminal OUT and the ground-side output power supply terminal GNDO and the target voltage ($V_{ref}$) generated by the target voltage setting circuit 11 and outputs the resultant voltage as the differential voltage ($V_e$). The AD converter 10 performs AD converting process on the differential voltage ($V_e$) to generate the error signal ($V_{de}$). More specifically, the AD converter 10 converts a first differential voltage as the differential voltage ($V_e$) to a digital value at a second timing which is before a first timing to generate a second error signal as the error signal ($V_{de}$) (step S31). At the first timing, a second differential voltage as the differential voltage ($V_e$) is converted to a digital value to generate a first error signal as the error signal ($V_{de}$) (step S32).

The digital controller 8 generates the control signal ($V_c$) on the basis of the error signal ($V_{de}$). More specifically, the digital controller 8 generates a prediction value ($V_{pr}$) of the error signal ($V_{de}$) at a third timing which is later than the first timing in accordance with the first and second error signals (step S33). The control signal ($V_c$) is generated so that the prediction value ($V_{pr}$) lies between a first control threshold ($V_{th1}$) as a high-level control threshold and a second control threshold ($V_{th2}$) as a low-level control threshold smaller than the first control threshold ($V_{th1}$) (step S34). The first control threshold ($V_{th1}$) and the second control threshold ($V_{th2}$) are digital values.

The driver 6 outputs a drive signal on the basis of the control signal ($V_c$). The switching of the switching element SW is controlled by the drive signal. The smoothing circuit 4 smoothes the voltage supplied from the switching element SW and outputs the resultant voltage as the output voltage ($V_{out}$).

The power supply control circuit 5 described above controls the output voltage ($V_{out}$) so that the prediction value ($V_{pr}$) lies between the first control threshold ($V_{th1}$) and the second control threshold ($V_{th2}$) The prediction value ($V_{pr}$) is a value at the third timing which is later than the first and second timings. Therefore, by using the prediction value ($V_{pr}$), the response improves. Further, from the relation between the prediction value ($V_{pr}$) and the first and second control thresholds ($V_{th1}$ and $V_{th2}$), the output voltage ($V_{out}$) can be controlled promptly. More specifically, when the relation that the prediction value ($V_{pr}$)<the second control threshold ($V_{th2}$) is satisfied, the control signal ($V_c$) is set to the signal level at which the switching element 2 is on and the switching element 3 is off. When the relation that the prediction value ($V_{pr}$)>the first control threshold ($V_{th1}$) is satisfied, the control signal ($V_c$) is set to the signal level at which the switching element 2 is off and the switching element 3 is on. When the relation that the second control threshold ($V_{th2}$)<the prediction value ($V_{pr}$)<the first control threshold ($V_{th1}$) is satisfied, the control signal ($V_c$) maintains the current signal level. Since the signal level of the control signal ($V_c$) can be promptly determined on the basis of the relations among the prediction value ($V_{pr}$) and the first and second control thresholds ($V_{th1}$ and $V_{th2}$), the response is high.

For these reasons, the response of the power supply device 1 can be improved.

2. Detailed Configuration and Its Operation

Figure 3:
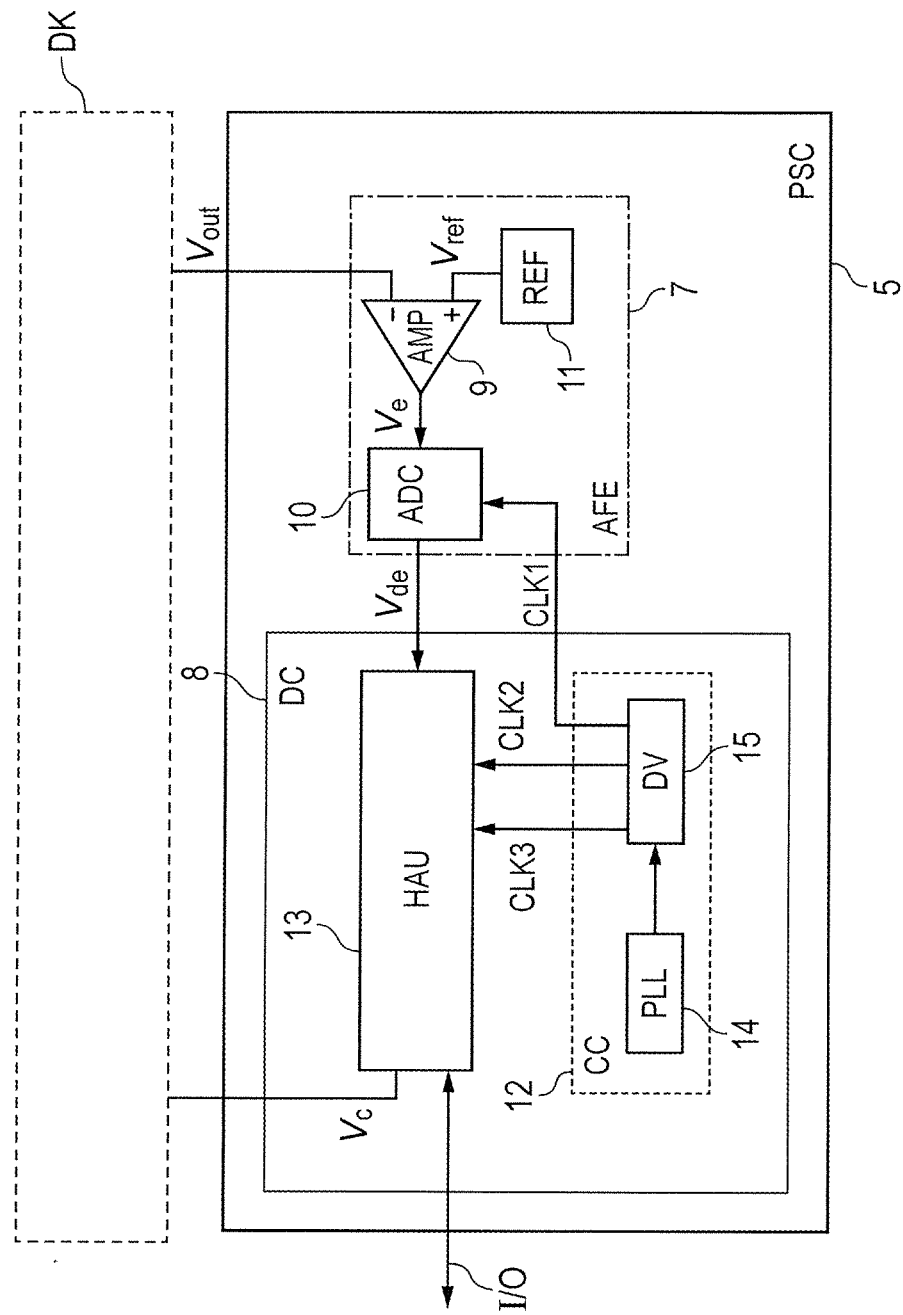
FIG. 3 is a diagram illustrating the detailed configuration of the power supply control circuit according to the first embodiment.
Figure 4:
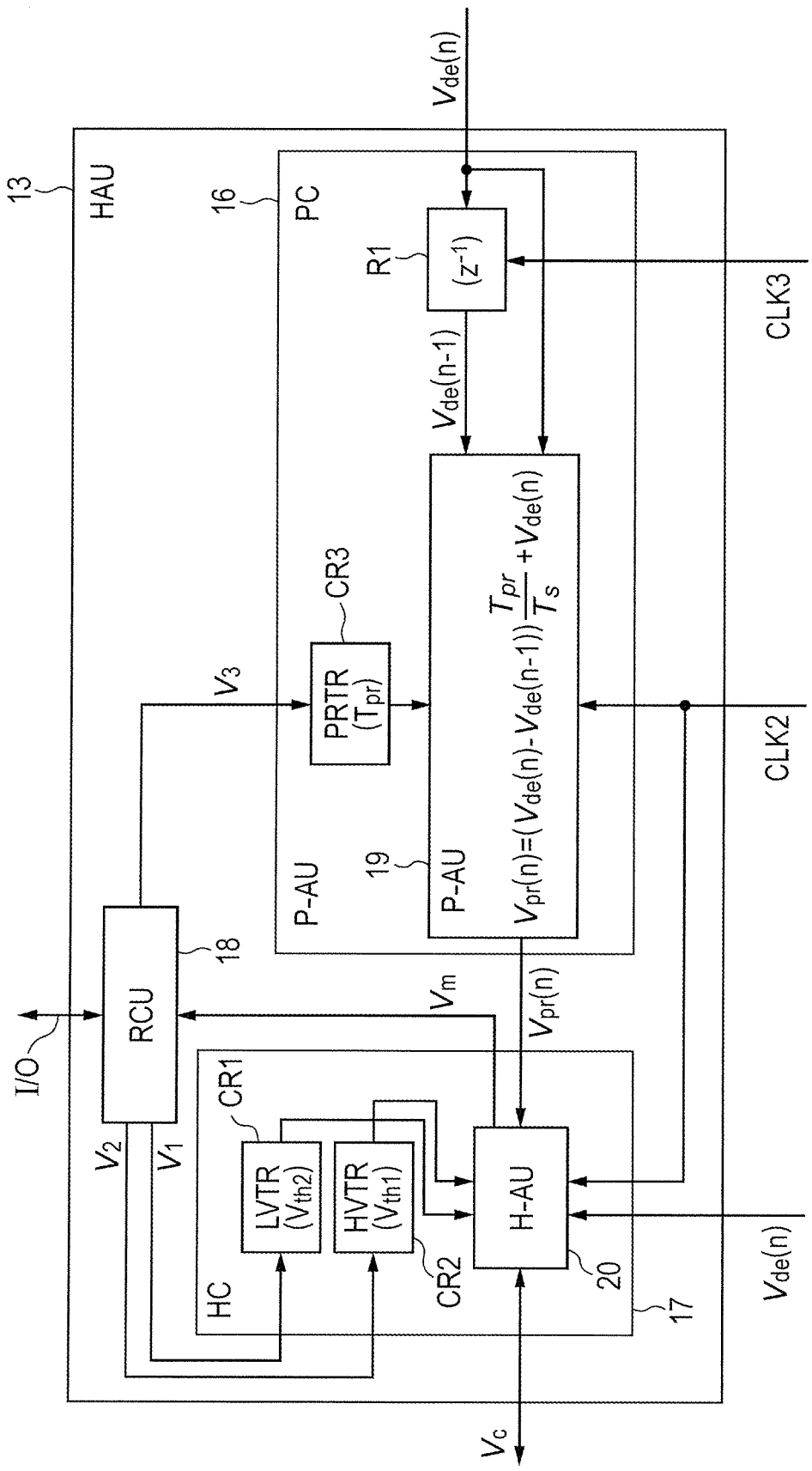
FIG. 4 is a diagram illustrating a detailed configuration of a hysteresis arithmetic unit in a digital controller according to the first embodiment.
Figure 5:
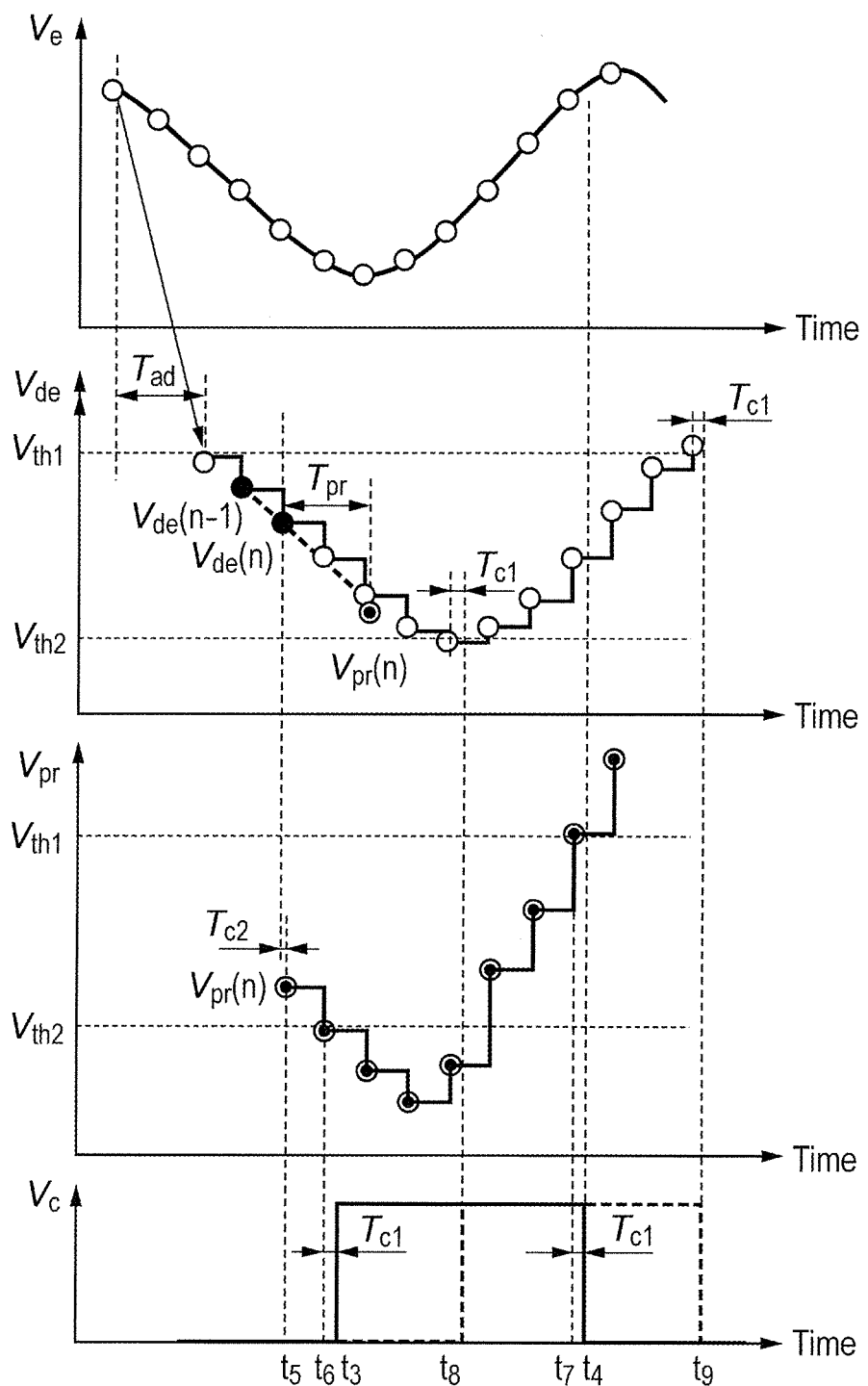
FIG. 5 is an explanatory diagram illustrating the operation of the power supply control circuit and the power supply device according to the first embodiment.
Figure 8:
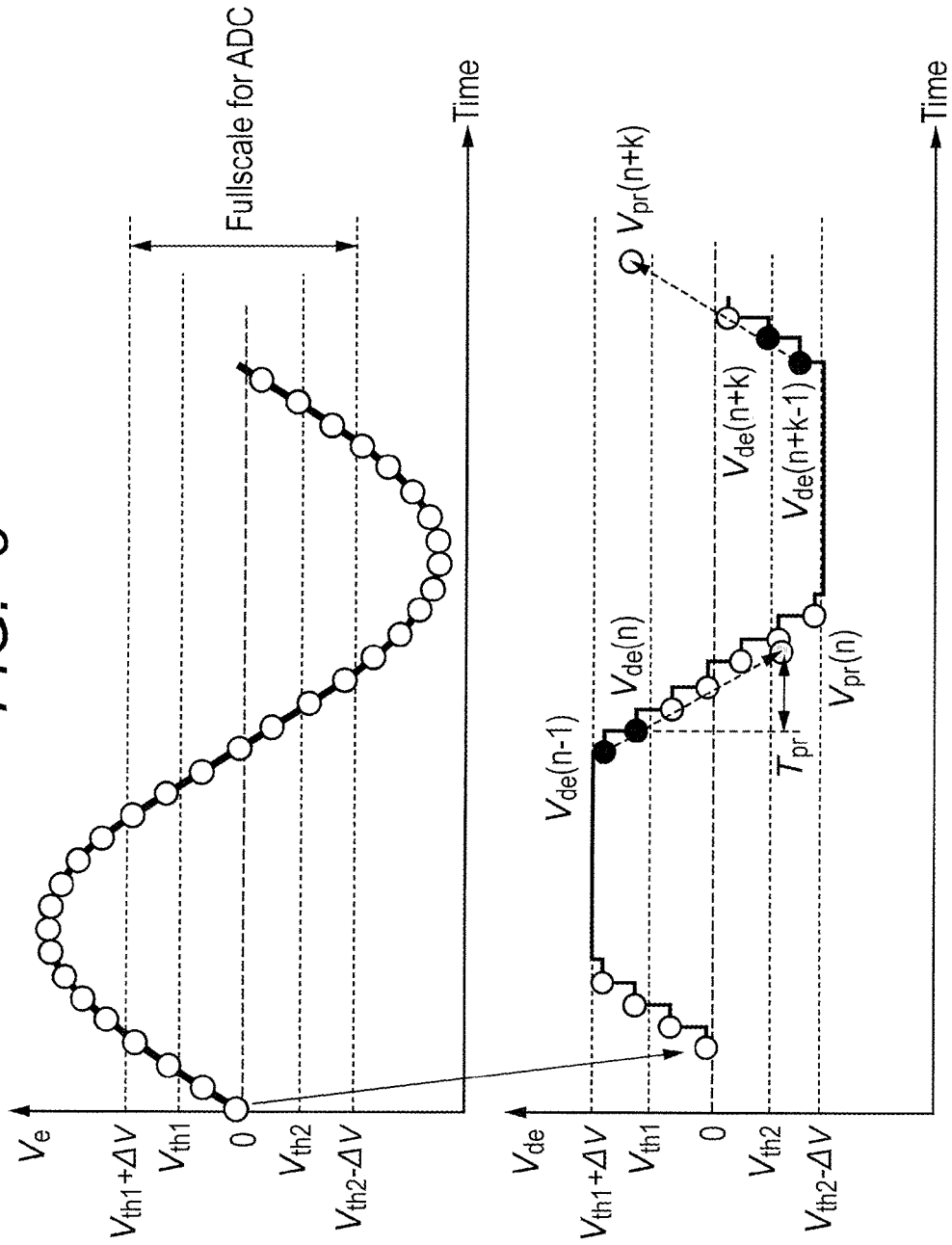
FIG. 8 is a diagram for explaining an operation range of an AD converter according to the first embodiment.

FIG. 3 is a diagram illustrating the detailed configuration of the power supply control circuit. FIG. 4 is a diagram illustrating a detailed configuration of a hysteresis arithmetic unit in a digital controller. FIG. 5 is an explanatory diagram illustrating the operation of the power supply control circuit and the power supply device. FIG. 6 is a diagram for explaining erroneous operation of the power supply control circuit and the power supply device. FIG. 7 is a diagram for explaining operation of a hysteresis comparator in a hysteresis controller. FIG. 8 is a diagram for explaining an operation range of the AD converter. The configuration and operation of the first embodiment will be described more specifically.

As illustrated in FIG. 3, the digital controller (DC) 8 has a clock generating circuit (CC) 12 and a hysteresis arithmetic unit (HAU) 13. The clock generating circuit 12 includes a PLL (Phase-Locked Loop) oscillator 14 and a frequency divider (DV) 15. The PLL oscillator 14 generates a reference clock of the power supply control circuit 5. The frequency divider 15 divides the frequency of the reference clock generated by the PLL oscillator 14 to generate a sampling clock (CLK1) for the AD converter 10 and a plurality of operation clocks (CLK2 and CLK3) for the hysteresis arithmetic unit 13. The AD converter 10 converts the differential voltage ($V_e$) from the differential amplifier 9 to a digital value by using the sampling clock (CLK1) and outputs the resultant as the error signal ($V_{de}$). The hysteresis arithmetic unit 13 generates the control signal ($V_c$) for controlling the on/off operation of the switching element SW based on the error signal ($V_{de}$) from the AD converter 10 in accordance with the operation clocks (CLK2 and CLK3).

The flow of the signals is summarized as follows. The reference clock is output from the PLL oscillator 14 and is supplied to the frequency divider 15. The clock (CLK1) is output from the frequency divider 15 and supplied to the AD converter 10. The clocks CLK2 and CLK3 are output from the frequency divider 15 and supplied to the hysteresis arithmetic unit 13. The error signal ($V_{de}$) is output from the AC converter 10 and supplied to the hysteresis arithmetic unit 13. The control signal ($V_c$) is output from the hysteresis arithmetic unit 13 and supplied to the driver 6.

The hysteresis arithmetic unit 13 of FIG. 4 has a prediction controller (PC) 16, a hysteresis controller (HC) 17, and a register control unit (RCU) 18. The prediction controller 16 has a control register (third register PRTR) CR3, a register (retention circuit) R1, and a prediction arithmetic unit (P-AU) 19. The register R1 stores an error signal ($V_{de}(n-1)$) in the immediately preceding cycle from the AD converter 10 on the basis of the operation of the clock CLK3 and updates the value cycle by cycle. The control register CR3 stores a coefficient ($T_{pr}$) as one of control parameters as a prediction period necessary to obtain a prediction value ($V_{pr}(n)$). The coefficient ($T_{pr}$) is a digital value. The value of the coefficient ($T_{pr}$) as one of the control parameters stored in the control register CR3 can be updated with a register update signal ($V_3$) from the register control unit 18. The prediction arithmetic unit 19 receives the error signal ($V_{de}(n-1)$) in the immediately preceding cycle and the present error signal ($V_{de}(n)$) on the basis of the operation of the clock CLK2 and calculates the error signal ($V_{de}$) after the prediction period ($T_{pr}$), that is, the prediction value ($V_{pr}(n)$).

The prediction arithmetic unit 19 obtains $V_{pr}(n)$ by Equation 1. $T_s$ denotes sampling rate of the AD converter 10.

$$V_{pr}(n) = (V_{de}(n) - V_{de}(n-1))\frac{T_{pr}}{T_s} + V_{de}(n) \qquad \text{Equation 1}$$

Some equations will be shown in the specification. In the equations, only the reference numerals are written and their terms are not described. In Equation 1, $V_{pr}(n)$ denotes a prediction value ($V_{pr}(n)$) $V_{de}(n)$ denotes the present error signal ($V_{de}(n)$), $V_{pr}(n-1)$ denotes an error signal ($V_{de}(n-1)$) in the immediately preceding cycle, $T_{pr}$ indicates a prediction period ($T_{pr}$), and $T_s$ indicates the sampling rate of the AD converter (ADC).

The hysteresis controller 17 has a control register (first register LVTR) CR1, a control register (second register HVTR) CR2, and a hysteresis comparator H-AU 20. The control register CR2 stores a high-level control threshold ($V_{th2}$) for hysteresis control. The control register CR1 stores a low-level control threshold ($V_{th2}$) for hysteresis control. The control threshold ($V_{th2}$) is smaller than the control threshold ($V_{th1}$). The two control thresholds ($V_{th1}$ and $V_{th2}$) stored in the control registers CR1 and CR2 can be updated by register update signals ($V_1$ and $V_2$) from the register control unit 18.

The register control unit 18 receives an external instruction from an external device on the outside of the power supply device of a personal computer or the like via a communication line I/O and sets the values of the control registers CR1, CR2, and CR3. Since the control parameter ($T_{pr}$), the high-level control threshold ($V_{th1}$), and the low-level control threshold ($V_{th2}$) can be set from the outside of the power supply device, those parameters can be changed flexibly in accordance with a load to which the output voltage is supplied.

The hysteresis comparator 20 generates the control signal ($V_c$) on the basis of the result of comparison between the prediction value ($V_{pr}(n)$) from the prediction arithmetic unit 19, the present error signal ($V_{de}(n)$) from the AD converter 10, and the two control thresholds ($V_{th1}$ and $V_{th2}$). In the case an erroneous operation which will be described later is detected, the erroneous operation signal ($V_m$) is output to the register control unit 18.

The flow of the signals is summarized as follows. The error signal ($V_{de}(n)$) is supplied from the AC converter 10 to the register R1. When the clock signal CLK3 is supplied from the frequency divider 15, the error signal ($V_{de}(n-1)$) of the immediately preceding cycle is output. The error signal ($V_{de}(n-1)$) of the immediately preceding cycle is supplied from the register R1 to the prediction arithmetic unit 19, the error signal ($V_{de}(n)$) is supplied from the AD converter 10, the clock CLK2 is supplied from the frequency divider 15, and the prediction period ($T_{pr}$) is supplied from the control register CR1, so that the prediction value ($V_{pr}(n)$) is output. To the hysteresis comparator 20, the prediction value ($V_{pr}(n)$) from the prediction arithmetic unit (P-AU) 19 is supplied, the first control threshold ($V_{th1}$) is supplied from the control register CR1, the second control threshold ($V_{th2}$) is supplied from the control register CR2, the error signal ($V_{de}(n)$) is supplied from the AD converter 10, and the clock CLK2 is supplied from the frequency divider 15. As a result, the control signal $V_c$ is output from the hysteresis comparator 20. The register control circuit 18 outputs a register update signal $V_1$ to the control register CR1, outputs a register update signal $V_2$ to the register CR2, and outputs a register update signal $V_3$ to the register CR3. To the register control circuit 18, an erroneous operation signal $V_m$ is supplied. The register update signals ($V_1$, $V_2$, and $V_3$) denote data signals for updating the registers CR1, CR2, and CR3, respectively.

The operation of the power supply control circuit 5 (power supply device 1) will be described with reference to FIG. 5. The power supply control circuit 5 (power supply device 1) operates in two modes of a normal mode by the predicting operation and an erroneous operation mode.

In the normal mode, the values of the control registers CR1, CR2, and CR3 are optimized, and the influence of a delay which occurs due to the AD converting process and the control calculation can be suppressed by the prediction control. Hereinafter, the operation of the power supply control circuit 5 (power supply device 1) in the normal mode will be described.

By the AD converter 10, the differential voltage ($V_e$) from the differential amplifier 9 is converted to a digital error signal ($V_{de}$). By the AD converting process, delay time ($T_{ad}$) in AD conversion exists between the differential voltage ($V_e$) and the error signal ($V_{de}$). Next, by using the present error signal ($V_{de}(n)$) corresponding to the first timing and the error signal ($Vde(n-1)$) in the immediately preceding cycle corresponding to the second timing, the error signal ($V_{de}$) after the prediction period ($T_{pr}$) corresponding to the third timing, that is, the prediction value ($V_{pr}(n)$) is predicted (refer to Equation 1). In FIG. 5, the prediction value ($V_{pr}$) is positioned on a line segment coupling the present error signal ($V_{de}(n)$) and the error signal ($V_{de}(n-1)$ in the immediately preceding cycle. In FIGS. 6A and 6B, the period between the present error signal ($V_{de}(n)$) and the error signal ($V_{de}(n-1)$ in the immediately preceding cycle corresponds to the sampling rate ($T_s$) of the AD converter 10. Since delay time ($T_{c2}$) in the control calculation in the prediction arithmetic unit 19 occurs at the time of obtaining the prediction value ($V_{pr}$), the prediction value ($V_{pr}(n)$) is output at time $T_5$. When the obtained prediction value ($V_{pr}(n)$) becomes smaller than the second control threshold ($V_{th2}$), the control signal ($V_c$) rises (time $t_6$) and becomes the high level (H). When the obtained prediction value ($V_{pr}(n)$) becomes larger than the first control threshold ($V_{th1}$), the control signal ($V_c$) rises (time $t_7$) and becomes the low level (L). Since delay time ($T_{c1}$) in the control calculation in the hysteresis comparator 20 occurs, in practice, the control signal ($V_c$) rises and becomes the high level (H) at time $t_3$, and the control signal ($V_c$) trails and becomes the low level (L) at time $t_4$. To show the effect of the predicting operation, the control signal ($V_c$) generated without prediction is illustrated also in FIGS. 6A and 6B in direct comparison with the two control thresholds ($V_{th1}$ and $V_{th2}$). The control signal ($V_c$) is indicated by the dotted line in the waveform diagram expressing the control signal ($V_c$). The control signal ($V_c$) rises at time $t_8$ and trails at time $t_9$. By generating the control signal ($V_c$) using the prediction value ($V_{pr}$), the influence of delay caused by the AD converting process and the control calculation can be suppressed.

As illustrated in FIG. 5, to increase precision of the power supply control, the sampling frequency in the AD converting process (the period between cycles, the sampling rate ($T_s$)) is designed or set so as to be considerably higher than the switching frequency of the switching element SW. It is a precondition that when the control signal ($V_c$) is H, the switching element 2 is on, the switching element 3 is off, and the output voltage is controlled to increase. When the control signal ($V_c$) is L, the switching element 2 is off, the switching element 3 is on, and the output voltage is controlled to decrease. In reality, when the control signal ($V_c$) is H, the output voltage ($V_{out}$) may be controlled to decrease, and when the control signal ($V_c$) is L, the output voltage ($V_{out}$) may be controlled to increase.

On the other hand, when the values of the control registers CR1, CR2, and CR3 are not proper values, it may be an erroneous operation state due to the prediction control, and the power supply control circuit 5 (power supply device 1) enters an erroneous operation mode. With reference to FIGS. 6A and 6B, an example of erroneous operation of prediction of the power supply control circuit 5 (power supply device 1) will be described.

(1) First Erroneous Operation Mode

When the prediction period ($T_{pr}$) which is too long is set, there is a case that the output voltage ($V_{out}$) is deviated from the target voltage ($V_{ref}$) and stabilized. Concretely, as illustrated in FIG. 6A, it occurs when the output voltage ($V_{out}$) of the power supply device 1 suddenly changes due to sudden change in the load. An erroneous determination is made such that when the error signal ($V_{de}$) exceeds the first control threshold ($V_{th1}$) and, after that, decreases toward the target value (zero), before it reaches the target value (zero), the prediction value ($V_{pr}(n)$) obtained from the present error signal ($V_{de}(n)$) and the error signal ($V_{de}(n-1)$) in the immediately preceding cycle becomes below the second control threshold ($V_{th2}$). Consequently, the control signal ($V_c$) rises, the control to increase the output voltage ($V_{out}$) is started and, as a result, the output voltage ($V_{out}$) is deviated from the target voltage ($V_{ref}$). In this case, the state where the power supply voltage supplied to the load is larger than a necessary value continues constantly and, in some cases, the load is destroyed. This state may occur not only in the too-long prediction period ($T_{pr}$) but also in the case where the difference value between the two control thresholds ($V_{th1}$ and $V_{th2}$) is too small. The first erroneous operation mode occurs when the error signal ($V_{de}(n)$) exceeds the first control threshold ($V_{th1}$) and the prediction value ($V_{pr}(n)$) becomes below the second control threshold ($V_{th2}$).

(2) Second Erroneous Operation Mode

Like in the first erroneous operation mode, when the prediction period ($T_{pr}$) which is too long is set, there is a case that the output voltage ($V_{out}$) is deviated from the target voltage ($V_{ref}$) and stabilized. Concretely, as illustrated in FIG. 6B, it occurs when the output voltage ($V_{out}$) of the power supply suddenly changes due to sudden change in the load. An erroneous determination is made such that when the error signal ($V_{de}$) becomes below the second control threshold ($V_{th2}$) and, after that, increases toward the target value (zero), before it reaches the target value (zero), the prediction value ($V_{pr}(n)$) obtained from the present error signal ($V_{de}(n)$) and the error signal ($V_{de}(n-1)$) in the immediately preceding cycle exceeds the first control threshold ($V_{th1}$). Consequently, the control signal ($V_c$) rises, the control to decrease the output voltage ($V_{out}$) is started and, as a result, the output voltage ($V_{out}$) is deviated from the target voltage ($V_{ref}$). In this case, the state where the power supply voltage supplied to the load is smaller than a necessary value continues constantly and, in some cases, the load becomes inoperative. This state also occurs not only in the too-long prediction period ($T_{pr}$) but also in the case where the difference value between the two control thresholds ($V_{th1}$ and $V_{th2}$) is too small. The second erroneous operation mode occurs when the error signal ($V_{de}(n)$) is below the second control threshold ($V_{th2}$) and the prediction value ($V_{pr}(n)$) exceeds the first control threshold ($V_{th1}$).

As described above, when the values of the control registers CR1, CR2, and CR3 are not optimized and the prediction period (Tpr) is too long or the differential value between the control thresholds (Vth1 and Vth2) is too small, the first or second erroneous operation mode is caused. Therefore, a measure to prevent prediction erroneous operation is necessary. The possibility that the two erroneous operations are caused is found for the first time by the inventors of the present invention.

Next, the operation of the hysteresis comparator 20 in which a measure against erroneous operation of prediction is considered will be described. As illustrated in FIG. 7, from a result of comparison between $V_{pr}(n)$ from the prediction arithmetic unit 19, $V_{de}(n)$ from the AD converter 10, and the two control thresholds ($V_{th1}$ and $V_{th2}$), the control signal ($V_c$) is generated.

(A) Normal Mode

In the following three states, the power supply control circuit 5 (power supply device 1) is in the normal mode.

When the prediction value ($V_{pr}(n)$) is larger than the first control threshold ($V_{th1}$) and the error signal ($V_{de}(n)$) is larger than the second control threshold ($V_{th2}$), the control signal ($V_c$) trails to L.

When the prediction value ($V_{pr}(n)$) is smaller than the second control threshold ($V_{th2}$) and the error signal ($V_{de}(n)$) is smaller than the first control threshold ($V_{th1}$) the control signal ($V_c$) rises to H.

Under the condition that the second control threshold ($V_{th2}$)<the prediction value ($V_{pr}(n)$)<the first control threshold ($V_{th1}$), the control signal ($V_c$) maintains the state of the previous time.

(B) Erroneous Operation Mode

In the following two states, the power supply control circuit 5 (power supply device 1) is in the erroneous operation mode. In the erroneous operation mode, the hysteresis comparator 20 outputs the erroneous operation signal ($V_m$) to the register control unit 18. The erroneous operation signal ($V_m$) is output from the register control unit 18 to an external device on the outside of the power supply device of a personal computer or the like via a communication line I/O. As a result, the register control unit 18 receives update values of the control registers CR1, CR2, and CR3 from the external device on the outside of the power supply device of a personal computer or the like via the communication line I/O and updates at least any of the values of the control registers CR1, CR2, and CR3.

When the prediction value ($V_{pr}(n)$) is smaller than the second control threshold ($V_{th2}$) and the error signal ($V_{de}(n)$) is larger than the first control threshold ($V_{th1}$), the control signal ($V_c$) trails to L. This is the first erroneous operation mode.

When the prediction value ($V_{pr}(n)$) is larger than the first control threshold ($V_{th1}$) and the error signal ($V_{de}(n)$) is smaller than the second control threshold ($V_{th2}$), the control signal ($V_c$) rises to H. This is the second erroneous operation mode.

By comparing the prediction value ($V_{pr}(n)$) and the two control thresholds ($V_{th1}$ and $V_{th2}$) as described above, not only the state of the control signal ($V_c$) is determined but also the state of the error signal ($V_{de}(n)$) is added as a condition of determining the state of the control signal ($V_c$). Consequently, even when the power supply control circuit 5 (power supply device 1) enters the erroneous operation mode, it can return to the normal mode by the control signal ($V_c$). Therefore, the response of the power supply control circuit 5 (power supply device 1) can be increased. Since the circuit can promptly return from the erroneous operation mode to the normal mode, destruction or an inoperative state of a load to which the power supply voltage from the power supply device 1 is supplied can be avoided. Further, the proper control signal ($V_c$) which varies between the first and second erroneous operation modes is output, so that the output voltage ($V_{out}$) can be promptly set between the two control thresholds ($V_{th1}$ and $V_{th2}$)

Figure 9:
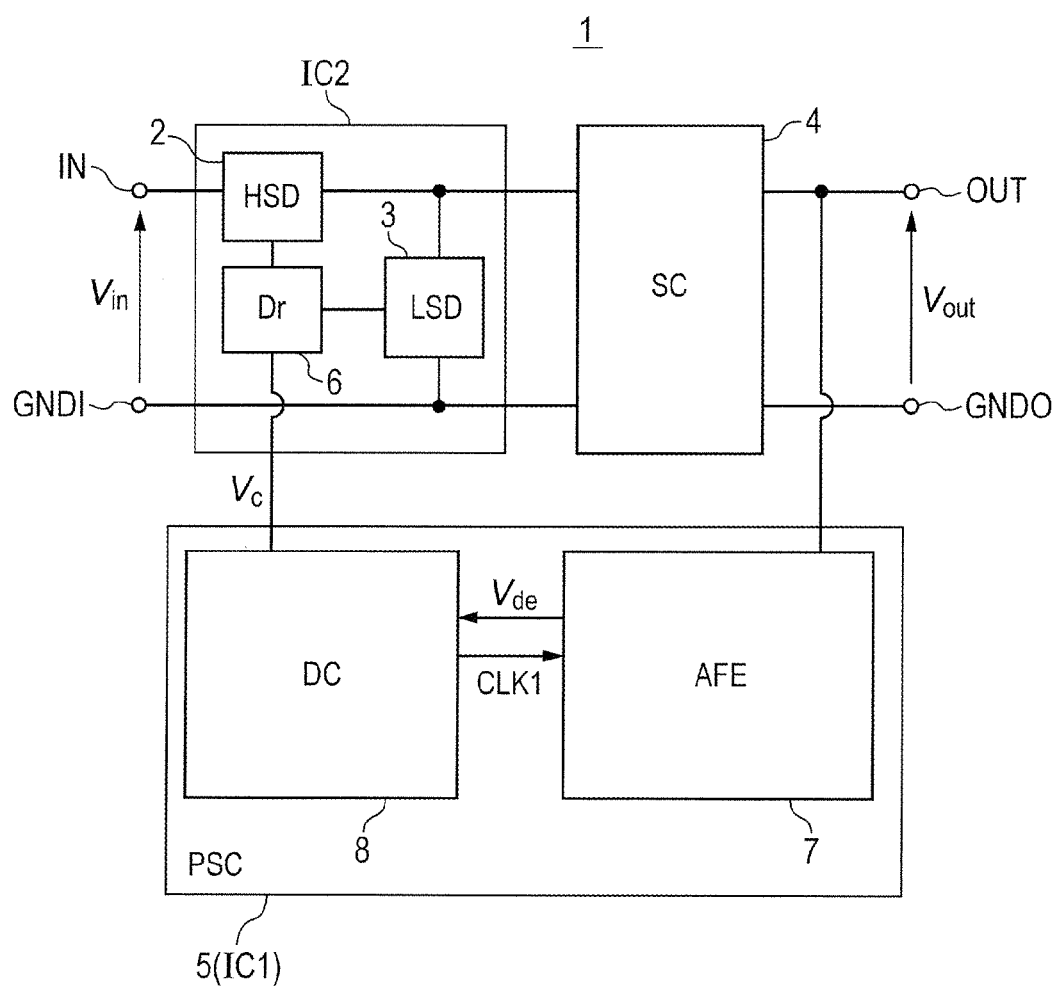
FIG. 9 is a diagram illustrating a configuration example of parts of the power supply device according to the first embodiment.

As illustrated in FIG. 8, the voltage range (full scale) in which the AD converter 10 has to perform the AD converting process is limited in accordance with the range in which the control threshold range ($V_{th1}$ to $V_{th2}$) can be set. As an example, the prediction value ($V_{pr}(n)$) determining the rising edge of the control signal ($V_c$) is obtained by the present error signal ($V_{de}(n)$) and the error signal ($V_{de}(n-1)$) in the immediately preceding cycle, and the prediction value ($V_{pr}(n+k)$) determining the trailing edge of the control signal ($V_c$) is obtained by an error signal ($V_{de}(n+k)$) after "k" cycles and an error signal ($V_{de}(n+k-1)$) after k-1 cycles (where k denotes natural number). Consequently, if the values of the error signal ($V_{de}(n)$), the error signal ($V_{de}(n-1)$) in the immediately preceding cycle, the error signal ($V_{de}(n)+k$) after k cycles, and the error signal (Vde(n+k-1)) after (k-1) cycles are expressed accurately by the AD converter 10, an accurate control signal ($V_c$) can be generated. Therefore, the full scale of the AD converter 10 is from the ($V_{de}(n-1)$) in the immediately preceding cycle to the error signal ($V_{de}(n+k-1)$) after (k-1) cycles. Since the error signal ($V_{de}(n-1)$) in the immediately preceding cycle and the error signal ($V_{de}(n+k-1)$) after (k-1) cycles are close to the control thresholds, the full scale of the AD converter 10 can be limited by the range in which the two control thresholds ($V_{th1}$ and $V_{th2}$) can be set. Concretely, as illustrated in FIG. 9, in a state where the difference value between the two control thresholds ($V_{th1}$ and $V_{th2}$) is set to become maximum, predetermined values (+ΔV and −ΔV) for giving allowance because of variations, noises, and the like are added to the two control thresholds ($V_{th1}$ and $V_{th2}$), respectively. Therefore, the full scale becomes from $V_{th1}$+ΔV to $V_{th2}$−ΔV. In FIG. 8, it is described as "Full scale for ADC". As a result, the valid resolution (the number of bits) of the AD converter 10 can be decreased.

By reduction of the power consumption of the AD converter 10, the power consumption of the entire power supply control circuit 5 (power supply device 1) can be reduced. FIG. 9 illustrates the state where the difference value between the two control thresholds ($V_{th1}$ and $V_{th2}$) is set to become maximum.

3. Semiconductor Integrated Circuit Device

Figure 10:
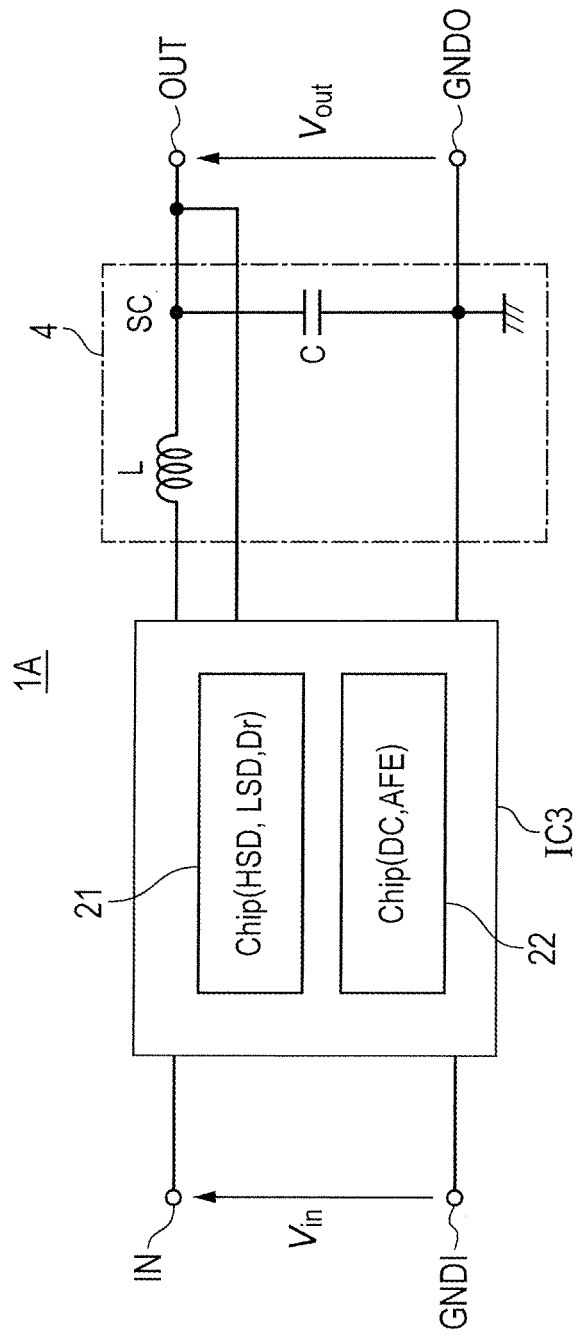
FIG. 10 is a diagram illustrating another configuration example of the parts of the power supply device according to the first embodiment.

Hereinafter, an example of a power supply IC (Integrated Circuit) obtained by integrating a part of the power supply device 1 as a semiconductor integrated circuit device will be described. FIGS. 9 and 10 are diagrams illustrating configuration examples of parts of the power supply device.

(1) First Example

The power supply device 1 illustrated in FIG. 9 has a semiconductor integrated circuit device IC1, a semiconductor integrated circuit device IC2, and the smoothing circuit 4. The first semiconductor integrated circuit device IC1 is obtained by forming the digital controller 8 and the analog front-end circuit 7 on a single semiconductor substrate. The second semiconductor integrated circuit device IC2 is obtained by encapsulating the switching elements 2 and 3 and the driver 6 in one package. Each of the driver 6 and the switching elements 2 and 3 is formed on one semiconductor substrate. The inductor L and the capacitor C of the smoothing circuit 4 are constructed as single parts.

(2) Second Example

A power supply device 1A illustrated in FIG. 10 has a semiconductor integrated circuit device IC3 and the smoothing circuit 4. The semiconductor integrated circuit device IC3 is obtained by forming semiconductor integrated circuit devices (chips) 21 and 22 in one package. In the semiconductor integrated circuit device (chip) 21, switching elements (HSD and LSD) SW and the driver (Dr) 6 are formed on a single semiconductor substrate. The semiconductor integrated circuit device (chip) 22 is obtained by forming the analog front-end circuit (AFE) 7 and the digital controller (DC) 8 on a single semiconductor substrate. The inductor L and the capacitor C are used as external parts of the semiconductor integrated circuit device IC3 as the power supply IC. Since the parts other than the inductor L and the capacitor C in the smoothing circuit 4 can be formed as an IC, obviously, the number of external parts can be considerably reduced. Further, in recent years, small devices such as a cellular phone are having higher functions and smaller sizes. Accordingly, demand for higher integration and miniaturization of the power supply IC is increasing. By using the semiconductor integrated circuit device IC3, the application range of a digital control power supply can be extended to small devices as described above.

Depending on the use of the power supply device, a required switching element varies. For example, a switching element for power conditioner for photovoltaic power generation is requested to have high voltage resistance. When the switching element SW is formed by providing the driver 6 and the digital controller 8 on one chip, in the case of developing a power supply for a different use, the power supply IC has to be newly designed, and development cost and time are necessary. On the other hand, the digital controller 8 can be controlled by software like in a fifth embodiment to be described later. To make the digital controller 8 adapted to various control methods, the digital controller 8 is configured so as to be divided into two chips (semiconductor substrates) as described above. Since the problem of heat dissipation of the switching element SW is considered, the chips are stored in one package side by side. In the case where the problem of heat dissipation can be ignored, by stacking the two chips, further miniaturization can be realized.

(3) Third Example

There is a case that the analog front-end circuit 7 is also requested to have high voltage resistance. In this case, it is sufficient to provide the switching element SW, the driver 6, and the analog front-end circuit 7 on a single semiconductor substrate and provide the digital controller 8 on another semiconductor substrate.

(4) Fourth Example

In the case where a change in the structure of the switching element SW is not required so much, for example, in the case of a general power supply IC, when two chips are formed as described above, the manufacture cost is high and the mounting area is large. Consequently, the switching element SW, the driver 6, the analog front-end circuit 7, and the digital controller 8 may be formed on a single semiconductor substrate.

(5) Fifth Example

Although not illustrated, there is also an embodiment that a power supply IC is formed on the same package together with a load such as a CPU (Central Processing Unit), an SDRAM (Synchronous Dynamic Random Access Memory), and the like. With the configuration, the wiring distance between the power supply device and the load can be made extremely short, so that fluctuations in output voltage when a sudden change occurs in the load can be considerably reduced. There is an effect that high response is realized.

(6) Sixth Example

Although not illustrated, there is also an embodiment that a power supply device is formed on the same chip or on the same package together with a load such as a CPU, an SDRAM, and the like. Similarly, there is an effect that high response when a sudden change occurs in the load is realized.

(7) Seventh Example

In a semiconductor integrated circuit device, at least components in the digital controller 8 are formed on a single semiconductor substrate.

4. Switching Element

Figure 11:
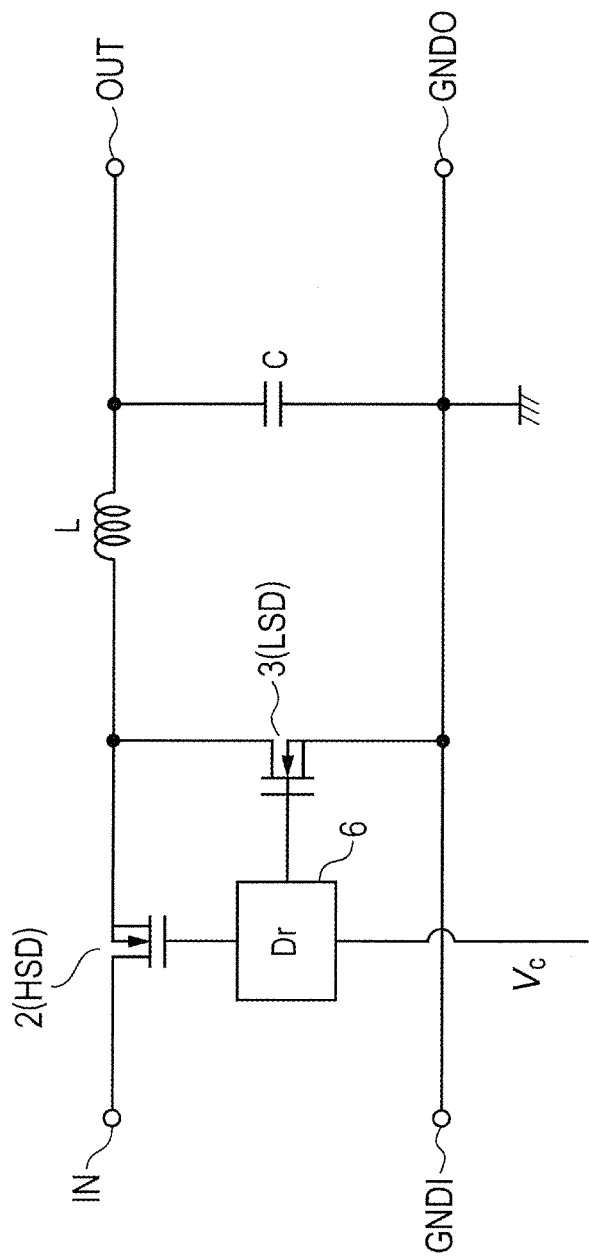
FIG. 11 is a diagram illustrating a concrete example of a switching element in the power supply circuit according to the first embodiment.

FIG. 11 is a diagram illustrating a concrete example of a switching element in the power supply circuit.

The input power supply terminal IN is coupled to the drain of the switching element 2. The source of the switching element 2 is coupled to the drain of the switching element 3. The source of the switching element 3 is coupled to the ground-side input power supply terminal GNDI. One end of the inductor L is coupled to the source of the switching element 2 and the drain of the switching element 3. The control signal ($V_c$) from the digital controller 8 is supplied to the driver 6. An output of the driver 6 and the gates of the switching elements 2 and 3 are coupled. A drive signal from the driver 6 is supplied to the gates of the switching elements 2 and 3.

Although both of the two switching elements SW are NMOS transistors as illustrated in FIG. 11, the invention is not limited to the configuration. The switching element 2 may be a PMOS transistor. At least one of the two transistors of the switching element SW may be a bipolar transistor. Further, two switching elements are not always necessary. One of them may be a switching element and the other may be a diode element.

For the switching element SW for the power supply device, a power MOSFET (Metal-Oxide-Semiconductor Field-Effect Transistor) is often used. Depending on the use of the power supply, another power switching element such as an IGBT (Insulated Gate Bipolar Transistor), a GaN device, or an SiC (silicon carbide) device may be used.

Comparative Technical Example

Figure 12:
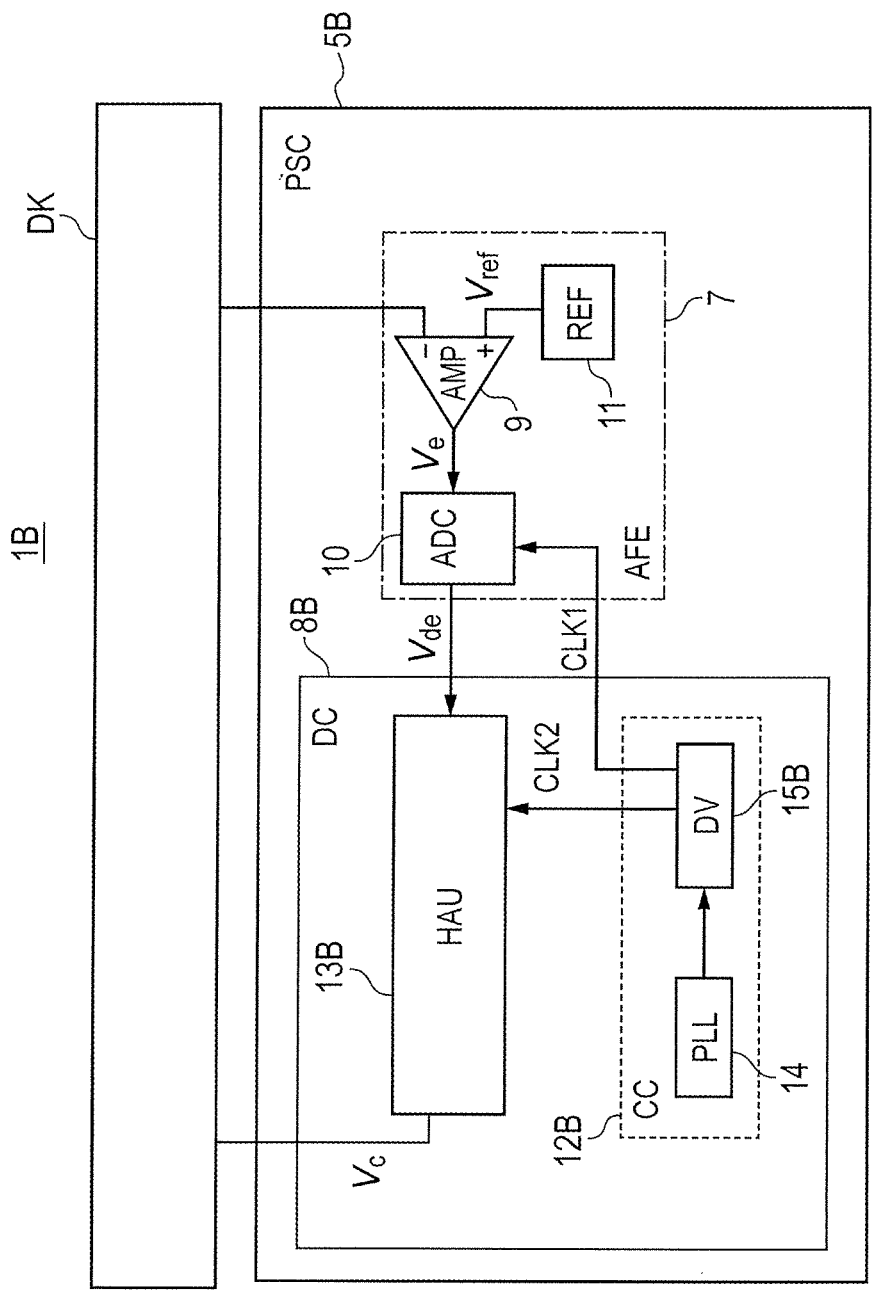
FIG. 12 is a diagram illustrating the configuration of a power supply control circuit (power supply device) as a comparative technical example.
Figure 13:
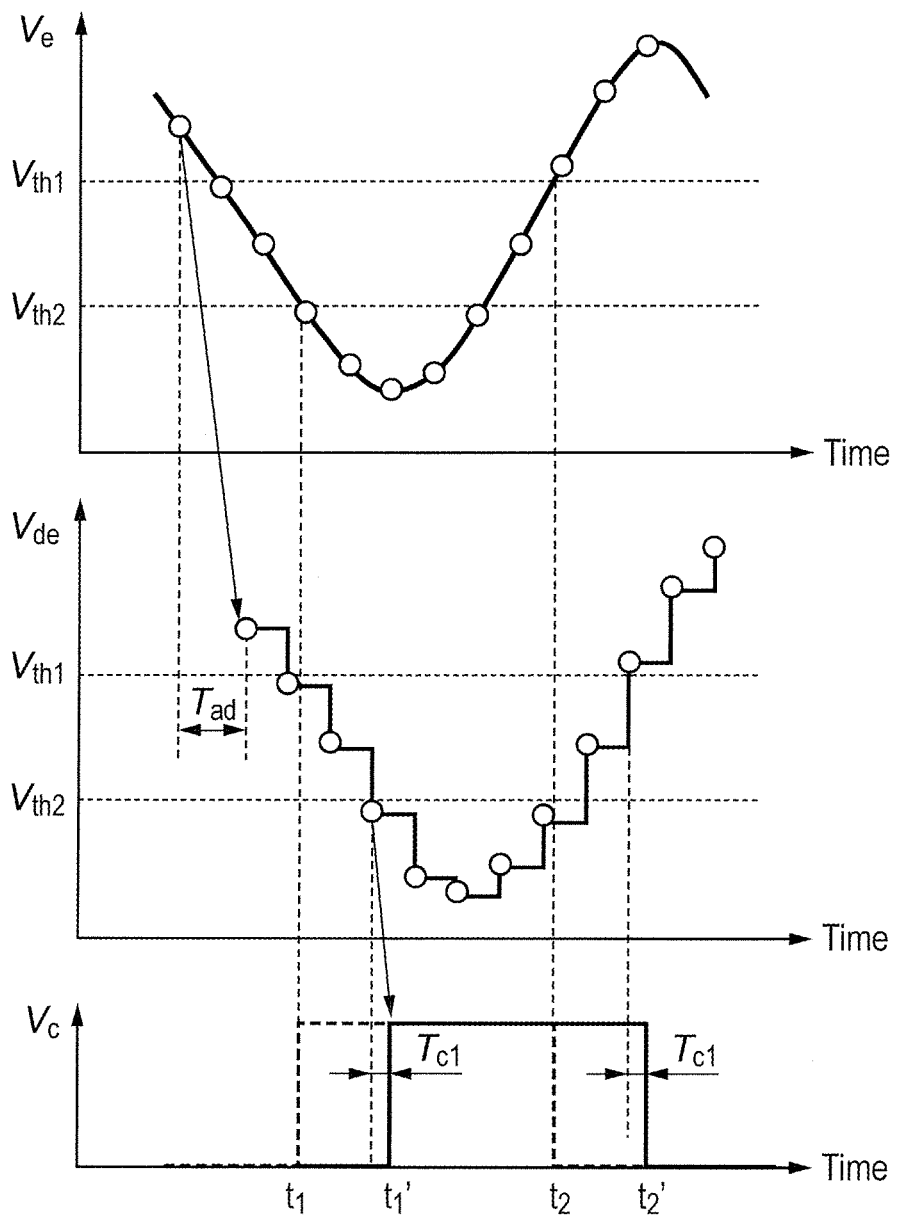
FIG. 13 is a diagram illustrating the operation of the power supply control circuit (power supply device) as the comparative technical example.

FIGS. 12 and 13 are diagrams illustrating the configuration and operation of a power supply control circuit (power supply device) as a comparative technical example. The comparative technical example is considered originally by the inventors of the present invention prior to the invention of the configuration and operation of the power supply control circuit (power supply device) according to the first embodiment. FIG. 12 is a configuration diagram of a power supply control circuit 5B (power supply device 1B) of the comparative technical example. Components to which the same reference numerals as those in FIGS. 1 and 3 are designated basically have the same functions.

FIG. 13 illustrates the operation of the power supply control circuit 5B (power supply device 1B) as the comparative technical example. By the AD converter 10, the differential voltage ($V_e$) from the differential amplifier 9 is converted to a digital error signal ($V_{de}$). The delay time ($T_{ad}$) by the AD conversion exists between the differential voltage ($V_e$) and the error signal ($V_{de}$). Further, a hysteresis arithmetic unit (HAU) 13B compares the error signal ($V_{de}$) with the two control thresholds ($V_{th1}$ and $V_{th2}$) to generate the control signal ($V_c$). Concretely, when the error signal ($V_{de}$) becomes larger than the high-level control threshold ($V_{th1}$), the control signal ($V_c$) rises at time $t_2$ to turn off the switching element 2. When the error signal ($V_{de}$) becomes smaller than the low-level control threshold ($V_{th2}$), the control signal ($V_c$) rises at time $t_1$ to turn on the switching element 2. By such a control, the output voltage ($V_{out}$) of the power supply device 1B is maintained constant. In this case, the delay time ($T_{c1}$) caused by the control calculation in the hysteresis arithmetic unit 13B exists.

For comparison of the digital hysteresis control method of the comparative technical example with an analog hysteresis control method, the control signal ($V_c$) of the analog hysteresis control method is also illustrated by the dotted line in the waveform diagram expressing the control signal ($V_c$). In the analog hysteresis control method, since the differential voltage ($V_e$) is directly compared with the two control thresholds ($V_{th1}$ and $V_{th2}$), the rising timing and the training timing of the control signal ($V_c$) become time $t_1$ and time $t_2$, respectively.

Since the rising and trailing of the control signal ($V_c$), that is, the timings of the on/off operation of the switching element SW directly exert influence on fluctuations of the output voltage, the output voltage fluctuation of the power supply device 1B, particularly, the voltage fluctuation when a sudden change occurs in the load becomes larger than that in an analog control power supply device. When a high-speed AD converter and a high-speed digital controller are used, the delay time ($T_{ad}$ and $T_{c1}$) can be shortened, and the control signal ($V_c$) can be generated more accurately. However, power consumption increases. Consequently, the power supply device 1B using the hysteresis control method of FIG. 11 has a problem in reduction in power consumption.

As understood from the above description, the hysteresis arithmetic unit 13 in FIG. 4 has a function different from that of the hysteresis arithmetic unit 13B in FIG. 12 and, accordingly, the configurations of the units 13 and 13B are different from each other.

The comparative technique as described above is summarized as follows. The analog control power supply device using the hysteresis control method has an advantage of very high response but has limitation in miniaturization. In particular, in the case where a plurality of power supply voltages are necessary for a power supply system, it is difficult to reduce parts and miniaturize the power supply device. To realize miniaturization of the power supply device, the power supply device 1B of the hysteresis control method obtained by digitizing the power supply device and providing a part of the control circuit in the digital controller has been described with reference to FIGS. 12 and 13. However, as described above, a large delay is caused by the digital process performed by the AD converter and the digital controller, the response of the power supply device 1B decreases, and the fluctuation in the output voltage of the power supply device 1B becomes large. By using a high-speed AD converter and a high-speed digital controller, the problem can be solved. However, the power consumption of the power supply device 1B itself increases. As a result, the power supply device 1B becomes unable to be applied to a small device such as a cellular phone or a notebook-sized personal computer, and the application range is limited.

In the power supply control circuit of the first embodiment, the output voltage is controlled so that the prediction value ($V_{pr}$) lies between the first control threshold ($V_{th1}$) and the second control threshold ($V_{th2}$). The prediction value ($V_{pr}$) is obtained at the third timing which is later than the first and second timings. Therefore, by using the prediction value ($V_{pr}$), response improves. Further, since the control signal ($V_c$) is promptly determined from the comparison relation between the prediction value ($V_{pr}$) and the first and second control thresholds ($V_{th1}$ and $V_{th2}$) and output voltage can be controlled in this mode (hysteresis control method), the response is high. Therefore, high response to fluctuation in the voltage of the load to which the output voltage is supplied can be realized. Further, the prediction value ($V_{pr}$) and the first and second control thresholds ($V_{th1}$ and $V_{th2}$) are digital values, and the power supply control circuit performs digital control. Consequently, the power consumption of the power supply control circuit itself and the power supply device itself becomes lower, and the power supply control circuit and the power supply device can be miniaturized.

Second Embodiment

The prediction controller 16 in the first embodiment obtains the prediction value ($V_{pr}(n)$) by using the error signal ($V_{de}(n-1)$) in the immediately preceding cycle and the present error signal ($V_{de}(n)$) to simplify the control calculation. However, the precision of prediction performed using two points as in the first embodiment (computation performed on assumption that the prediction value ($V_{pr}(n)$) exists on a line segment of the two error signals ($V_{de}$) is called linear prediction) is low. Particularly, when the output voltage ($V_{out}$) changes suddenly due to a sudden change in a load, a large prediction error occurs, so that the response of the power supply device deteriorates. Therefore, in a prediction controller 16C according to the second embodiment, to improve precision of prediction, prediction control is performed using a quadratic curve.

The power supply device of the embodiment is similar to the power supply device 1 of the first embodiment except for the prediction controller 16 and the frequency divider 15 in the power supply device 1 of the first embodiment. Therefore, the same components as those of the first embodiment are not illustrated and their description will not be repeated. Since determination of erroneous operation of prediction and the measure against erroneous operation are similar to those of the first embodiment, their description will not be repeated. A frequency divider 15C is basically the same as that in the first embodiment except that it outputs a clock (CLK4).

Figure 14:
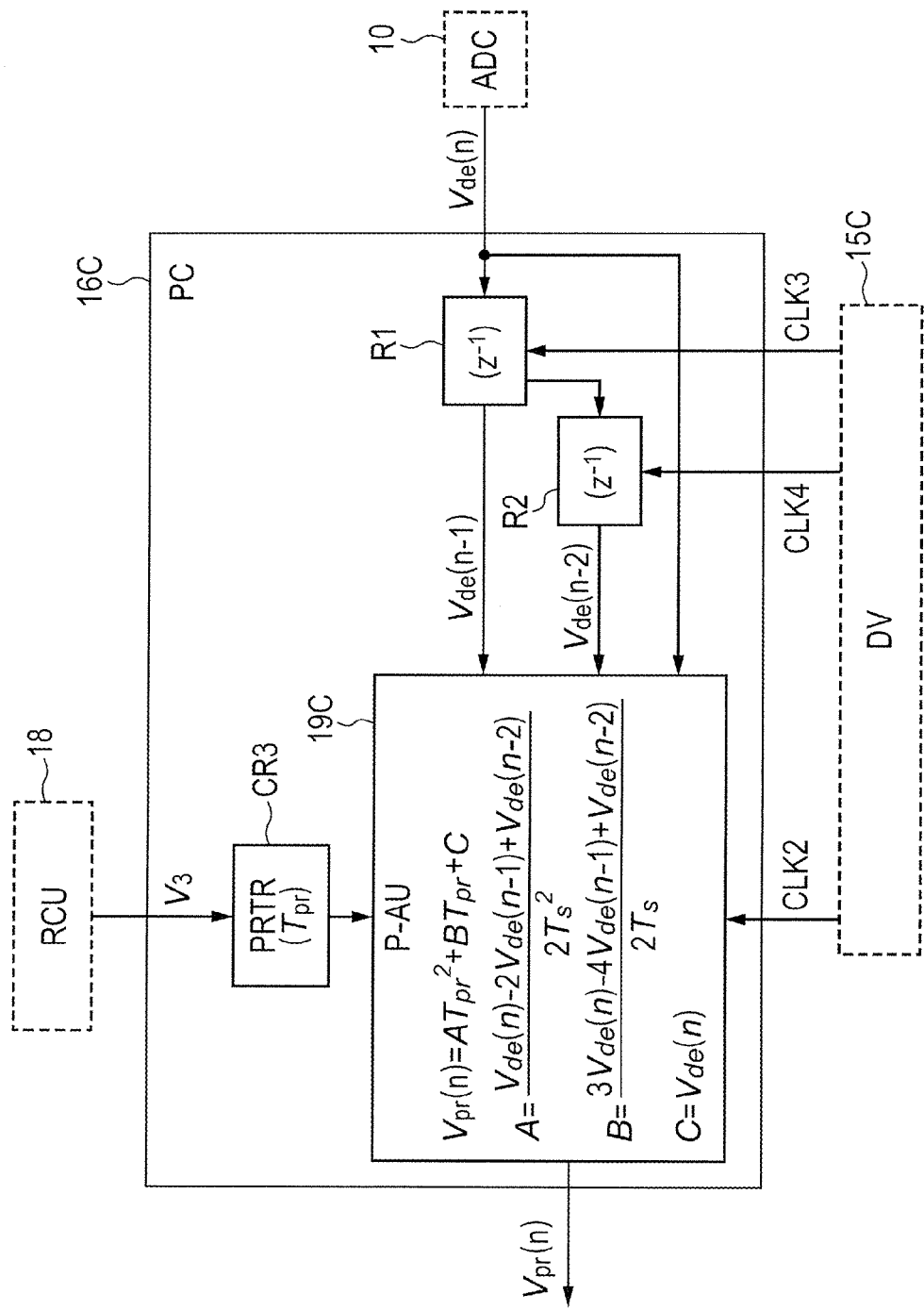
FIG. 14 is a block diagram of a prediction controller according to a second embodiment.

FIG. 14 is a block diagram of a prediction controller according to the second embodiment. The prediction controller 16C in the power supply control circuit has the control register CR3, the register (retention circuit) R1, the register (retention circuit) R2, and a prediction comparator 19C. The register R1 stores the error signal ($V_{de}(n-1)$) in the immediately preceding cycle from the AD converter 10 on the basis of the operation of the clock (CLK3) and updates the value cycle by cycle. The register R2 stores an error signal ($V_{de}(n-2)$) two cycles before from the AD converter 10 on the basis of the operation of the clock (CLK4) and updates the value cycle by cycle. The control register CR3 stores a coefficient ($T_{pr}$) as a prediction period necessary to obtain the prediction value ($V_{pr}(n)$). The value of the coefficient ($T_{pr}$) stored in the control register CR3 can be updated with a register update signal ($V_3$) from the register control unit 18. The prediction arithmetic unit 19C calculates an error after the prediction period ($T_{pr}$), that is, a prediction value ($V_{pr}(n)$) from the error signal ($V_{de}(n-1)$) in the immediately preceding cycle, the error signal ($V_{de}(n-2)$) two cycles before, and the present error signal ($V_{de}(n)$) on the basis of the operation of the clock (CLK2). The prediction arithmetic unit 19C obtains $V_{pr}(n)$ by Equation 2. $T_s$ denotes sampling rate of the AD converter 10.

$$V_{pr}(n) = AT_{pr}^2 + BT_{pr} + C \qquad \text{Equation 2}$$

$$A = \frac{V_{de}(n) - 2V_{de}(n-1) + V_{de}(n-2)}{2T_s^2}$$

$$B = \frac{3V_{de}(n) - 4V_{de}(n-1) + V_{de}(n-2)}{2T_s}$$

$$C = V_{de}(n)$$

In Equation 2, $V_{pr}(n)$ denotes the prediction value ($V_{pr}(n)$), $V_{de}(n)$ denotes the present error signal ($V_{de}(n)$), $V_{pr}(n-1)$ denotes an error signal ($V_{de}(n-1)$) in the immediately preceding cycle, $V_{de}(n-2)$ denotes the error signal ($V_{de}(n-2)$) two cycles before, $T_{pr}$ indicates the prediction period ($T_{pr}$), and $T_s$ indicates the sampling rate of the AD converter (ADC).

The flow of the signals is summarized as follows. When the error signal ($V_{de}(n)$) is supplied from the AC converter 10 to the register R1 and the clock signal (CLK3) is supplied from the frequency divider 15C, the error signal ($V_{de}(n-1)$) of the immediately preceding cycle is output. When the error signal ($V_{de}(n-1)$) of the immediately preceding cycle is supplied from the register R1 to the register R2 and the clock (CLK4) is supplied from the frequency divider 15C, the error signal ($V_{de}(n-2)$) two cycles before is output. To the prediction arithmetic unit 19C, the error signal ($V_{de}(n-1)$) of the immediately preceding cycle is supplied from the register R1, the error signal ($V_{de}(n-2)$) two cycles before is supplied from the register R2, and the error signal ($V_{de}(n)$) is supplied from the AD converter 10. Further, to the prediction arithmetic unit 19C, the clock (CLK2) is supplied from the frequency divider 15C and the prediction period ($T_{pr}$) is supplied from the control register CR3. As a result, the prediction value ($V_{pr}(n)$) is output.

Figure 15:
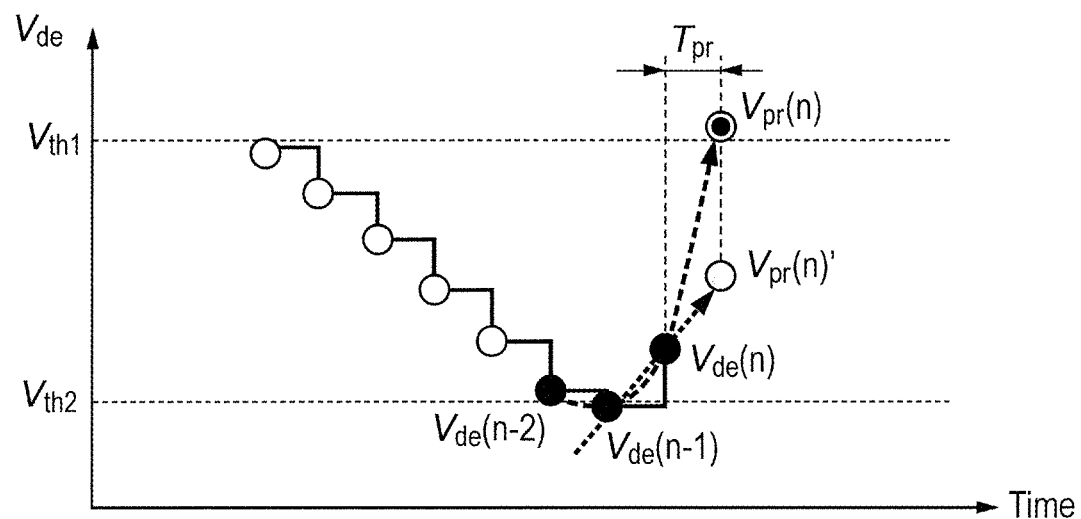
FIG. 15 is a diagram illustrating the operation principle of prediction control according to the second embodiment.

FIG. 15 illustrates the operation principle of prediction control in the second embodiment. A quadratic curve is drawn by using the present error signal $V_{de}(n)$, the error signal ($V_{de}(n-1)$) of the immediately preceding cycle, and the error signal ($V_{de}(n-2)$) two cycles before to predict an error signal after the prediction period ($T_{pr}$), that is, the prediction value ($V_{pr}(n)$) by the equation 2. Using the obtained prediction value ($V_{pr}(n)$), the control signal ($V_c$) is generated from the result of comparison with the two control thresholds ($V_{th1}$ and $V_{th2}$). The prediction value ($V_{pr}(n)$) obtained in such a manner lies out of the range of the two control thresholds ($V_{th1}$ and $V_{th2}$) earlier than the present error voltage (Vde(n), so that delay caused by the AD conversion and control calculation can be made unseen. Therefore, the response of the power supply control circuit (power supply device) can be increased.

More concretely, as illustrated in FIG. 15, in the case where the output voltage ($V_{out}$) suddenly changes due to a sudden change in a load, that is, in the case where the error voltage suddenly changes, the prediction value ($V_{pr}(n)$) obtained from prediction using such a quadratic curve exceeds a first control threshold ($V_{th1}$) faster than a prediction value ($V_{pr}(n)'$) derived from a linear prediction using two points. It is therefore obvious that the response of the power supply control circuit (power supply device) of the embodiment is higher than that of the first embodiment.

Further, since the prediction controller 16C performs the control calculation using the quadratic curve in the second embodiment, the control calculation using a cubic curve, a quartic curve, or the like can be also performed.

Third Embodiment

In the prediction controllers of the first and second embodiments, to obtain high response, the linear prediction using two points and the prediction using the quadratic curve are applied to the control of the power supply device. However, an actual power supply device is subject to the influence of various noises (EMI noise, harmonic noise, and the like) from peripheral circuits. When the prediction value ($V_{pr}$) obtained by using such a noise signal is used for generation of the control signal ($V_c$), there is the possibility that an output of the power supply device oscillates or becomes unstable. Therefore, in the prediction controller of the third embodiment, to improve noise resistance of the power supply, a plurality of error signals are integrated and averaged and, then, the prediction control is performed.

The power supply device of the embodiment is similar to the power supply device 1 of the first embodiment except for the prediction controller 16 and the frequency divider 15 in the power supply device 1 of the first embodiment. Therefore, the same components as those of the first embodiment are not illustrated and their description will not be repeated. Since determination of erroneous operation of prediction and the measure against erroneous operation are similar to those of the first embodiment, their description will not be repeated. A frequency divider 15D is basically the same as that in the first embodiment except that it outputs clocks (CLK3 to CLKx).

Figure 16:
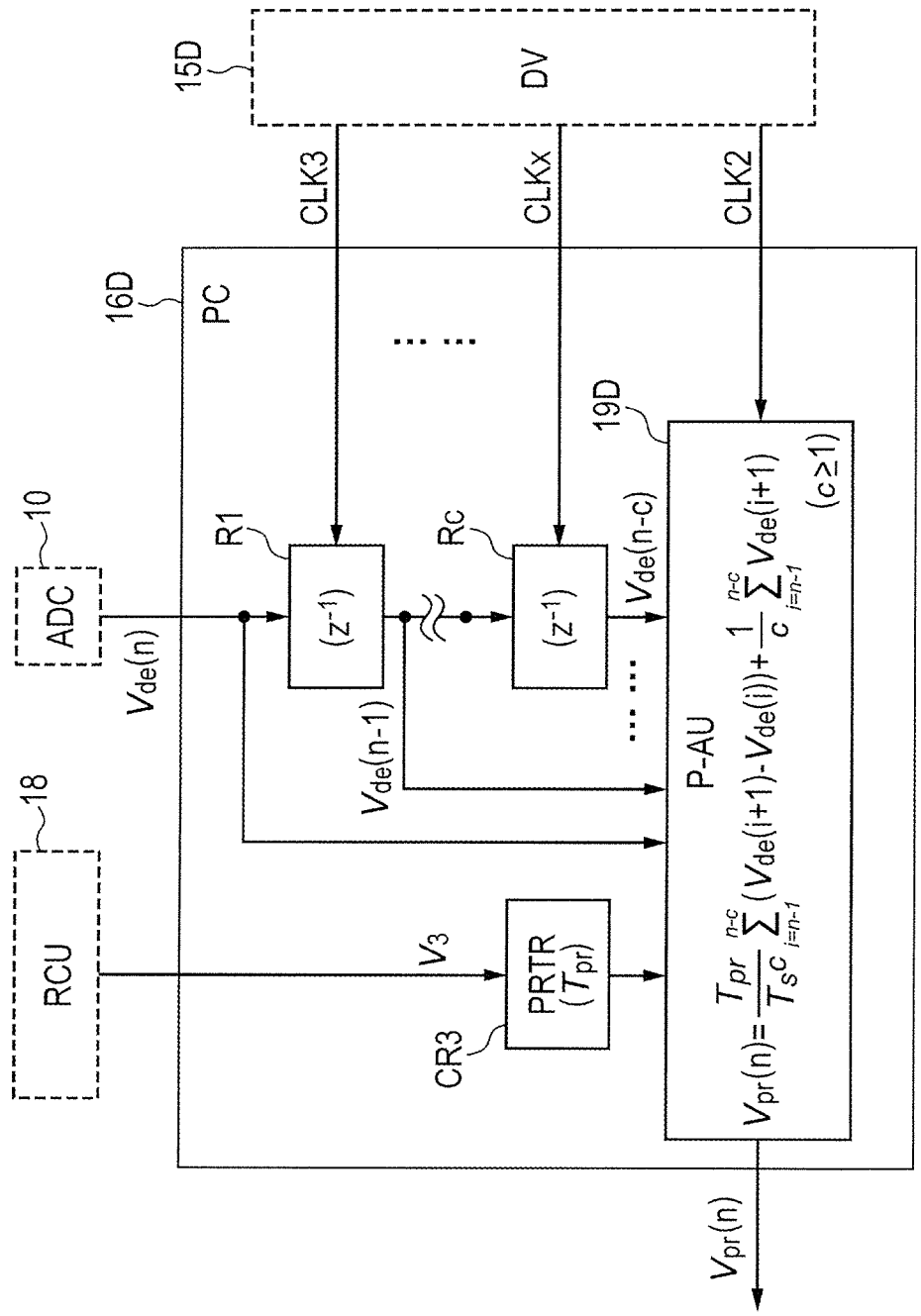
FIG. 16 is a configuration diagram of a prediction controller according to a third embodiment.

FIG. 16 is a configuration diagram of a prediction controller according to the third embodiment. A prediction controller 16D in the power supply control circuit includes the control register CR3, the registers R1 to Rc, and a prediction arithmetic unit 19D. In this case, "c" denotes natural number. The registers R1 to Rc store the error signal ($V_{de}(n-1)$) in the immediately preceding cycle to the error signal ($V_{de}(n-c)$) of "c" cycles before from the AD converter 10 on the basis of the operation of the clocks (CLK3 to CLKx) and update the value cycle by cycle. The number of such registers (retention circuits) is determined by the number (the averaged number) of necessary error signals ($V_{de}$) to be averaged. For example, in the case of two-point averaging, at least two registers R1 and R2 are necessary to store the error signals ($V_{de}$). The control register R3 stores the coefficient ($T_{pr}$) as a prediction period necessary to obtain the prediction value ($V_{pr}(n)$) The value of the coefficient ($T_{pr}$) stored in the control register CR3 can be updated with the register update signal ($V_3$) from the register control unit 18. The prediction arithmetic unit 19D averages a plurality of error signals ($V_{de}$) on the basis of the operation of the clock (CLK2) and, by a present averaged error signal ($V_{de}(n)'$) and an averaged error signal ($V_{de}(n-1)'$) in the immediately preceding cycle obtained by the averaging, calculates an error signal ($V_{de}$) after the prediction period ($T_{pr}$), that is, the prediction value ($V_{pr}(n)$). The prediction arithmetic unit 19D obtains $V_{pr}(n)$ by Equation 3. $T_s$ denotes sampling rate of the AD converter 10 and "c" denotes the number (average number) of error signals ($V_{de}$) to be averaged. In the case where "c" becomes 1, the operation is similar to that of the first embodiment.

$$V_{pr}(n) = \frac{T_{pr}}{T_s c}(V_{de}(i+1) - V_{de}(i)) + \frac{1}{c}\sum_{i=n-1}^{n-c} V_{dc}(i+1) = \frac{T_{pr}}{T_s}(V_{de}(n)' - V_{de}(n-1)') + V_{de}(n)'$$

Equation 3

In Equation 3, $V_{pr}(n)$ denotes the prediction value ($V_{pr}(n)$), $V_{de}(n)'$ denotes the present averaged error signal ($V_{de}(n)'$), $V_{pr}(n-1)'$ denotes the averaged error signal ($V_{de}(n-1)'$) in the immediately preceding cycle, $T_{pr}$ indicates the prediction period ($T_{pr}$), $T_s$ indicates the sampling rate of the AD converter (ADC), and "c" denotes the number of error signals ($V_{de}$) to be averaged.

The flow of the signals is summarized as follows. When the error signals ($V_{de}(n-1)$ to $V_{de}(n-c)$) are supplied to the registers R1 to Rc and the clocks (CLK3 to CLKx) are supplied from the frequency divider 15D, the error signals ($V_{de}(n-1)$ to $V_{de}(n-c)$) of the immediately preceding cycle to "c" cycles before are output. To the prediction arithmetic unit 19D, the error signals ($V_{de}(n-1)$ to $V_{de}(n-c)$) are supplied from the registers R1 to Rc, and the error signal ($V_{de}(n)$) is supplied from the AD converter 10. Further, to the prediction arithmetic unit 19D, the clock (CLK2) is supplied from the frequency divider 15D, and the prediction period ($T_{pr}$) is supplied from the control register CR3, the prediction value ($V_{pr}(n)$) is output.

Figure 17:
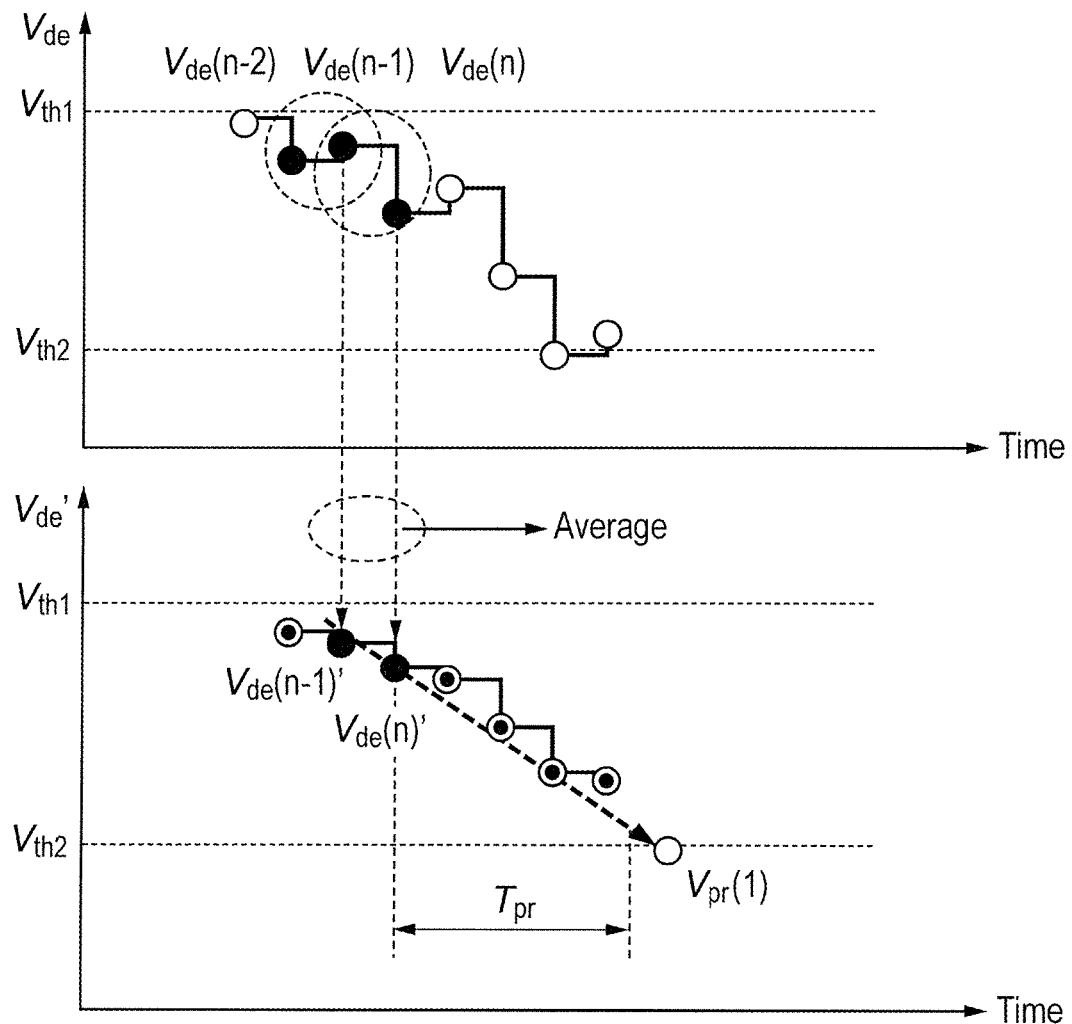
FIG. 17 is a diagram illustrating the operation principle of prediction control according to the third embodiment.

FIG. 17 illustrates the operation principle in the embodiment. For simplicity of the drawing, two-point averaging will be described as an example.

Averaging is performed by using the present error signal ($V_{de}(n)$) and the error signal ($V_{de}(n-1)$) in the immediately preceding cycle to obtain a present average error signal ($V_{de}(n)'$). Further, averaging is performed by using the error signal ($V_{de}(n-1)$) in the immediately preceding cycle and the error signal ($V_{de}(n-2)$) of two cycles before to obtain an average error signal ($V_{de}(n-1)'$) of the immediately preceding cycle. Using the averaged error signal ($V_{de}(n-1)'$) of the immediately preceding cycle and the present averaged error signal ($V_{de}(n)'$), an error signal after the prediction period ($T_{pr}$), that is, the prediction value ($V_{pr}(n)$) is predicted. In FIG. 17, the prediction value ($V_{pr}$) is positioned on a line segment coupling the present averaged error signal ($V_{de}(n)$) and the averaged error signal (Vde(n-1)) of one cycle before. From a result of comparison of the obtained prediction value ($V_{pr}(n)$) with the two control thresholds ($V_{th1}$ and $V_{th2}$), the control signal ($V_c$) is generated. Since the prediction value (Vpr(n)) obtained in such a manner exceeds the second control threshold ($V_{th2}$) faster than the present error voltage ($V_{de}(n)$), delay caused by the AD conversion and control calculation can be made unseen. Therefore, the response of the power supply control circuit (power supply device) can be increased.

In the embodiment, the larger the number "c" of error signals ($V_{de}$) to be averaged is, the more the influence of noise can be reduced, but the response of the power supply device by the effect of integration deteriorates. Therefore, by optimizing "c", both of the noise resistance and high response of the power supply device can be realized. An averaging number setting register (a fourth register ANSR) for setting the value of "c" from the outside of the power supply device may be provided for a digital controller.

Further, in the foregoing third embodiment, the prediction controller 16D performs the control calculation by the linear control obtained by averaged two points. By applying control calculation using a quadratic curve or a cubic curve in place of the above-described control calculation, the invention can be realized.

Fourth Embodiment

In the high-speed control method used in the first, second, and third embodiments, the hysteresis control which determines the rising and trailing timings of the control signal ($V_c$) using the error signal ($V_{de}$) is executed. In this case, when a low-speed AD converter and a low-speed digital controller are used, an adverse influence of quantization noise of the error signal ($V_{de}$) is large. When the prediction value ($V_{pr}$) obtained by using the error signal ($V_{de}$) having such quantization noise is used for generation of the control signal ($V_c$), there is the possibility that the output voltage ($V_{out}$) from the power supply device oscillates or becomes unstable. Therefore, in the fourth embodiment, even if the AD converter and the digital controller perform low-speed operation, high response can be realized.

Figure 18:
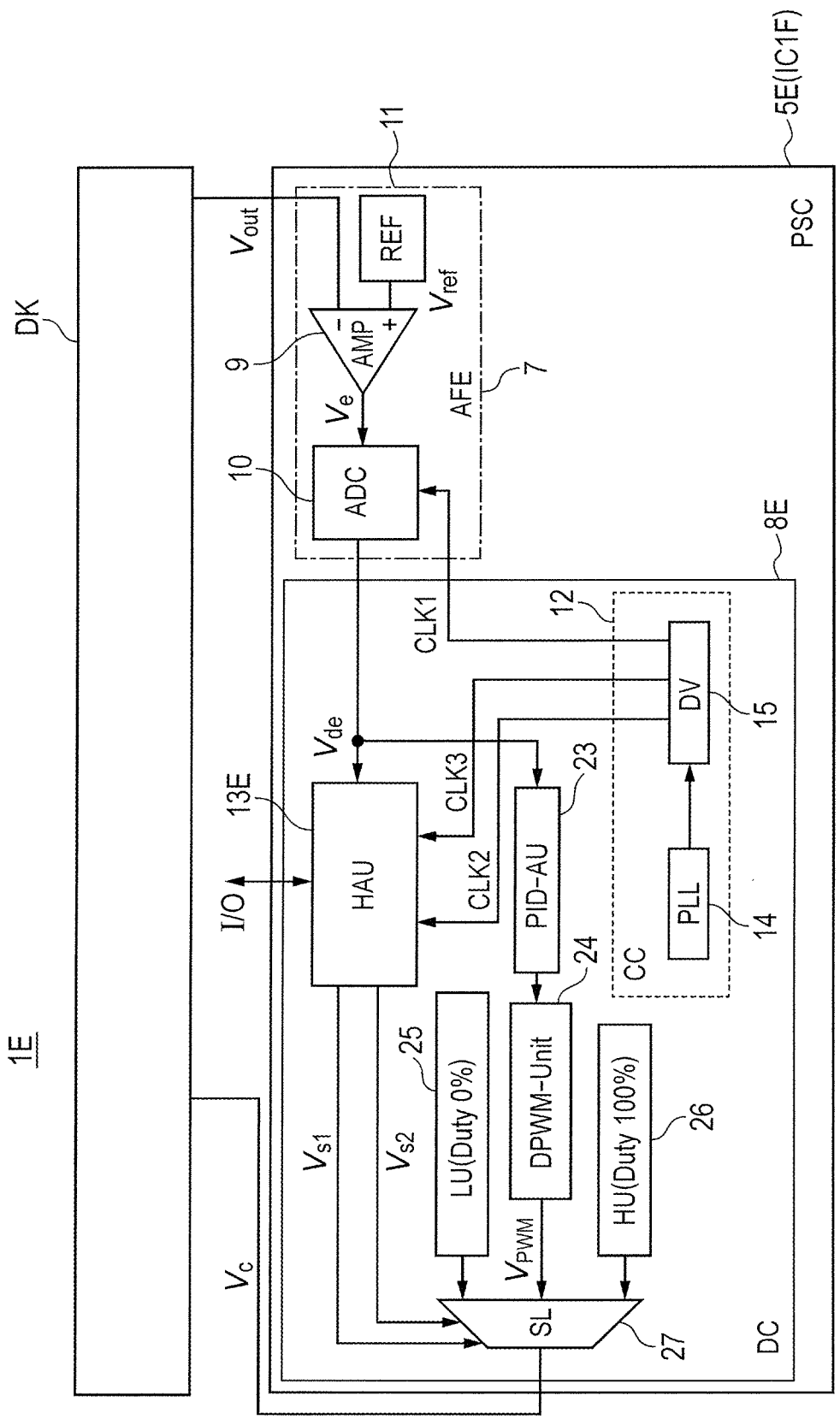
FIG. 18 is a configuration diagram of a power supply device according to a fourth embodiment.

FIG. 18 is a configuration diagram of a power supply device according to a fourth embodiment. A power supply device 1E is similar to the power supply device 1 according to the first embodiment except for the digital controller 8 of the power supply device 1 of the first embodiment. In a manner similar to the first example of the first embodiment, a power supply control circuit 5E is formed on a single semiconductor substrate and constructed as a semiconductor integrated circuit device IC1E. The second to six examples of the first embodiment may be also employed. Therefore, description of the same parts as those of the first embodiment will not be repeated.

A digital controller 8E has the clock generating circuit 12, a hysteresis arithmetic unit 13E, a PID arithmetic unit (PID-AD) 23, a PWM signal generating unit (DPWM unit) 24, a low-level unit (LU) 25, a high-level unit (HU) 26, and a selector (SL) 27. The clock generating circuit 12 is the same as that in the first embodiment, so that its description will not be repeated.

The PID arithmetic unit (PID control circuit) 23 calculates the duty ratio and outputs the calculation result to the PWM signal generating unit 24. For the calculation of the duty ratio, a PID (Proportional Integral and Differential) correction control method made by three elements of proportional control (P), integral control (I), and differential control (D) is used. The PID arithmetic unit 23 executes control so that the error signal ($V_{de}$) from the AD converter 10 approaches zero. The PWM signal generating unit 24 generates a PWM signal ($V_{PWM}$) on the basis of the arithmetic operation result of the PID arithmetic unit 23. Concretely, the PWM signal generating unit 24 compares an output from the PID arithmetic unit 23 with a triangular wave and outputs a high-level or low-level signal according to the comparison result as the PWM signal ($V_{PWM}$). The PWM signal ($V_{PWM}$) generated by the PWM signal generating unit 24 is a PWM (Pulse Width Modulation) signal which controls the pulse width.

A hysteresis arithmetic unit 13E obtains the prediction value ($V_{pr}$) by the error signal ($V_{de}$) from the AD converter 10 and outputs a result of comparison of the obtained prediction value ($V_{pr}$) and the two control thresholds ($V_{th1}$ and $V_{th2}$) as selector signals ($V_{s1}$ and $V_{s2}$). The low-level circuit (low-level signal generating circuit) 25 generates a low-level signal as a signal of duty ratio 0%. The high-level circuit (high-level signal generating circuit) 26 generates a high-level signal as a signal of duty ratio 100%. The selector 27 selects an output of the low-level circuit 25, an output of the high-level circuit 26, or an output of the hysteresis arithmetic unit 13E on the basis of the states of the first and second selector signals ($V_{s1}$) and ($V_{s2}$) and outputs the selected output as the control signal ($V_c$) to control the on/off operation of the switching element SW.

The coupling relation and the flow of the signals are summarized as follows. The error signal ($V_{de}$) is output from the AD converter 10 and supplied to the hysteresis computing unit 13E and the PID arithmetic unit 23. The hysteresis arithmetic unit 13E outputs selector signals ($V_{s1}$ and $V_{s2}$) to the selector 27. A result of calculation of the duty ratio from the PID arithmetic unit 23 is output to the PWM signal generating unit 24. From the PWM signal generating unit 24, the PWM signal ($V_{PWM}$) is output. The low-level circuit 25 outputs a low-level signal. The high-level circuit 26 outputs a high-level signal. The selector 27 receives the PWM signal ($V_{PWM}$), the low-level signal, and the high-level signal and outputs the control signal ($V_c$) to a power supply circuit DK.

Figure 19:
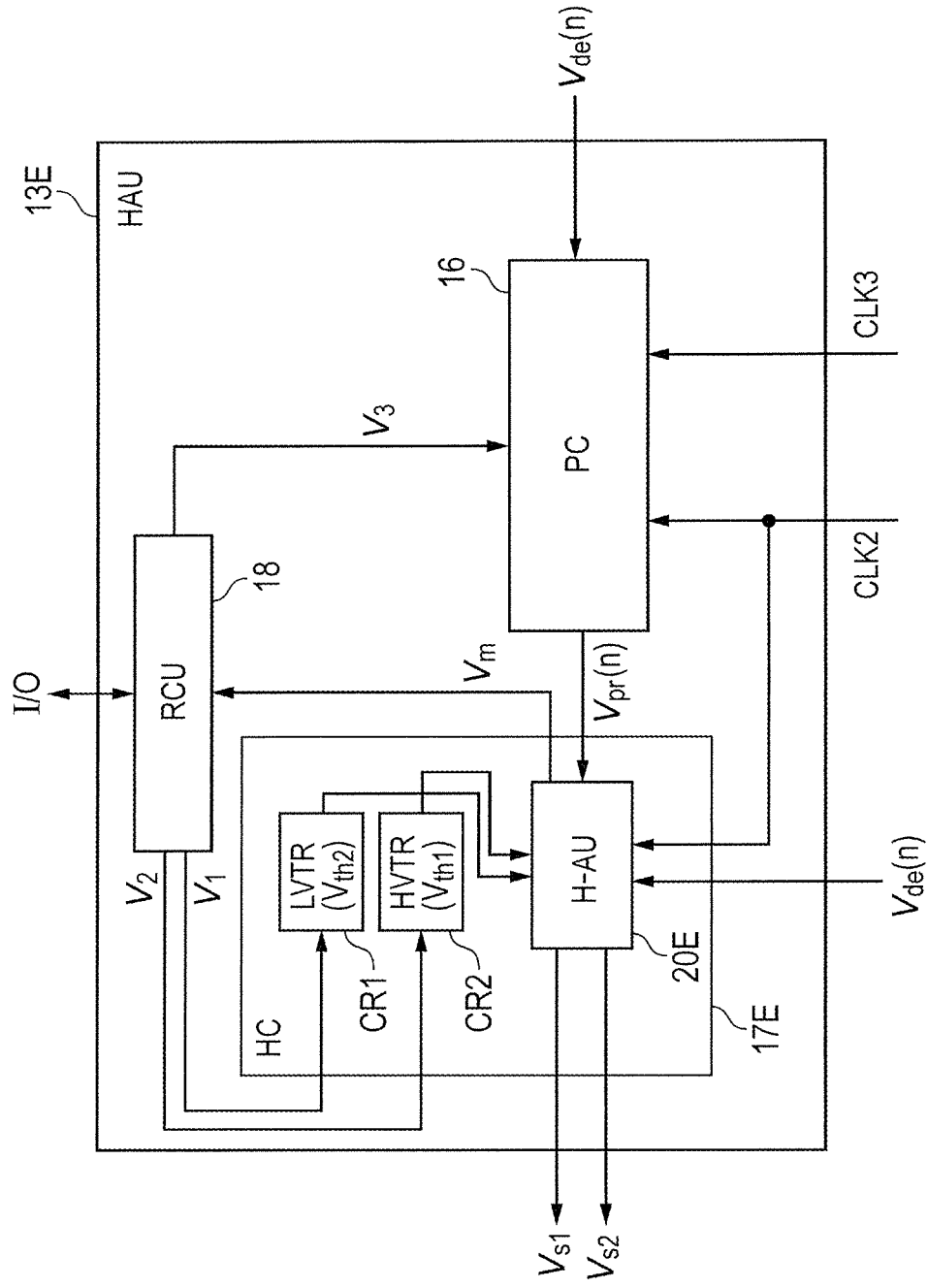
FIG. 19 is a configuration diagram of a hysteresis arithmetic unit according to the fourth embodiment.

FIG. 19 is a configuration diagram of a hysteresis arithmetic unit according to the fourth embodiment. The hysteresis arithmetic unit 13E has the prediction controller 16, a hysteresis controller 17E, and the register control unit 18. Since the prediction controller 16 and the register control unit 18 in the hysteresis arithmetic unit 13E are similar to those of the first embodiment, their description will not be repeated.

The hysteresis controller 17E has the control registers CR1 and CR2 and a hysteresis comparator 20E. Since the control registers CR1 and CR2 in the hysteresis controller 17E are similar to those of the first embodiment, their description will not be repeated.

With respect to the input/output relations of signals of the hysteresis computing unit 13E, in the first embodiment, the hysteresis comparator 20 outputs the control signal ($V_c$). In the fourth embodiment, the hysteresis comparator 20E outputs the selector signals ($V_{s1}$ and $V_{s2}$). With respect to the other points, the fourth embodiment is similar to the first embodiment.

The operation principle of the hysteresis comparator 20E is illustrated in FIG. 20. The state of the selector signals ($V_{s1}$ and $V_{s2}$) is determined by the result of comparison of the prediction value ($V_{pr}(n)$) generated by the prediction controller 16 and the error signal ($V_{de}(n)$) with the two control thresholds ($V_{th1}$ and $V_{th2}$).

The power supply control circuit 5E (power supply device 1E) of the fourth embodiment also has erroneous modes as those described in the first embodiment, and there is the possibility that the first and second erroneous operation modes occur.

(A) Normal Mode

In the following state, the power supply control circuit 5E (power supply device 1E) is in the normal mode.

When the prediction value ($V_{pr}(n)$) is larger than the first control threshold ($V_{th1}$) and the error signal ($V_{de}(n)$) is larger than the second control threshold ($V_{th2}$), both of the first and second selector signals ($V_{s1}$ and $V_{s2}$) become L (low-level signals), so that the selector 27 selects an output of the low-level circuit 25. Therefore, the output of the selector 27 becomes L (a PWM pulse signal corresponding to the duty ratio 0%).

When the prediction value ($V_{pr}(n)$) is smaller than the second control threshold ($V_{th2}$) and the error signal ($V_{de}(n)$) is smaller than the first control threshold ($V_{th1}$), both of the first and second selector signals ($V_{s1}$ and $V_{s2}$) become H (high-level signals), so that the selector 27 selects an output of the high-level circuit 26. Therefore, the output of the selector 27 becomes H (a PWM pulse signal corresponding to the duty ratio 100%).

Under the condition that the second control threshold ($V_{th2}$)<the prediction value ($V_{pr}(n)$)<the first control threshold ($V_{th1}$), the first selector signal ($V_{s1}$) becomes H and the second selector signal ($V_{s2}$) becomes L, so that the output of the selector 27 is selected as a PWM signal ($V_{PWM}$) from the PWM signal generating unit 24.

(B) Erroneous Operation Mode

In the following two states, the power supply control circuit 5E (power supply device 1E) is in the erroneous operation mode. In the erroneous operation mode, the hysteresis comparator 20E outputs the erroneous operation signal ($V_m$) to the register control unit 18. The erroneous operation signal ($V_m$) is transmitted from the register control unit 18 to an external device on the outside of the power supply device of a personal computer or the like via a communication line I/O. As a result, the register control unit 18 receives update values of the control registers CR1, CR2, and CR3 from the external device on the outside of the power supply device of a personal computer or the like via the communication line I/O and updates at least any of the values of the control registers CR1, CR2, and CR3.

When the prediction value ($V_{pr}(n)$) is smaller than the second control threshold ($V_{th2}$) and the error signal ($V_{de}(n)$) is larger than the first control threshold ($V_{th1}$), both of the first and second selector signals ($V_{s1}$ and $V_{s2}$) become L, so that an output of the selector 27 is selected as L (a PWM pulse signal corresponding to the duty ratio 0%). This is the first erroneous operation mode.

When the prediction value ($V_{pr}(n)$) is larger than the first control threshold ($V_{th1}$) and the error signal ($V_{de}(n)$) is smaller than the second control threshold ($V_{th2}$), both of the first and second selector signals ($V_{s1}$ and $V_{s2}$) become H, so that an output of the selector 27 is selected as H (a PWM pulse signal corresponding to the duty ratio 100%). This is the second erroneous operation mode.

Like in the power supply control circuit 5 (power supply device 1) of the first embodiment, also in the power supply control circuit 5E (power supply device 1E) of the embodiment, by comparing the prediction value ($V_{pr}(n)$) and the two control thresholds ($V_{th1}$ and $V_{th2}$), not only the state of the control signal ($V_c$) is determined but also the state of the error signal ($V_{de}(n)$) is added as a condition of determining the state of the control signal ($V_c$). Consequently, even when the power supply control circuit 5E (power supply device 1E) enters the erroneous operation mode, it can return to the normal mode by the control signal ($V_c$). Therefore, the response of the power supply control circuit 5E (power supply device 1E) can be increased. Since the circuit can promptly return from the erroneous operation mode to the normal mode, destruction or an inoperative state of a load to which the power supply voltage from the power supply device 1E is supplied can be avoided. Further, the proper control signal ($V_c$) which varies between the first and second erroneous operation modes is output, so that the output voltage ($V_{out}$) can be promptly set between the two control thresholds ($V_{th1}$ and $V_{th2}$).

Next, the operation principle of the power supply device 1E according to the embodiment will be described.

When the load is stabilized, the output voltage ($V_{out}$) is constant and the erroneous voltage ($V_{de}$) hardly fluctuates, so that the state of the first selector signal ($V_{s1}$) and the state of the second selector signal ($V_{s2}$) from the hysteresis comparator 20E are H and L, respectively, and the output of the selector 27 is the PWM signal ($V_{PWM}$) from the PWM signal generating unit 24.

In the case of a sudden decrease in a load in the normal mode, the output voltage ($V_{out}$) suddenly rises, so that the error voltage ($V_{de}$) suddenly increases. When the prediction value ($V_{pr}$) obtained from the error voltage ($V_{de}$) becomes larger than the first control threshold ($V_{th1}$), both of the first and second selector signals ($V_{s1}$ and $V_{s2}$) from the hysteresis comparator 20E become L, and the selector 27 selects an L signal corresponding to the duty ratio 0% and outputs it to the driver 6 in the power supply circuit DK. Accordingly, the second switching element 3 in the power supply circuit DK is turned on, the switching element 2 enters an off state, and fluctuations in the output voltage ($V_{out}$) can be promptly suppressed.

On the other hand, in the case of a sudden increase in a load in the normal mode, the output voltage ($V_{out}$) suddenly drops, so that the error voltage ($V_{de}$) suddenly decreases. When the prediction value ($V_{pr}$) obtained from the error voltage ($V_{de}$) becomes smaller than the second control threshold ($V_{th2}$), both of the first and second selector signals ($V_{s1}$ and $V_{s2}$) from the hysteresis comparator 20E become H, and the selector 27 selects an H signal corresponding to the duty ratio 0% and outputs it to the driver 6 in the power supply circuit DK. Accordingly, the switching element 2 in the power supply circuit DK is turned on, the switching element 3 enters an off state, and fluctuations in the output voltage ($V_{out}$) can be promptly suppressed.

Adjustment on the L signal corresponding to the duty ratio of 0% and the H signal corresponding to the duty ratio of 100% is equal to forced adjustment of the duty ratio of the PWM signal ($V_{PWM}$). Therefore, when the power supply is controlled by combination of the prediction control method and the PWM control method, by forcedly adjusting the duty ratio of the PWM signal ($V_{PWM}$) by the prediction control when a sudden change in a load, the response of the power supply device 1E can be increased.

The prediction control method is performed only when a load suddenly changes, that is, the output voltage ($V_{out}$) changes suddenly. Consequently, there is no possibility that the output voltage ($V_{out}$) of the power supply device 1E oscillates by control with the prediction value ($V_{pr}$) using the error signal including quantization noise like in the first, second, and third embodiments, so that a low-speed AD converter and a low-speed digital controller can be used. Therefore, power consumption in the power supply control circuit 5E and the entire power supply device 1E can be reduced.

In the power supply device 1E of the embodiment, a low-speed AD converter and a low-speed digital controller may be used. Instead, to improve the response of the power supply device 1E, a high-speed AD converter and a high-speed digital controller may be used.

Further, in the foregoing fourth embodiment, the prediction controller 16 can apply the control calculation the method of approximating signals to a straight line, the method of approximating signals to a multidimensional curve such as a quadratic curve or higher order, the method of integrating a plurality of error signals ($V_{de}$) and averaging them and, after that, performing prediction control, and the like as in the first, second, and third embodiments.

Fifth Embodiment

In the first to fourth embodiments, generation of the prediction value ($V_{pr}$) and the hysteresis control are executed by hardware. In the first to fourth embodiments, once a circuit for executing an arithmetic operation for generating the prediction value ($V_{pr}$) and hysteresis control calculation is generated by hardware, it becomes difficult to make a change later on and becomes uneasy to update the arithmetic operations. It tends to cause increase in development cost and delay in development. Therefore, the fifth embodiment is directed to enable arithmetic operation of generation of the prediction value ($V_{pr}$) and the hysteresis control calculation flexibly changed so that the development cost and the development delay can be reduced.

Figure 21:
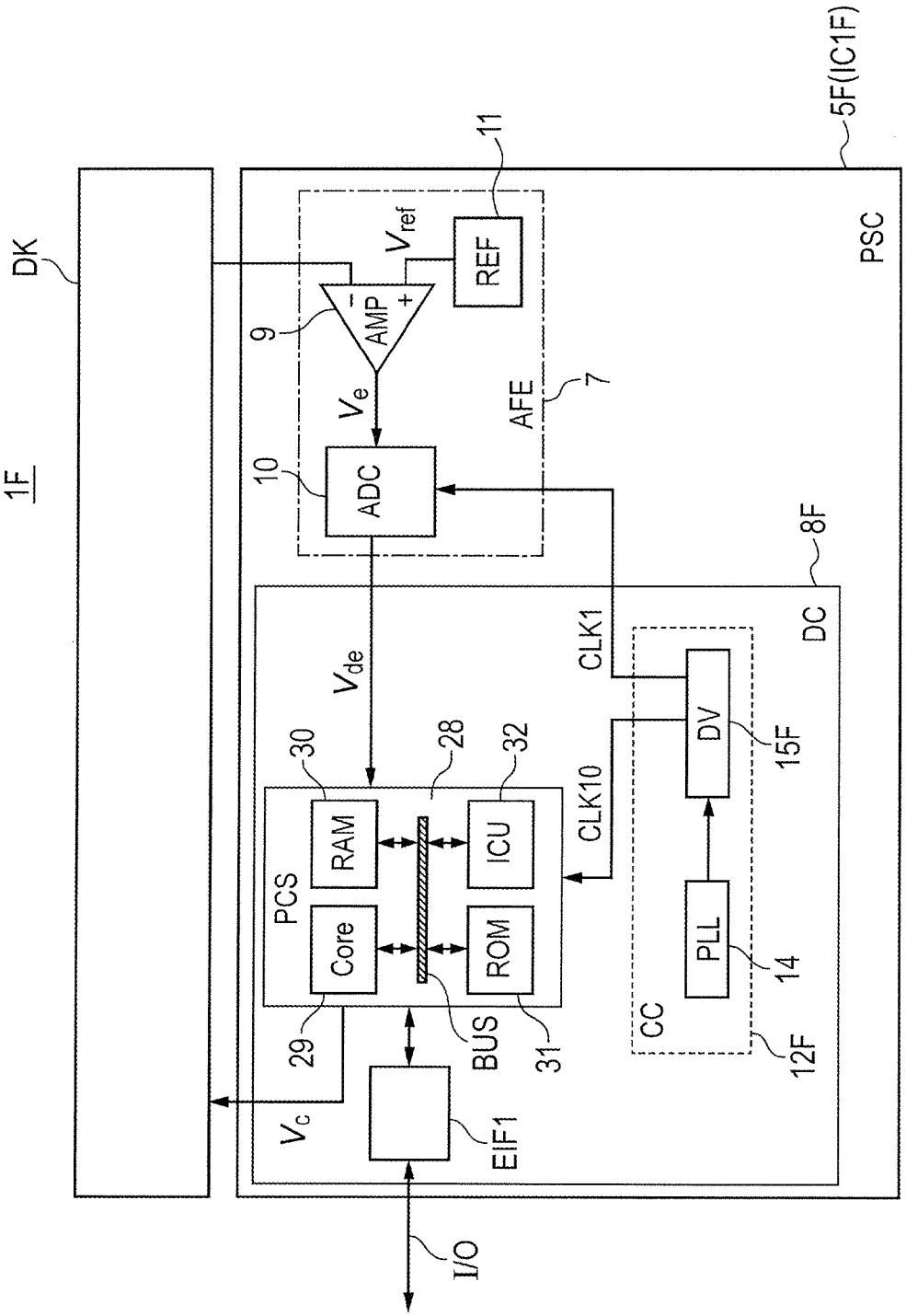
FIG. 21 is a configuration diagram of a power supply device according to a fifth embodiment.
Figure 22:
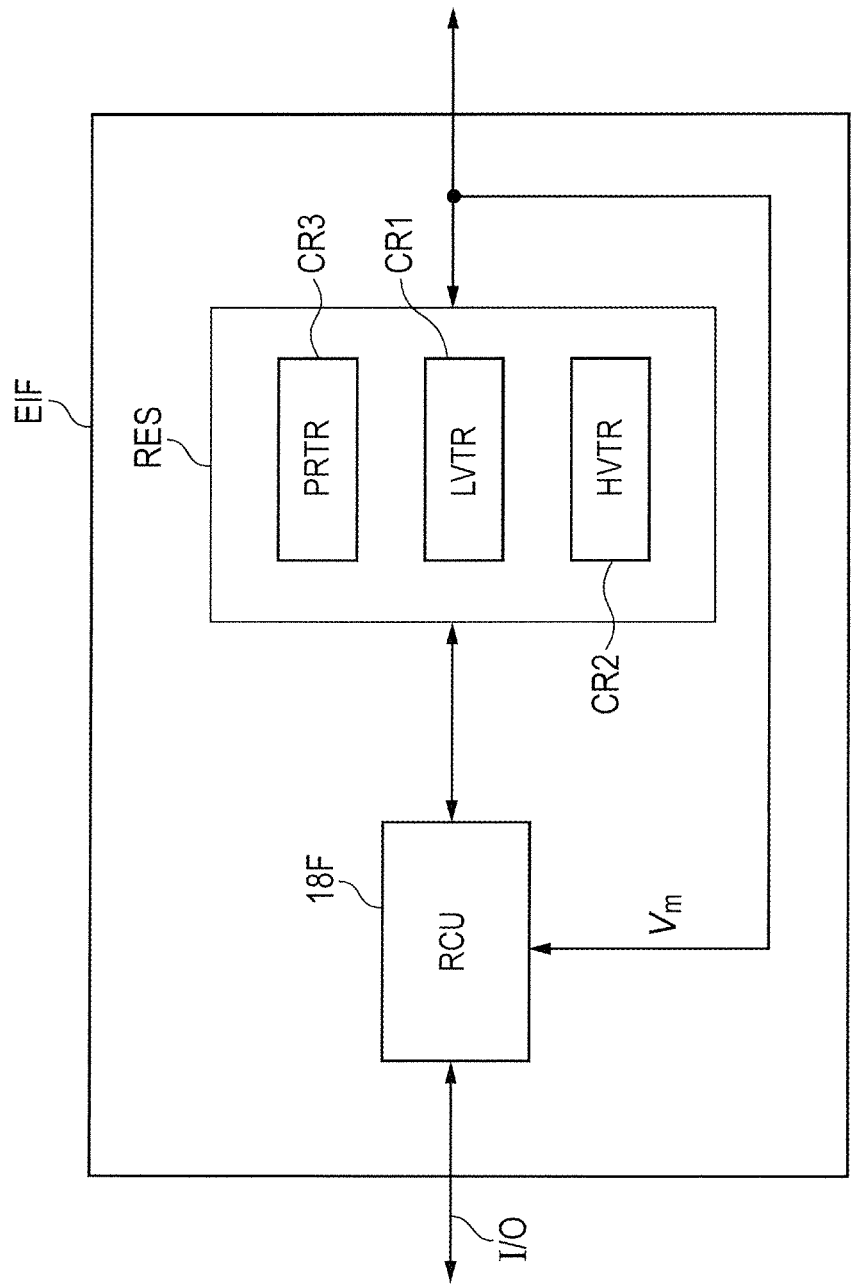
FIG. 22 is a block diagram of an external interface circuit according to the fifth embodiment.

FIG. 21 is a configuration diagram of a power supply device according to a fifth embodiment. FIG. 22 is a block diagram of an external interface circuit. A power supply device 1F is similar to the power supply device 1 of the first embodiment except for the digital controller 8 of the power supply device 1 of the first embodiment. In a manner similar to the first example of the first embodiment, a power supply control circuit 5F is formed on a single semiconductor substrate and constructed as a semiconductor integrated circuit device 1C1F. The power supply control circuit 5F may have any of the configurations of the second to sixth examples of the first embodiment. Description of the same parts as those of the first embodiment will not be repeated. A frequency divider 15F of a clock generating circuit 12F is basically similar to that of the first embodiment except that a clock which is output is a clock (CLK10), not the clocks (CLK2 and CLK3).

Although the hysteresis comparator is used in the digital controller in any of the power supply control circuits of the first to fourth embodiments, in the fifth embodiment, a processor (PCS) 28 and an external interface EIF are used in place of the hysteresis comparator. The processor 28 in the power supply control circuit 5F has a processor core (Core) 29, a random access memory (RAM) 30, a nonvolatile memory (ROM) 31, an interrupt controller (ICU) 32, and a bus BUS. The nonvolatile memory 31 is preferably an electrically erasable and programmable memory such as a flash memory.

The processor core 29 is formed by a CPU core or a DSP core. In the nonvolatile memory 31, a program used in the processor core 29 is stored. The random access memory 30 is used as an area temporarily storing various data and a work area of the processor core 29. The interrupt controller 32 outputs an interrupt signal to the processor core 29. To the bus BUS, various control signals and data signals flowing among the processor core 29, the random access memory 30, the nonvolatile memory 31, and the interrupt controller 32 are supplied.

Since the processor 28 has the function of the hysteresis arithmetic unit in any of the first to fourth embodiments, the error signal ($V_{de}$) is supplied to the processor 28, and the processor 28 outputs the control signal ($V_c$) on the basis of the error signal ($V_{de}$). In the case where the power supply control circuit 5F (power supply device 1F) of the embodiment has the function of the power supply control circuit 5E (power supply device 1E) of the fourth embodiment, the processor 28 has the functions of not only the hysteresis arithmetic unit 13E but also the PID arithmetic unit 23, the PWM signal generating unit 24, the low-level circuit 25, the high-level circuit 26, and the selector 27. The processor 28 operates synchronously with the clock (CLK10).

The power supply control circuit 5F (power supply device 1F) of the embodiment can have the function of the power supply device of any of the first to fourth embodiments by properly changing the program stored in the nonvolatile memory 31 to have the function. Obviously the power supply control circuit 5F can have two or more of the functions of the first to fourth embodiments by properly changing the program stored in the nonvolatile memory 31.

As illustrated in FIG. 22, the external interface circuit EIF has a register control unit 18F and a control register group RES. The control register group RES has the control registers CR1, CR2, and CR3. The control registers CR1, CR2, and CR3 are registers which can be rewritten from the outside of the power supply device 1F via the communication line I/O.

Figure 23:
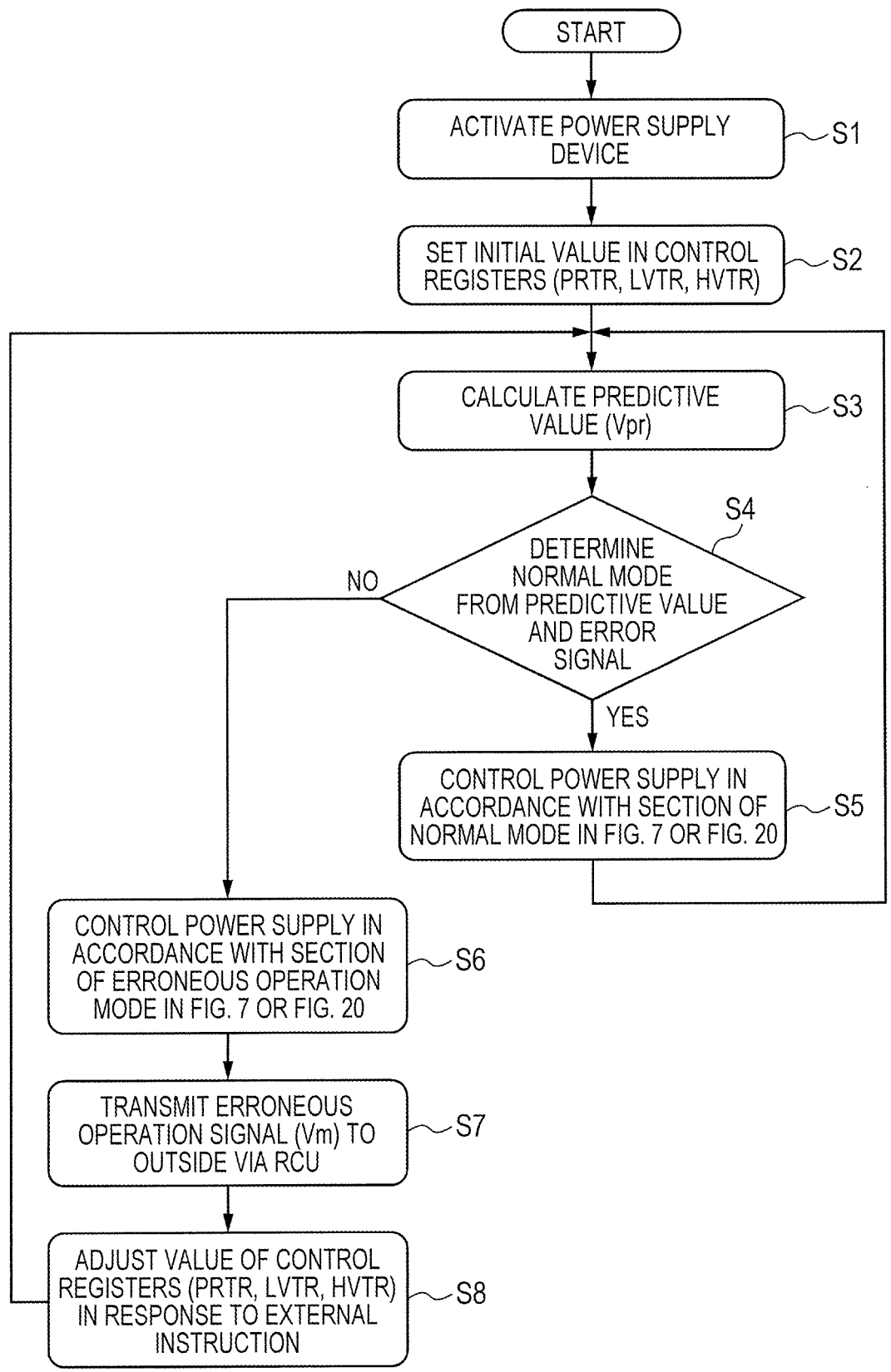
FIG. 23 illustrates the flow of operations of a power supply control circuit and a power supply device according to the fifth embodiment.

FIG. 23 illustrates the flow of operations of the power supply control circuit 5F (power supply device 1F) of the fifth embodiment. The flow of the operations is executed according to the program stored in the nonvolatile memory 31. The power supply device 1F is started (step S1). The external device of the power supply device 1F sets initial values in the control registers (LVTR, HVTR, and PRTR) CR1, CR2, and CR3 (step S2). The processor core 29 stores the data in the control registers CR1, CR2, and CR3 into the register in the processor core 29 or the random access memory 30. The processor 28 obtains the prediction value ($V_{pr}$) by the plurality of error signals ($V_{de}$) derived at different timings (step S3). The prediction value ($V_{pr}$) is obtained by the arithmetic operation method disclosed in any of the first to third embodiments. The processor 28 determines whether the mode is the normal mode or not from the prediction value ($V_{pr}$) and the error signal ($V_{de}$) (step S4). In the case where the normal mode is determined in step S4, according to the part of the normal mode in FIG. 8 or FIG. 20, the control signal ($V_c$) is generated by a comparison result of the prediction value ($V_{pr}$) and the two control thresholds ($V_{th1}$ and $V_{th2}$) and the error signal ($V_{de}$) to control the power supply circuit DK (step S5). After that, the routine returns to step S3. In the case where the error mode is determined in step S4, according to the part of the erroneous operation mode of FIG. 8 or FIG. 20, the control signal ($V_c$) is generated by a comparison result of the prediction value ($V_{pr}$) and the two control thresholds ($V_{th1}$ and $V_{th2}$) and the error signal ($V_{de}$) to control the power supply circuit DK (step S6). Further, the erroneous operation signal ($V_m$) is transmitted to the outside via the register control circuit 18F (step S7). By an external instruction, the value of at least any of the control register (LVTR) CR1, the control register (HVTR) CR2, and the control register (PRTR) CR3 is adjusted (step S8). The routine returns to step S3 and restarts the computation of the prediction value ($V_{pr}$). In the case where the power supply device has the functions of the first to third embodiments, in steps S5 and S6, the control signal ($V_c$) is generated by the comparison result of the prediction value ($V_{pr}$) and the two control thresholds ($V_{th1}$ and $V_{th2}$) and the error signal ($V_{de}$) in accordance with FIG. 8. In the case where the power supply device has the function of the fourth embodiment, in steps S5 and S6, the control signal ($V_c$) is generated by the comparison result of the prediction value ($V_{pr}$) and the two control thresholds ($V_{th1}$ and $V_{th2}$) and the error signal ($V_{de}$) in accordance with FIG. 20. Preferably, the execution timings including the timing of returning from step S5 to step S3 and the timing of returning from step S8 to step S3 are executed by interrupt control. Concretely, an interrupt signal supplied from the interrupt controller 32 to the processor core 29 is generated every cycle of generating the prediction value ($V_{pr}$). A register capable of setting the interrupt cycle from the outside of the power supply device may be provided in the digital controller.

As described above, by designing the power supply control circuit (power supply device) with the configuration and operation described with reference to FIGS. 21 and 22, the prediction operation and the hysteresis control operation can be changed by changing the program in the nonvolatile memory 31. Therefore, the development cost can be reduced, and the development period can be shortened. The operation flow of the power supply control circuit (power supply device) of FIG. 21 is also that of the power supply control circuit (power supply device) of any of the first to fourth embodiments. Obviously, in this case, the processor 28 does not execute the operation flow, but the digital controller executes the operation flow. Further, in this case, the power supply control circuit (power supply device) of any of the first to third embodiments generates the control signal ($V_c$) by the comparison result of the prediction value ($V_{pr}$) and the two control thresholds ($V_{th1}$ and $V_{th2}$) and the error signal ($V_{de}$) in accordance with FIG. 8. In steps S5 and S6, the power supply control circuit (power supply device) of the fourth embodiment generates the control signal ($V_c$) by the comparison result of the prediction value ($V_{pr}$) and the two control thresholds ($V_{th1}$ and $V_{th2}$) and the error signal ($V_{de}$) in accordance with FIG. 20.

In step S2 in the operation flow illustrated in FIG. 23, the external device of the power supply device 1F sets initial values in the control registers CR1, CR2, and CR3. Alternatively, values corresponding to the initial values of the registers CR1, CR2, and CR3 may be pre-stored in the nonvolatile memory 31. That is, the control register group RES may be provided in the nonvolatile memory 31. In this case, the processor core 29 stores the values corresponding to the initial values of the control registers CR1, CR2, and CR3 stored in the nonvolatile memory 31 into the register in the processor core 29 or the random access memory 30.

The erroneous operation signal ($V_m$) is transmitted to the outside via the register control unit 18F in step S7 and the values in the control registers CR1, CR2, and CR3 are adjusted in response to an external instruction in step S8. In the case of determining the erroneous operation mode, the values in the control registers CR1, CR2, and CR3 may be adjusted by the program in the nonvolatile memory 31 without transmitting the erroneous operation signal ($V_m$) to the outside.

Also in the case of preliminarily storing values corresponding to the initial values in the control registers CR1, CR2, and CR3 into the nonvolatile memory 31, by enabling the values in the control registers CR1, CR2, and CR3 to be read and set from the outside, it is useful to verify the operation of the power supply device. Similarly, in the case of determining the erroneous operation mode, also in the mode of adjusting the values of the control registers CR1, CR2, and CR3 by the program in the nonvolatile memory 31, by transmitting the erroneous operation signal ($V_m$) to the outside, it is useful to verify the operation of the power supply device.

Sixth Embodiment

For a power supply device of an electronic device, to supply stable voltage to loads such as a CPU and an SDRAM, a power supply device of a plurality of channels of different output voltages is necessary. When the power supply devices of the first to fifth embodiments are simply prepared for a plurality of channels, the area of the power supply devices becomes large. In a sixth embodiment, therefore, a power supply device for supplying power supply voltage to a plurality of channels without enlarging the area is provided.

Figure 24:
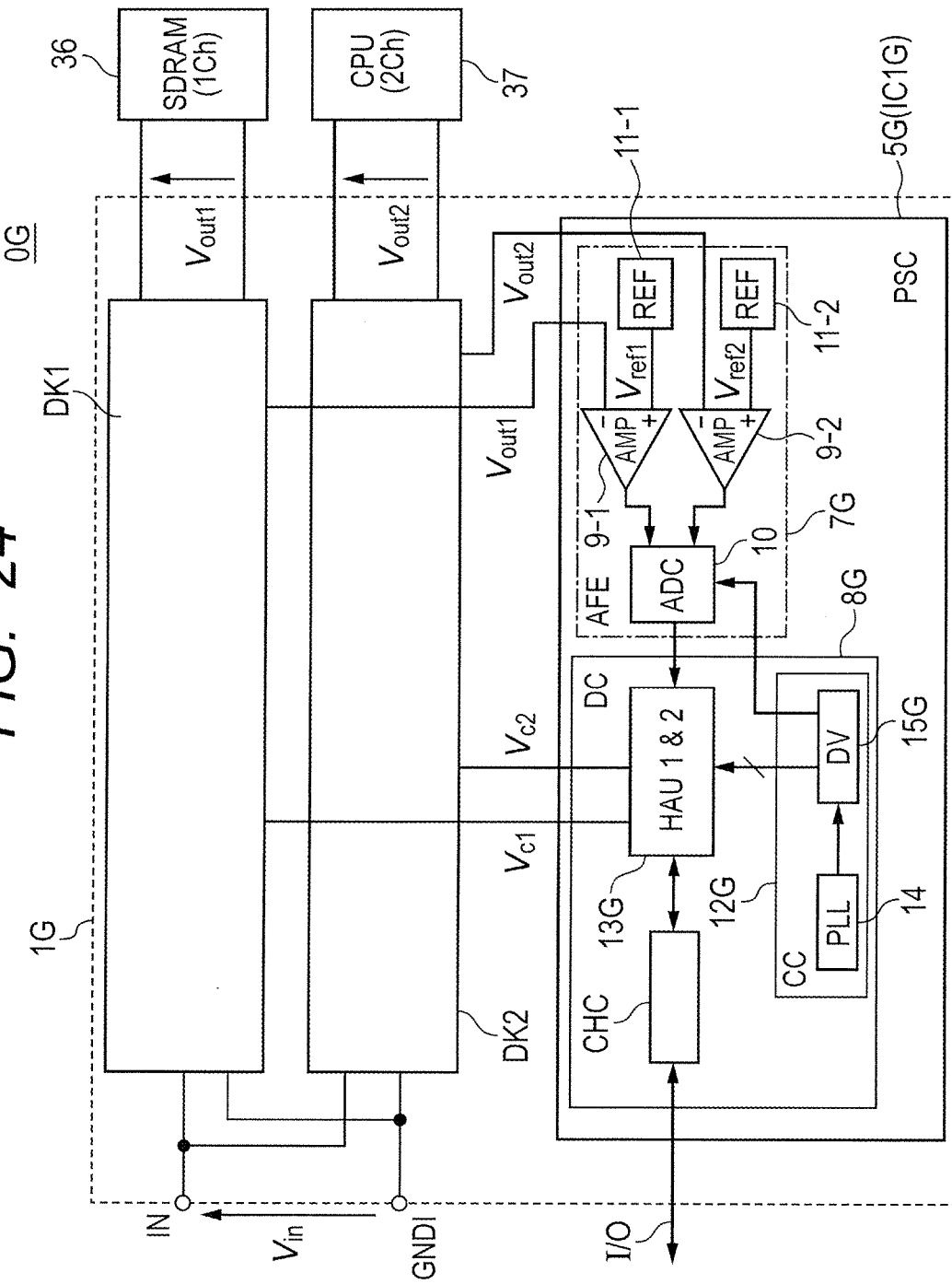
FIG. 24 is a configuration diagram of a power supply device according to a sixth embodiment.
Figure 25:
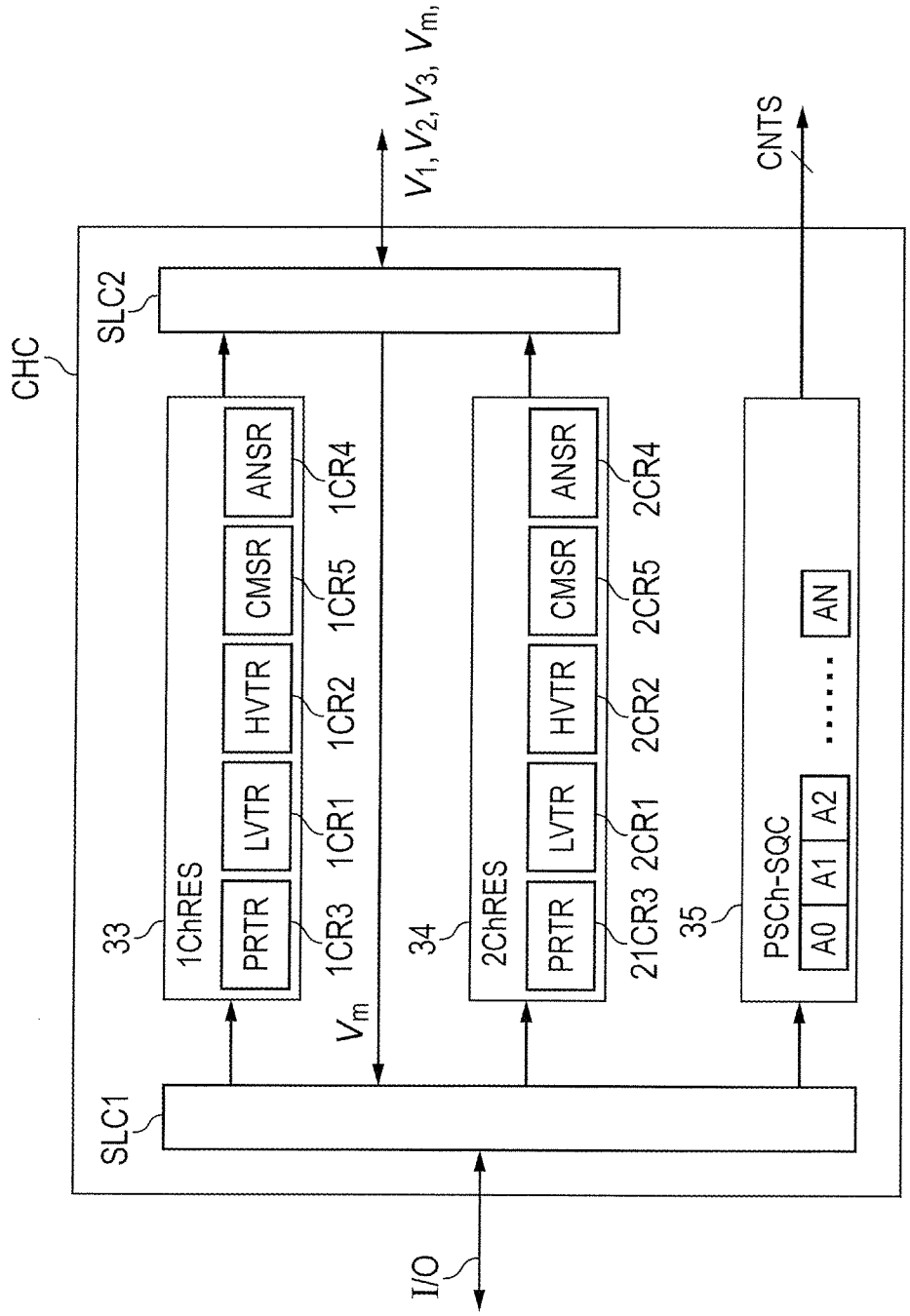
FIG. 25 is a block diagram of a channel control circuit according to the sixth embodiment.
Figure 26:
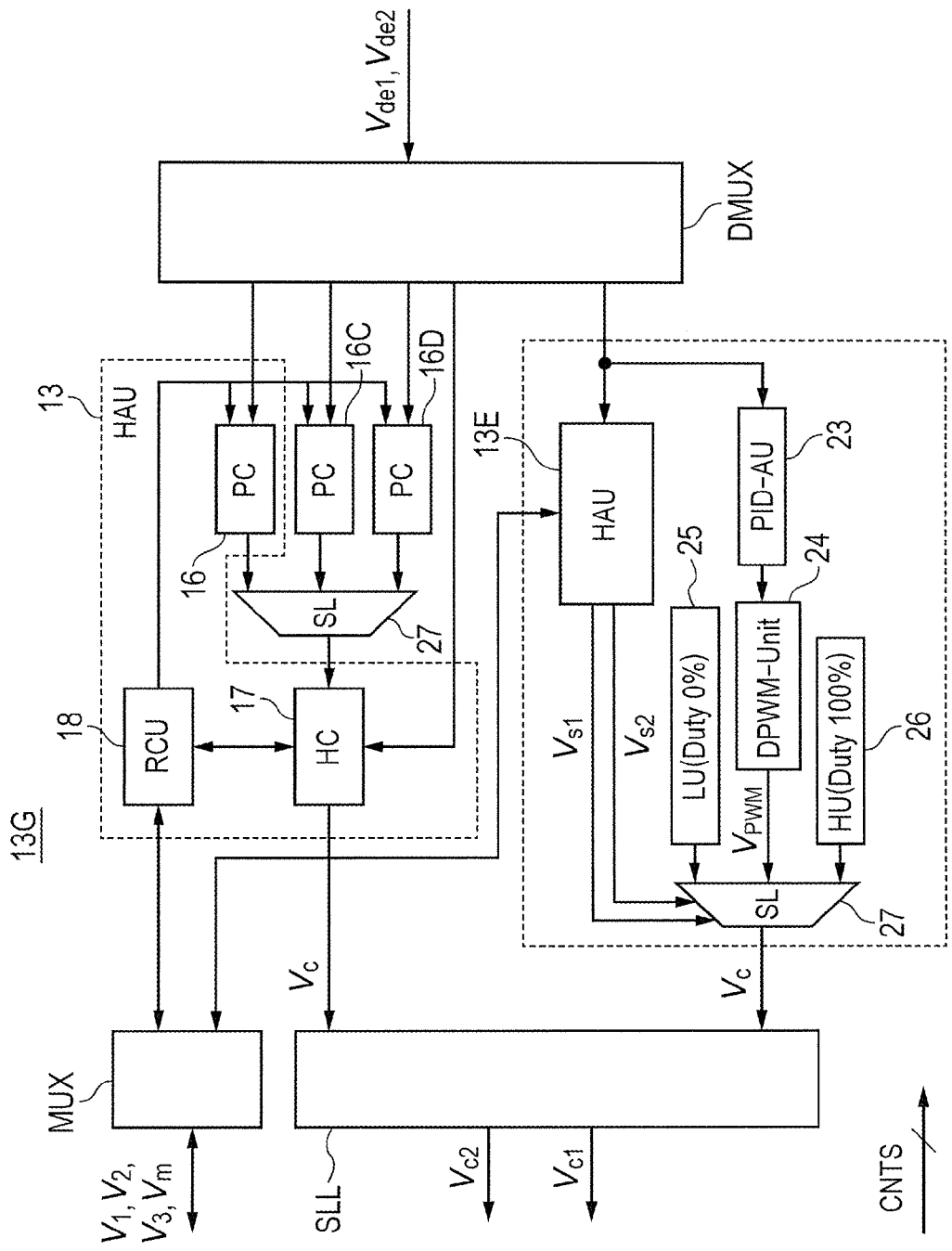
FIG. 26 is a block diagram of a hysteresis arithmetic unit according to the sixth embodiment.

FIG. 24 is a configuration diagram of a power supply device according to a sixth embodiment and an electronic device using the same. FIG. 25 is a block diagram of a channel control circuit. FIG. 26 is a block diagram of a hysteresis arithmetic unit. A power supply device 1G has power supply circuits DK1 and DK2 and the power supply control circuit 5G. An electronic device 0G has the power supply device 1G, an SDRAM 36, and a CPU 37. Components to which the same reference numerals as those of the first embodiment are basically the same ones. There are numerals to which 1 or 2 is added at the end of the same reference numerals as those of the first embodiment for the following meaning.

(1) In the sixth embodiment, each of components having the same reference numerals as those of the first embodiment and to which 1 or 2 is added at the end corresponds to the component having the same reference numerals of the first embodiment and basically has the same configuration.

(2) In the sixth embodiment, each of components having the same reference numerals as those of the first embodiment and to which 1 is added at the end is a component for supplying power supply voltage to the SDRAM 36 as a load.

(3) In the sixth embodiment, each of components having the same reference numerals as those of the first embodiment and to which 2 is added at the end is a component for supplying power supply voltage to the CPU 37 as a load.

As an example, the power supply circuit DK1 is the same component as that in the first embodiment is for the SDRAM. In the embodiment, the SDRAM 36 is set as channel 1 (1Ch), and the CPU 37 is set as channel 2 (2Ch).

The power supply control circuit 5G has a channel control circuit CHC and a hysteresis arithmetic unit (HAU1&2) 13G for plural channels, which are provided in a digital controller 8G. The power supply control circuit 5G also has an analog front-end circuit 7G. The analog front-end circuit 7G has the AD converter 10, two differential amplifiers 9-1 and 9-2, and two target voltage setting circuits 11-1 and 11-2. The two differential amplifiers 9-1 and 9-2 are the same ones. When the output voltages ($V_{out1}$ and $V_{out2}$) are different, accordingly target voltages which are set in the two target voltage setting circuits 11-1 and 11-2 vary. A circuit having the power supply circuits DK1 and DK2, the differential amplifiers 9-1 and 9-2, and the target voltage setting circuits 11-1 and 11-2 is also called a power supply circuit. A circuit having the differential amplifiers 9-1 and 9-2 and the target voltage setting circuits 11-1 and 11-2 is also called an error voltage detecting circuit. The differential amplifiers 9-1 and 9-2 are also called differential output circuits.

As illustrated in FIG. 25, the channel control circuit CHC has a register (1ChRES) 33 for channel 1, a register (2ChRES) 34 for channel 2, a power supply channel sequencer (PSCh-SQC) 35, and switching circuits SLC1 and SLC2. In a manner similar to the first example of the first embodiment, the power supply control circuit 5G is formed on a single semiconductor substrate and constructed as a semiconductor integrated circuit device IC1G. The second to six examples of the first embodiment may be also employed.

Values set in the register 33 for channel 1, the register 34 for channel 2, and the power supply channel sequencer 35 can be set by an external device of the power supply device 1G. As illustrated in FIG. 25, the register 33 for channel 1 has five control registers 1CR1, 1CR2, 1CR3, 1CR4, and 1CR5, and the register 34 for channel 2 also has five control registers 2CR1, 2CR2, 2CR3, 2CR4, and 2CR5. The control registers 1CR1, 1CR2, and 1CR3 correspond to the control registers CR1, CR2, and CR3 of the first embodiment, respectively. The values in the control registers 1CR1, 1CR2, and 1CR3 are stored in the control registers CR1, CR2, and CR3 in the hysteretic arithmetic unit 13G for plural channels by register update signals ($V_1$, $V_2$, and $V_3$), respectively. The control registers 2CR1, 2CR2, and 2CR3 correspond to the control registers CR1, CR2, and CR3 of the first embodiment, respectively. The values in the control registers 2CR1, 2CR2, and 2CR3 are stored in the control registers CR1, CR2, and CR3 in the hysteretic arithmetic unit 13G for plural channels by the register update signals ($V_1$, $V_2$, and $V_3$), respectively. The register 33 for channel 1 is a component for supplying the output voltage ($V_{out1}$) to the SDRAM as a load of the channel 1. Similarly, the register 34 for channel 2 is a component for supplying the output voltage ($V_{out2}$) to the CPU as a load of the channel 1.

The AD converter 10 and the clock generator are used for both the channels 1 and 2. The hysteretic arithmetic unit 13G for plural channels is used for both the channels 1 and 2. As illustrated in FIG. 26, further, the hysteresis arithmetic unit 13G for plural channels has the hysteresis arithmetic unit 13 of the first embodiment, the prediction controller 16C of the second embodiment, and the prediction controller 16D of the third embodiment. The hysteresis arithmetic unit 13E, the PID arithmetic unit 23, the PWM signal generating unit 24, the low-level unit 25, the high-level unit 26, and the selector 27 in the fourth embodiment are also disposed. According to the modes which are set in the control mode setting registers (CMSR) 1CR5 and 2CR5, the hysteresis arithmetic unit 13G for plural channels sets components to be used in the above-described components and input/output relations of signals transmitted among the components used. The signal input/output relations and the coupling relations are as illustrated in FIG. 26.

FIG. 27 is a diagram illustrating settings of the control mode setting registers 1CR5 and 2CR5. 0 to 5 in the vertical axis indicate the values of the registers which can be set, and CMS1 to CMS4 in the horizontal axis express usable functions. A first control mode (CMS1) relates to computation of the prediction value ($V_{pr}$) and the hysteresis control described in the first embodiment. More concretely, the prediction value ($V_{pr}$) is computed by Equation 1 and the hysteresis control is performed as illustrated in FIG. 8. A second control mode (CMS2) relates to computation of the prediction value ($V_{pr}$) and the hysteresis control described in the second embodiment. More concretely, the prediction value ($V_{pr}$) is computed by Equation 2 and the hysteresis control is performed as illustrated in FIG. 8. A third control mode (CMS3) relates to computation of the prediction value ($V_{pr}$) and the hysteresis control described in the third embodiment. More concretely, the prediction value ($V_{pr}$) is computed by Equation 3 and the hysteresis control is performed as illustrated in FIG. 8. A fourth control mode (CMS4) relates to computation of the prediction value ($V_{pr}$) and the hysteresis control described in the fourth embodiment. More concretely, the prediction value ($V_{pr}$) is computed by any of Equations 1 to 3 and the hysteresis control is performed as illustrated in FIG. 20.

Each of the circles in FIG. 27 expresses that a corresponding function on the horizontal axis is usable at a corresponding set value on the vertical axis. As an example, when the register value of the control mode setting register 1CR5 for channel 1 is 2, CMS2 is usable.

Therefore, a usable function is determined according to the register values of the control mode setting registers 1CR5 and 2CR5. On the basis of the usable function, the coupling relations of the components and the signal input/output relations in the hysteresis arithmetic unit 13G are determined. As an example, when the register value of the control mode setting register 1CR5 for channel 1 is 2 and the register value of the control mode setting register 2CR5 for channel 2 is 4, as the signal input/output relations in the hysteresis arithmetic unit 13G for plural channels, the error signals ($V_{de1}$ and $V_{de2}$) are supplied to the hysteresis arithmetic unit 13 of the first embodiment, and the control signals ($V_{c1}$ and $V_{c2}$) are output. The configuration of each of the channels will now be described.

(1) Channel 1

Channel 1 uses the hysteresis arithmetic unit 13 of the first embodiment. The prediction controller 16 in the hysteresis arithmetic unit 13 of the first embodiment is not used but the prediction controller 16C in the second embodiment is used. To the prediction controller 16C of the second embodiment, the error signal ($V_{de1}$), the clocks (CLK2, CLK3, and CLK4), and the register update signal ($V_1$) are input. The prediction value ($V_{pr1}$) is output from the prediction controller 16C of the second embodiment to the hysteresis controller 20.

(2) Channel 2

Channel 2 uses the hysteresis arithmetic unit 13 of the first embodiment. The prediction controller 16 in the hysteresis arithmetic unit 13 of the first embodiment is not used but the prediction controller 16D in the third embodiment is used. To the prediction controller 16D of the third embodiment, the error signal ($V_{de2}$), the clocks (CLK2, CLK3, to CLKX), and the register update signal ($V_3$) are input. The prediction value ($V_{pr2}$) is output from the prediction controller 16D of the third embodiment to the hysteresis controller 17. When CMS3 becomes usable, the averaging number setting registers (ANSR) 1CR4 and 2CR4 are enabled. Concretely, as illustrated in FIG. 27, it is when the register values of the control mode setting registers 1CR5 and 2CR5 are 4 or 5. Obviously, since computation of the averaged prediction values ($V_{pr1}$ and $V_{pr2}$) is executed only when CMS3 is usable, it is unnecessary to enable the averaging number setting registers 1CR4 and 2CR4.

Figures 28A, 28B, 28C:
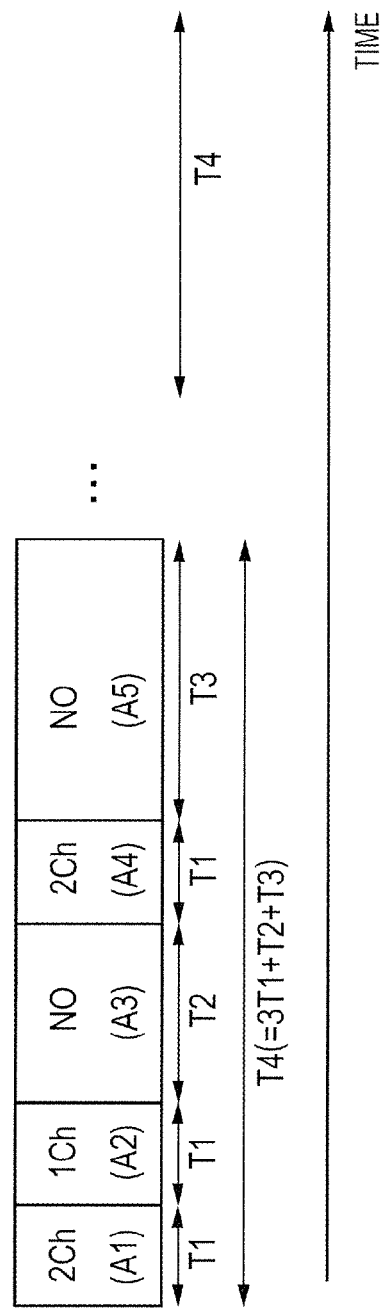
FIG. 28A is a configuration diagram of a power supply channel sequencer and FIGS. 28B and 28C illustrate an example of the operation flow of a power supply device according to setting of the power supply channel sequencer.

FIG. 28A is a configuration diagram of a power supply channel sequencer and FIGS. 28B and 28C illustrate an example of the operation flow of the power supply control circuit 5G (power supply device 1G) according to setting of the power supply channel sequencer.

FIG. 28A is a configuration diagram of a power supply channel sequencer. The power supply channel sequencer 35 has zero-th area (A0), first area (A1), second area (A2), . . . and N-th area (AN). N denotes a natural number. The zero-th area is an area for determining the number of the final area until which the setting is repeated. Each of the first to N-th areas is an area for setting the operation channel and calculation time.

FIGS. 28B and 28C concretely illustrate the operation flow of the power supply control circuit 5G (power supply device 1G) in which the values are set in the power supply channel sequencer 35. A5 (fifth area) is set in the zero-th area (A0), channel 2 and T1 period are set as the operation channel and the calculation time, respectively, in the first area (A1), channel 1 and T1 period are set as the operation channel and the calculation time, respectively, in the second area (A2), and "no operation ("NO")" and T2 period are set as the operation channel and the calculation time, respectively, in the third area (A3). Further, channel 2 and T1 period are set as the operation channel and the calculation time, respectively, in the fourth area (A4), and "no operation (NO)" and T3 period are set as the operation channel and the calculation time, respectively, in the fifth area (A5). No setting is made in the sixth to the N-th areas. Even if some values are set in the sixth to the N-th areas, since the fifth area is set in the zero-th area, no influence is exerted on the operation.

As illustrated in FIG. 28C, first, since channel 2 and T1 period are set in the first area (A1), control on the power supply circuits is performed in the channel 2 only for the period T1. In the channel 2, the prediction value ($V_{pr2}$) is calculated, the hysteresis control is performed, and the control signal ($V_{c2}$) is output to the power supply circuit DK2. At this time, the register value which is set in the register 34 for channel 2 is used. More concretely, the values in the control registers 2CR1, 2CR2, and 2CR3 and the control mode register 2CR5 are used. As necessary, the value of the averaging number setting register 2CR4 is also used. In the case of using the value in the register 34 for 2 channel, it is sufficient to employ a method of writing the values in the registers 2CR1, 2CR2, and 2CR3 to registers CR1, CR2, and CR3 in the hysteresis arithmetic unit 13G for plural channels. As another method, the hysteresis arithmetic unit 13G for plural channels may have both the register 33 for channel 1 and the register 34 for channel 2. In the case of using the value of the register 34 for channel 2, by enabling the registers in the register 34 for channel 2 and disabling the registers in the register 33 for channel 1, the hysteresis arithmetic unit 13G for plural channels may use the value of the register 33 for channel 1.

Subsequently, since channel 1 and T1 period are set in the second area (A2), control on the power supply circuits is performed in the channel 2 only for the period T1. In the channel 1, the prediction value ($V_{pr1}$) is calculated, the hysteresis control is performed, and the control signal ($V_{c1}$) is output to the power supply circuit DK1. At this time, the register value which is set in the register 33 for channel 1 is used. Therefore, the values in the control registers CR1, CR2, and CR3 used in the hysteresis arithmetic unit 13G for plural channels are updated to values for the channel 1.

Since "NO" (no operation) and T2 period are set in the third area (A3), the arithmetic operation for the control on the power supply circuits is not updated only for the period T2. Therefore, the control signals ($V_{c1}$ and $V_{c2}$) to be output to the two power supply circuits DK1 and DK2 are not updated.

Subsequently, since channel 2 and T1 period are set in the fourth area (A4), control on the power supply circuits is performed in the channel 2 only for the period T1. In the channel 2, the prediction value ($V_{pr2}$) is calculated, the hysteresis control operation is performed, and the control signal ($V_{c2}$) is output to the power supply circuit DK2. At this time, the register value which is set in the register 34 for channel 2 is used. Therefore, the values in the control registers CR1, CR2, and CR3 used in the hysteresis arithmetic unit 13G for plural channels are updated to values for the channel 2.

Since "NO" (no operation) and T2 period are set in the fifth area (A5), the arithmetic operation for the control on the power supply circuits is not updated only for the period T2. Therefore, the control signals ($V_{c1}$ and $V_{c2}$) to be output to the two power supply circuits DK1 and DK2 are not updated. Since A5 (fifth area) is set in the zero-th area, the controls in the channels are repeated in the above-described order in accordance with the values set in the first to fifth areas. In this case, T4=3×T1+T2+T3. Therefore, the controls in the channels are executed in the above-described order every T4 period.

With respect to the operation of the AD converter 10, the simplest method is to alternately repeat process of AD converting the error voltage ($V_{de1}$) from the differential amplifier 9-1 and process of AD converting the error voltage ($V_{de2}$) from the differential amplifier 9-2. In this case, however, a part of unused results of the AD converting processes is discarded, and the problem from the viewpoint of power consumption is big. Therefore, whether the AD converting process is performed or not may be set according to the set value in the power supply channel sequencer 35. More concretely, in the case of the set values as illustrated in FIG. 28B, in a period corresponding to the first area, the process of AD converting the error voltage ($V_{de2}$) from the differential amplifier 9-2 is performed. Similarly, in a period corresponding to the second area, the process of AD converting the error voltage ($V_{de1}$) from the differential amplifier 9-1 is performed. In a period corresponding to the third area, the AD converting process is not performed. In a period corresponding to the fourth area, the process of AD converting the error voltage ($V_{de2}$) from the differential amplifier 9-2 is performed. In a period corresponding to the fifth area, the AD converting process is not performed. After that, the method of repeating the above-described processes may be employed.

In the embodiment, the hysteresis arithmetic unit 13G for plural channels and the AD converter 10 are commonly used in the channels, so that the area of the power supply control circuit 5G and the power supply device 1G is entirely reduced. Further, the register 33 for channel 1 and the register 34 for channel 2 are provided. The register 33 for channel 1 has the control register 1CR1, the register 1CR2, the control register 1CR3, the channel control mode setting register 1CR5, and the averaging number setting register 1CR4. The register 34 for channel 2 has the control registers 2CR1, the register 2CR2, the control register 2CR3, the channel control mode setting register 2CR5, and the averaging number setting register 2CR4. Therefore, according to the loads in the channels, the register values in the control registers 1CR1 and 2CR1, the control registers 1CR2 and 2CR2, the control register 1CR3 and 2CR3, the control mode setting registers 1CR5 and 2CR5, and the averaging number setting registers 1CR4 and 2CR4 can be set. The register values in the registers 33 and 34 for the channels are used to control the corresponding channels. Therefore, an external device of the power supply device 1G does not have to update the register values each time the channel to be controlled is changed. In the case of repeating the control in the channel 1 and the control in the channel 2, when there is no registers for channels, the operation is performed as follows. At the time of control in the channel 1, the values in the control registers CR1, CR2, and CR3 corresponding to the channel 1 are set. At the time of control in the channel 2, the values in the control registers CR1, CR2, and CR3 corresponding to the channel 2 have to be set. Such a manner is unrealistic. The set values in the registers 3 and 4 for the channels are reflected in the power supply device 1G, thereby controlling the channels. Therefore, when the values are set in the power supply channel sequencer 35 first, the external device of the power supply device 1G does not have to instruct a sequence of changing the channel to be controlled while performing time control. More concretely, it becomes unnecessary for an external device to instruct the power supply device 1G to perform time control such that the control on the channel 1 is performed from the timing A to the timing B, the control on the channel 2 is performed from the timing B to the timing C, and the control on the channel 1 is performed from the timing C to the timing D.

Although the number of channels to be controlled is two in the embodiment, obviously, it may be three or larger. Further, the hysteresis arithmetic unit 13G for plural channels is realized by any one or combination of the functions of the first to fourth embodiments. In this case, a corresponding circuit has to be prepared, so that the scale of the hysteresis arithmetic unit 13G for plural channels becomes larger. Therefore, a method of using any one of the functions in the first to fourth embodiments and eliminating the control mode setting registers 1CR5 and 2CR5 may be employed.

Further, while performing the control using the prediction values ($V_{pr1}$ and $V_{pr2}$), the hysteresis arithmetic unit 13 for plural channels and the AD converter 10 are commonly used in the channels. Therefore, by the existence of prediction periods ($T_{pr1}$ and $T_{pr2}$) used for calculating the prediction values ($V_{pr1}$ and $V_{pr2}$), deterioration in response caused by performing the control calculation for the channels in a time division manner can be prevented. Particularly, by properly setting the prediction periods ($T_{pr1}$ and $T_{pr2}$), deterioration in response caused by performing the control calculation for channels can be prevented.

In the embodiment, deterioration in response can be prevented more effectively under the following conditions.

Prediction period ($T_{pr1}$)≥delay time ($T_{ad1}$) in AD conversion+delay time ($T_{c21}$) by control calculation of prediction arithmetic unit+delay time ($T_{c11}$) by control calculation of hysteresis comparator+calculation cycle of channel 1    (1) Channel 1

In FIG. 28, the calculation cycle of channel 1 is the period (T4).

Prediction period ($T_{pr2}$)≥delay time ($T_{ad2}$) in AD conversion+delay time ($T_{c22}$) by control calculation of prediction arithmetic unit+delay time ($T_{c12}$) by control calculation of hysteresis comparator+calculation cycle of channel 1    (2) Channel 2

In FIG. 28, the calculation cycle of channel 2 is longer one of the period (2T1+T2) and the period (T1+T3).

That is, when the period obtained by adding the calculation cycle of each channel to delay time accompanying the control of the power supply circuit is equal to or less than the prediction period ($T_{pr}$), deterioration in response can be prevented.

In the case of performing control which does not use the prediction value ($V_{pr}$), the control signal ($V_c$) of each channel is not updated while the control calculation of another channel is performed, and deterioration in response is caused due to the period in which the signal is not updated. In the embodiment, such a problem can be prevented.

Further, the hysteresis arithmetic unit 13G for plural channels and the AD converter 10 of each channel are commonly used to perform the control calculation for each channel in time sharing manner. The timings of updating the control signals ($V_{c1}$ and $V_{c2}$) are always deviated among the channels, occurrence of noise accompanying drive of the switching element at the same time in a plurality of channels can be prevented, and noise in the power supply device 1G can be reduced. In the case where noise is desired to be prevented when the hysteresis arithmetic unit 13 for plurality of channels and the AD converter 10 in each of the channels are not commonly used, the timings of updating the control signals ($V_{c1}$ and $V_{c2}$) for the channels have to be deviated, and a device for this purpose is required.

Further, while performing control using the prediction values ($V_{pr1}$ and $V_{pr2}$), the hysteresis arithmetic unit 13G for plural channels and the AD converter 10 of the channels are commonly used, and the control calculation for the channels is performed in time sharing manner. While preventing deterioration in response by performing the control calculation for the channels in time-sharing manner, an effect of reducing noise in the entire power supply device 1G can be also achieved.

Seventh Embodiment

In the power supply device 1G of the seventh embodiment, in a manner similar to the first to fourth embodiments, generation of the prediction values ($V_{pr1}$ and $V_{pr2}$) and hysteresis control are executed by hardware. Therefore, once circuits for executing generation of the prediction values ($V_{pr1}$ and $V_{pr2}$) and hysteresis control calculation are formed as hardware, it becomes difficult to make a change later and update the calculations. It is likely to result in increase in development cost and development delay. In the seventh embodiment, to enable calculation of generating the prediction values ($V_{pr1}$ and $V_{pr2}$) and hysteresis control calculation to be flexibly changed and to reduce the development cost and development delay, a processor is used. A plurality of channels has to be controlled by the processor. To make the control easily performed, interrupt control and a sequencer are used.

Figure 29:
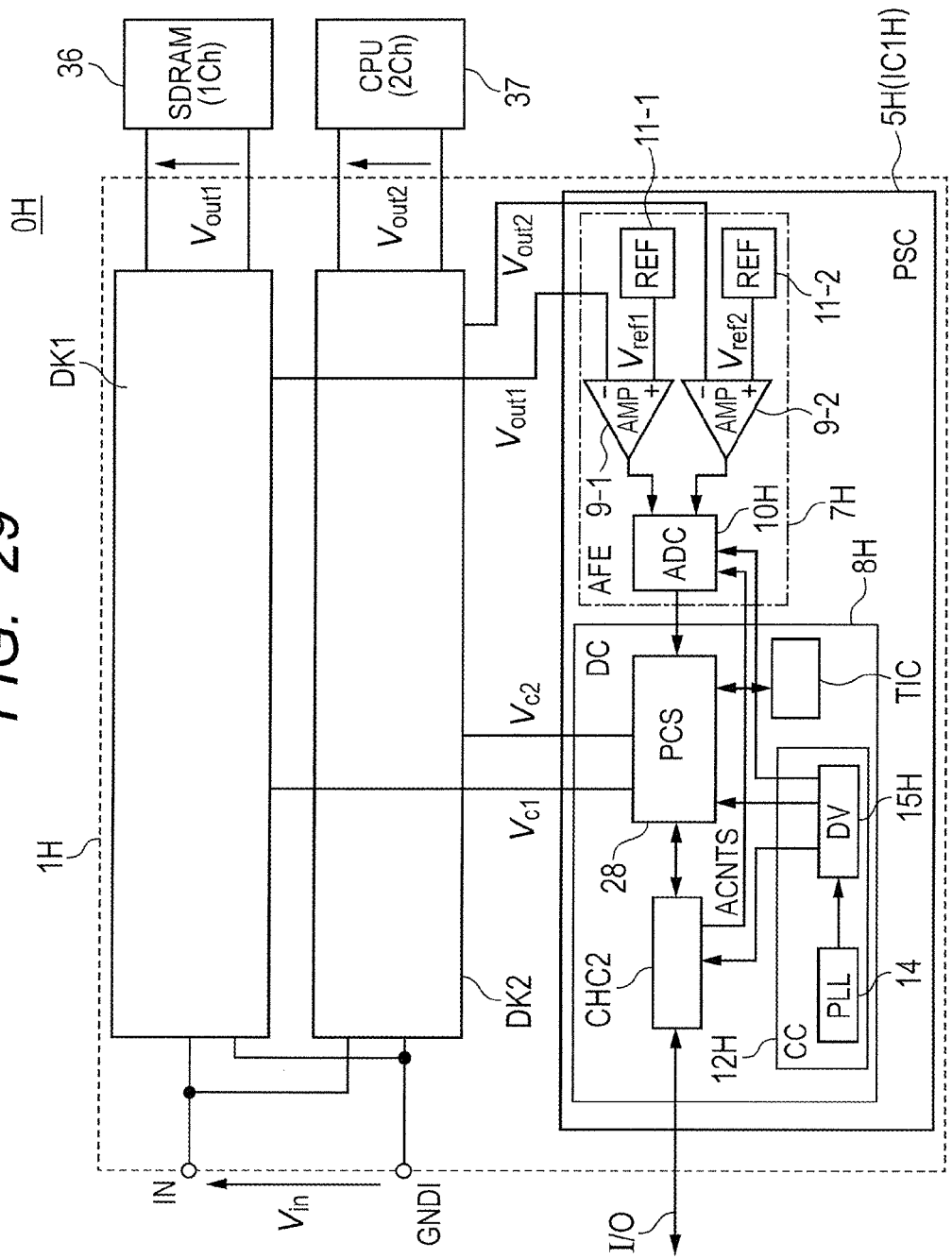
FIG. 29 is a configuration diagram of a power supply device according to a seventh embodiment.
Figure 30:
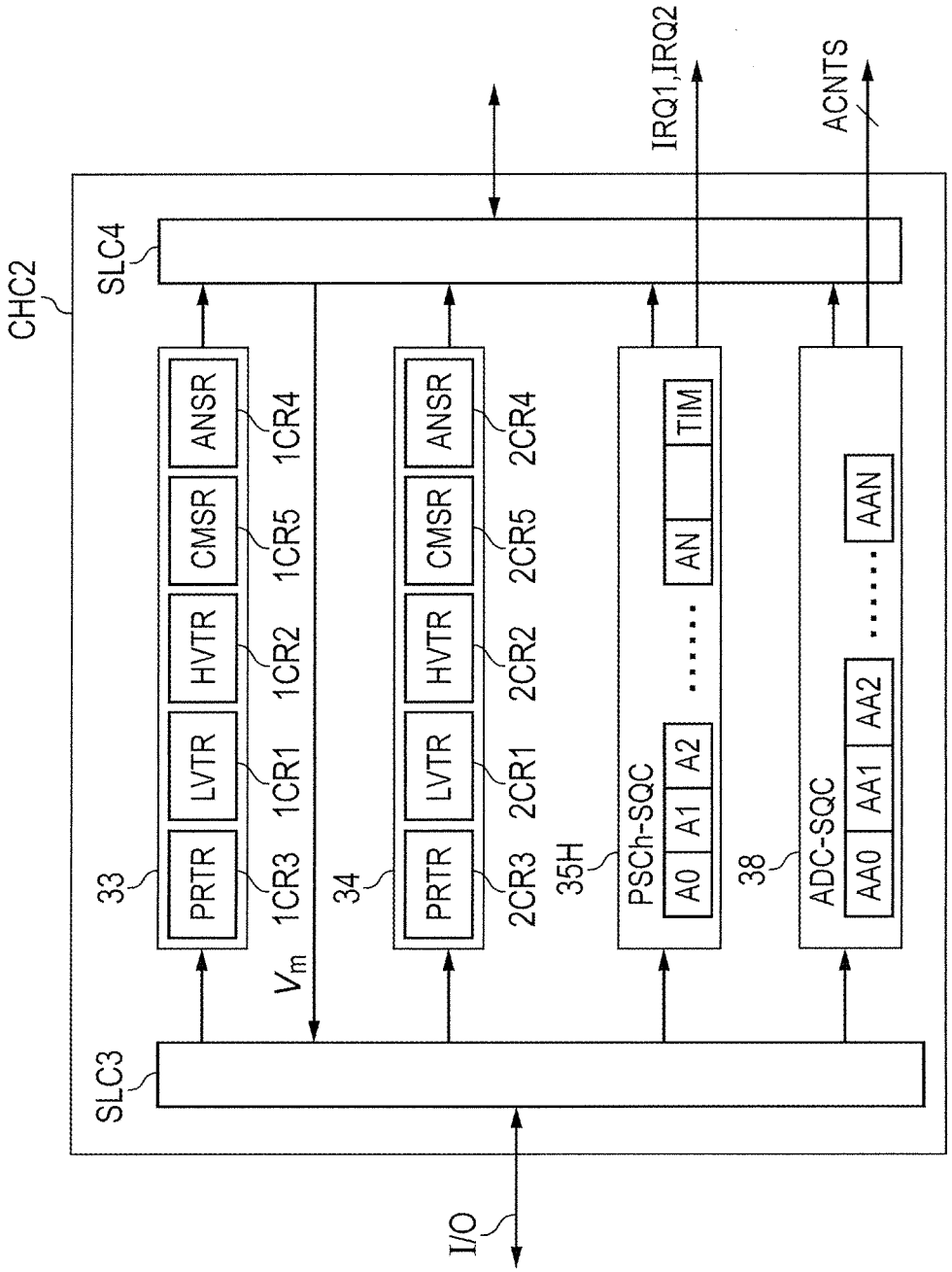
FIG. 30 is a block diagram of a channel control circuit according to the seventh embodiment.

FIG. 29 is a configuration diagram of an electronic device using the power supply device of the embodiment. FIG. 30 is a block diagram of a channel control circuit. A power supply device 1H has the power supply circuits DK1 and DK2 and the power supply control circuit 5G. An electronic device 0H has the power supply device 1H, the SDRAM 36, and the CPU 37. The seventh embodiment is different from the sixth embodiment with respect to the points that the hysteresis arithmetic unit 13G for plurality of channels is changed to the processor 28 and, further, a take-in circuit TIC is provided. As will be described later, the power supply channel sequencer 35 in the channel control circuit CHC of the sixth embodiment is changed to a power supply channel sequencer 35H having different internal configuration. Further, an AD conversion sequencer (ADC-SQC) 38 is provided in the channel control circuit CHC2. The AD conversion sequencer 38 is constructed so that a set value can be set from a device on the outside of the power supply device 1H. The internal configuration of the processor 28 is basically the same as that in the fifth embodiment. A program stored in the nonvolatile memory 31 can execute calculation of the prediction value ($V_{pr}$) and hysteresis control of the first to fourth embodiments and a combination of the calculation and the hysteresis control as illustrated in FIG. 24 and in the description of FIG. 24. The other configuration of the seventh embodiment is similar to the configuration of the sixth embodiment. In a manner similar to the first example of the first embodiment, the power supply control circuit 5H is formed on a single semiconductor substrate and constructed as a semiconductor integrated circuit device IC1G. Alternatively, the configuration of any of the second to sixth examples of the first embodiment may be employed.

FIG. 31 is a diagram illustrating a setting table of the power supply channel sequencer 35H. The horizontal axis indicates a channel to be controlled (drive channel). The vertical axis indicates control calculation cycle of each channel and priority on channels in which the control calculation is executed when the control calculations are to be performed simultaneously. The control calculation is calculation of the prediction value ($V_{pr}$) and the hysteresis control. As an example, as illustrated in FIG. 31, in channel 1 (1Ch), the calculation cycle is T11 and the priority is 1. In channel 2 (2Ch), the calculation cycle is T12 and the priority is 3. In channel 3 (3Ch), the calculation cycle is T13 and the priority is 2. Although only two channels are illustrated in FIGS. 29 and 30, FIG. 31 illustrates an example that there are three channels.

Figure 32:
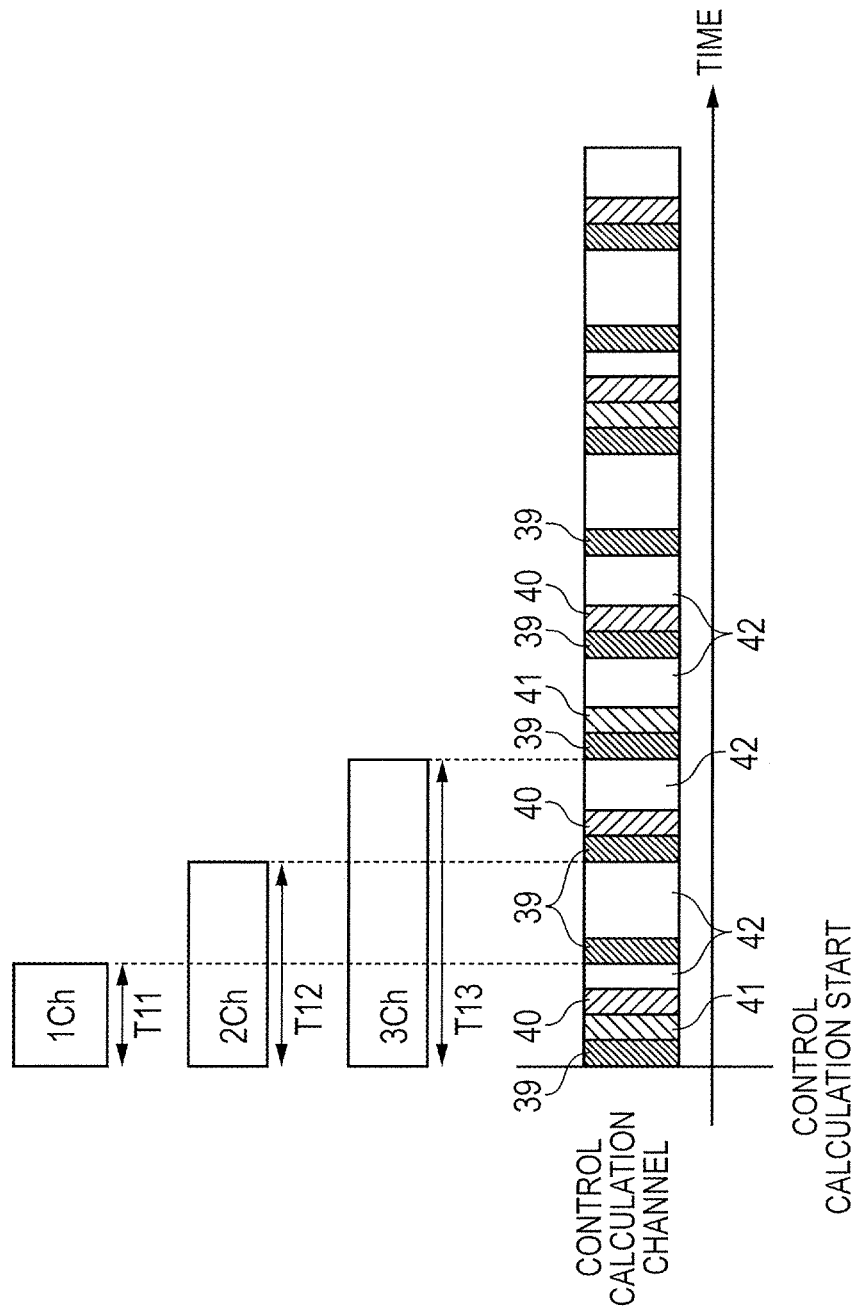
FIG. 32 is a diagram illustrating an example of the control flow of a power supply control circuit and the power supply device according to the seventh embodiment.

FIG. 32 is a diagram illustrating an example of the control flow of the power supply device 1H according to the seventh embodiment. A case of setting conditions as illustrated in FIG. 31 in the power supply channel sequencer 35H will be described. First, the control calculation is executed in all of the channels in descending order of priority. The control calculation is executed first in channel 1 39, second, in channel 3 41 and then, in channel 2 40. After that, NOP (no operation) 42 is performed. It is assumed here that T12=2× T11 and T13=3×T11. After the period T11 since start of the control calculation, the control calculation in channel 1 39 is executed. After that, NOP 42 follows. After the period T12 since start of the control calculation, the control calculation in the channel 1 39 and the channel 2 40 is executed. According to the priority, the control calculation in the channel 1 39 is executed and, then, the control calculation in the channel 2 40 is executed. After that, NOP 42 follows. After the period T13 since start of the control calculation, the control calculation in the channel 1 39 and the channel 3 41 is executed. According to the priority, the control calculation in the channel 1 39 is executed and, then, the control calculation in the channel 3 41 is executed. After that, NOP 42 follows. After the period (T13+T11) since start of the control calculation, the control calculation in the channel 1 39 and the channel 2 40 is executed. According to the priority, the control calculation in the channel 1 39 is executed and, then, the control calculation in the channel 2 40 is executed. After that, NOP 42 follows. After the period (T13+T12) since start of the control calculation, the control calculation in the channel 1 39 is executed. Similarly, the control calculation in the channels is executed according to the control calculation cycle and the priority which are set.

Figure 33:
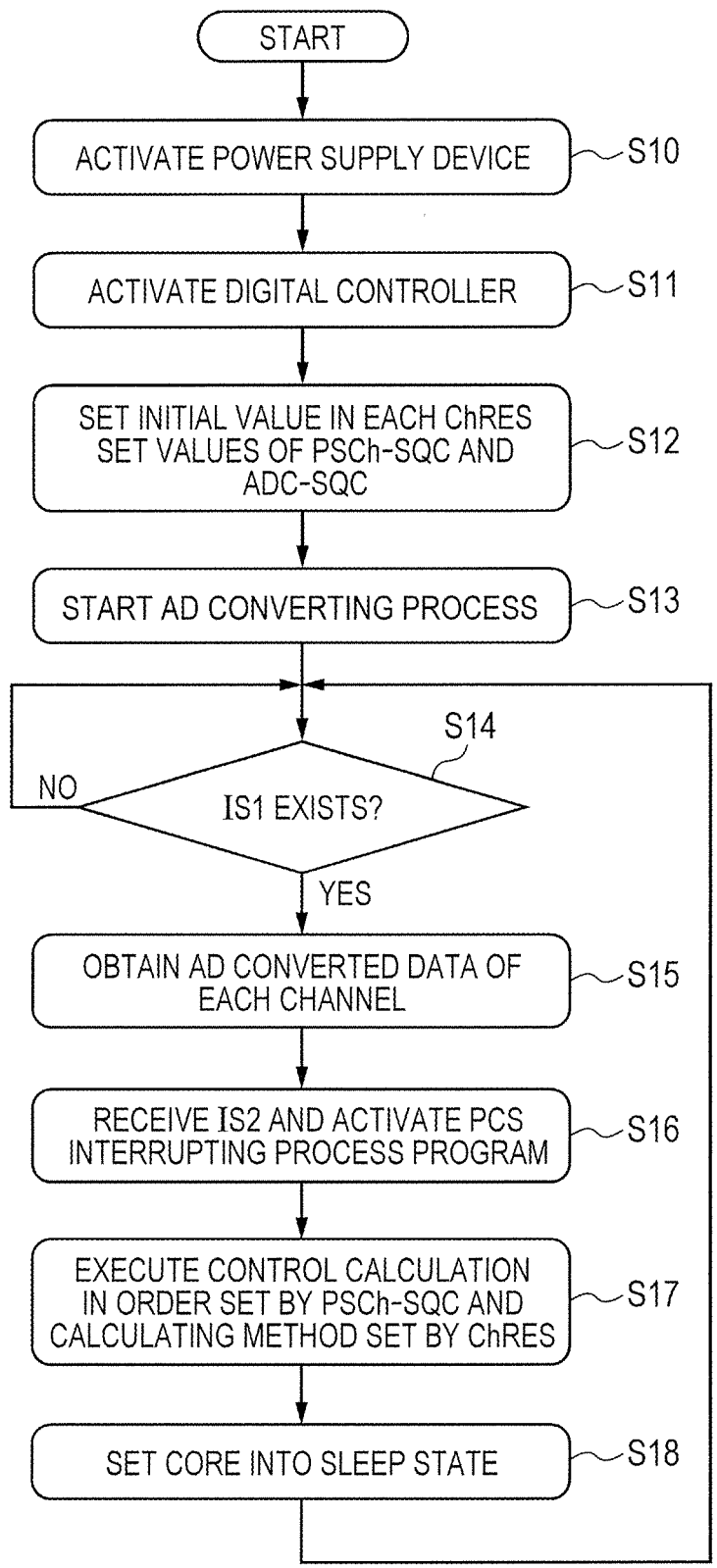
FIG. 33 is a diagram illustrating the operation flowchart of the power supply control circuit and the power supply device according to the seventh embodiment.
Figure 34:
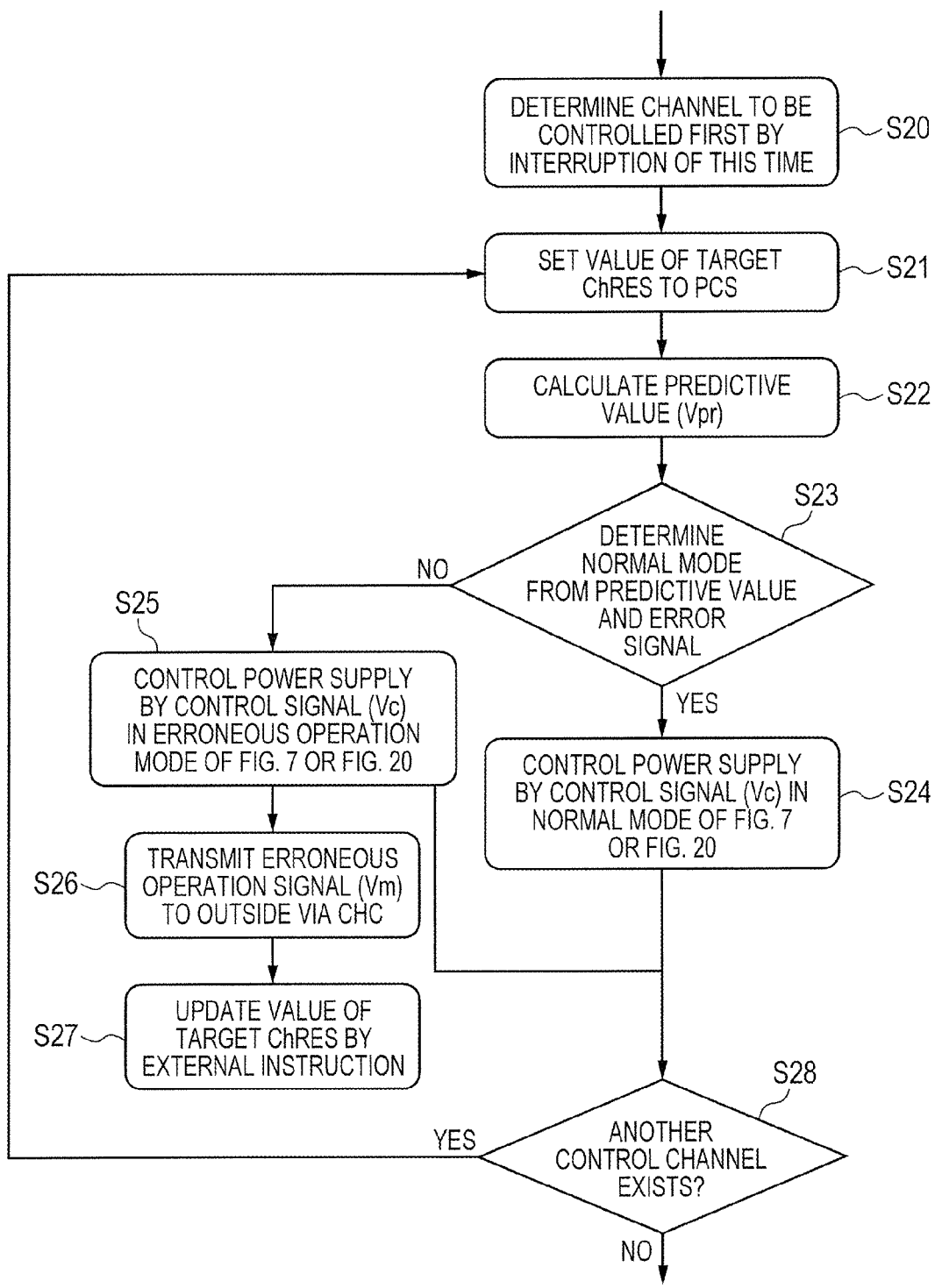
FIG. 34 is a diagram illustrating the operation flowchart of the power supply control circuit and the power supply device according to the seventh embodiment.

FIG. 33 is a diagram illustrating the operation flowchart of the power supply control circuit 5H (the power supply device 1H) of the seventh embodiment. This operation flow is executed according to a program stored in the nonvolatile memory 31. First, the power supply device 1H is started (step S10). Next, the digital controller 8H is started (step S11). Initial values of the registers 33 and 34 for channels, a set value of the power supply channel sequencer 35H, and a set value of the AD converter sequencer 38 are set from a device on the outside of the power supply device 1H via a communication line I/O (step S12). The AD converter 10 starts AD converting process (step S13). Whether a first interrupt signal (IS1) from the interrupt controller 32 is received or not is determined (step S14). The first interrupt signal (IS1) of the interrupt controller 32 is output on the basis of a first interrupt request signal IRQ1 which is output according to the set value in the power supply channel sequencer 35H. The output timing of the first interrupt request signal IRQ1, the priority of the channels, and the number of results of the AD converting process to be taken are determined according to the priority and the calculation cycle set in the power supply channel sequencer 35H in each channel. The calculation cycle is measured by a timer TIM in the power supply channel sequencer 35H. In the case where the first interrupt signal (IS1) is not received in step S14, the routine returns to step S14. In step S14, the processor core 29 repeats execution of the NOP instruction. In the case where the take-in circuit TIC receives the first interrupt signal (IS1) in step 14, the take-in circuit TIC stores an AD conversion result based on the output voltage corresponding to each channel from the AD converter 10 into a not-illustrated internal memory or random access memory 30 in the digital controller 5H (step S15). The processor core 29 receives a second interrupt signal (IS2) and returns from the sleep state to start an interrupting process program of the processor 28 (step S16). The second interrupt signal (IS2) of the interrupt controller 32 is output on the basis of a second interrupt request signal IRQ2 which is output according to the set value in the power supply channel sequencer 35H. The output timing of the second interrupt request signal IRQ2 and the priority of the channels on the control calculation are determined according to the priority and the calculation cycle set in the power supply channel sequencer 35H in each channel. Subsequently, the control calculation is executed according to the priority set in the power supply channel sequencer 35H for each of the channels (step S17). The control calculation is executed on the basis of a control mode (calculating method) according to the values in the registers 33 and 34 corresponding to the respective channels, the first and second control thresholds ($V_{th1}$ and $V_{th2}$), and the prediction period ($T_{pr}$). The details of step S17 will be described in steps S20 to S28 illustrated in FIG. 34. Since the control calculation is finished in step S17, the processor core 29 enters the sleep state (step S18). The sleep state denotes a state where the processor core 29 does not perform operation. When a clock supplied to the processor core 29 is stopped, the power consumption can be reduced. After step S18, the routine returns to step S14.

The operation in step S17 will be described. First, according to the priority and the cycle set in the power supply channel sequencer 35H for each of the channels, a channel to be subject to the control calculation is determined (step S20). Next, the value of the register for the channel to be controlled is set in the processor 28 (step S21). In the case where the processor 28 has all of the registers (1ChRES and 2ChRES) for the channels, it is sufficient to enable the register (1ChRES or 2ChRES) for the channel corresponding to the channel to be controlled and disable the register for the other channel. As another method, the setting may be achieved by writing the value of the register 33 or 34 of the channel corresponding to the channel to be controlled into the register in the processor 28. Subsequently, on the basis of the set value of the register 33 or 34 for the channel, the prediction values ($V_{pr1}$ and $V_{pr2}$) are calculated (step S22).

Next, whether the mode is normal mode or not is determined from the obtained prediction values ($V_{pr1}$ and $V_{pr2}$) and the error signals ($V_{de1}$ and $V_{de2}$) (step S23). In the case where the values correspond to the control calculation in the first to third embodiments, the determination is made on the basis of FIG. 8. In the case where the values correspond to the control calculation in the fourth embodiment, the determination is made on the basis of FIG. 20. When the normal mode is determined in step S23, the routine advances to step S24 where the power supply circuits DK1 and DK2 (power supply device 1H) are controlled by the control signals ($V_{c1}$ and $V_{c2}$) in the normal mode. In the case where the values in the control mode setting register 1CR4 and 2CR4 of the register for channel used correspond to the control calculation in the first to third embodiments, the control is performed on the basis of FIG. 8. In the case where the values correspond to the control calculation in the fourth embodiment, the control is performed on the basis of FIG. 20. The routine advances to step S28.

On the other hand, when the erroneous operation mode is determined in step S23, the routine advances to step S25 where the power supply circuits DK1 and DK2 (power supply device 1H) are controlled by the control signals ($V_{c1}$ and $V_{c2}$) in the erroneous operation mode. In the case where the values in the control mode setting register 1CR4 and 2CR4 of the register for channel used correspond to the control calculation in the first to third embodiments, the control is performed on the basis of FIG. 8. In the case where the values correspond to the control calculation in the fourth embodiment, the control is performed on the basis of FIG. 20. Following step S25, steps S28 and S28 are executed. The reason will be described later. Next, erroneous operation signals ($V_{m1}$ and $V_{n2}$) are transmitted to the outside via the channel control circuit CHC2 (step S26). On the basis of an external instruction from a device on the outside of the power supply device 1H, the value of at least any of the control registers 1CR1 and 2CR1, the control registers 1CR2 and 2CR2, and the control registers 1CR3 and 2CR3 in the register 33 or 34 for the channel used is updated (step S27). According to the priority and the cycle set in the power supply channel sequencer 35H for each of the channels, whether there is another channel to be controlled or not is determined (step S28). In the case where there is a channel to be controlled, the routine returns to step S21. In the case where there is no channel to be controlled, the routine advances to step S18.

In the case where the erroneous operation mode is determined in step S23, the value in the register 33 or 34 for the channel is updated in step S27. The updating timing cannot be controlled by the power supply device 1H for the reason that it depends on speed of reaction since the external device receives the erroneous signals ($V_{m1}$ and $V_{m2}$) until the value is updated and delay time of a signal between the external device and the power supply device 1H. Therefore, after step S25 is executed, steps S26 and S27 are executed. While updating the value in the register 33 or 34 for channel, whether there is another channel to be controlled or not is determined in step S28. In such a manner, a situation that the process of calculating another channel to be controlled is delayed in an uncontrollable state is prevented.

In step S15, the AD conversion result is taken by using the take-in circuit TIC. It becomes unnecessary to start the processor 28 for the process of taking the AD conversion result, so that power consumption can be reduced.

In step S12 in the operation flow illustrated in FIG. 33, a device on the outside of the power supply device 1H sets the initial value in the register 33 or 34 for channel and sets the set values in the power supply channel sequencer (PSCh-SQC) 35H and the AD conversion sequencer (ADC-SQC) 38. Alternatively, values corresponding to the initial values of the registers for channels and values corresponding to the set values in the power supply channel sequencer 35H and the AD conversion sequencer 38 may be preliminarily stored in the nonvolatile memory 31. In this case, the processor core 29 stores the initial values and the set values stored in the nonvolatile memory 31 into the register in the processor core 29 or the random access memory 30.

In step S26, the erroneous operation signals ($V_{m1}$ and $V_{m2}$) are transmitted to the outside via the channel control circuit CHC2. In step S27, the values in the registers 33 and 34 for channels are adjusted by an external instruction. In the case where the erroneous operation mode is determined, without transmitting the erroneous operation signals ($V_{m1}$ and $V_{n2}$) to the outside, the values in the registers 33 and 34 for channels may be adjusted by the program in the nonvolatile memory 31.

In the case where the erroneous operation mode is determined, also in the mode of adjusting the values in the registers 33 and 34 for channels by the program in the nonvolatile memory 31, by transmitting the erroneous operation signals ($V_{m1}$ and $V_{m2}$) to the outside, it is useful to verify the operation of the power supply device.

Figure 35:
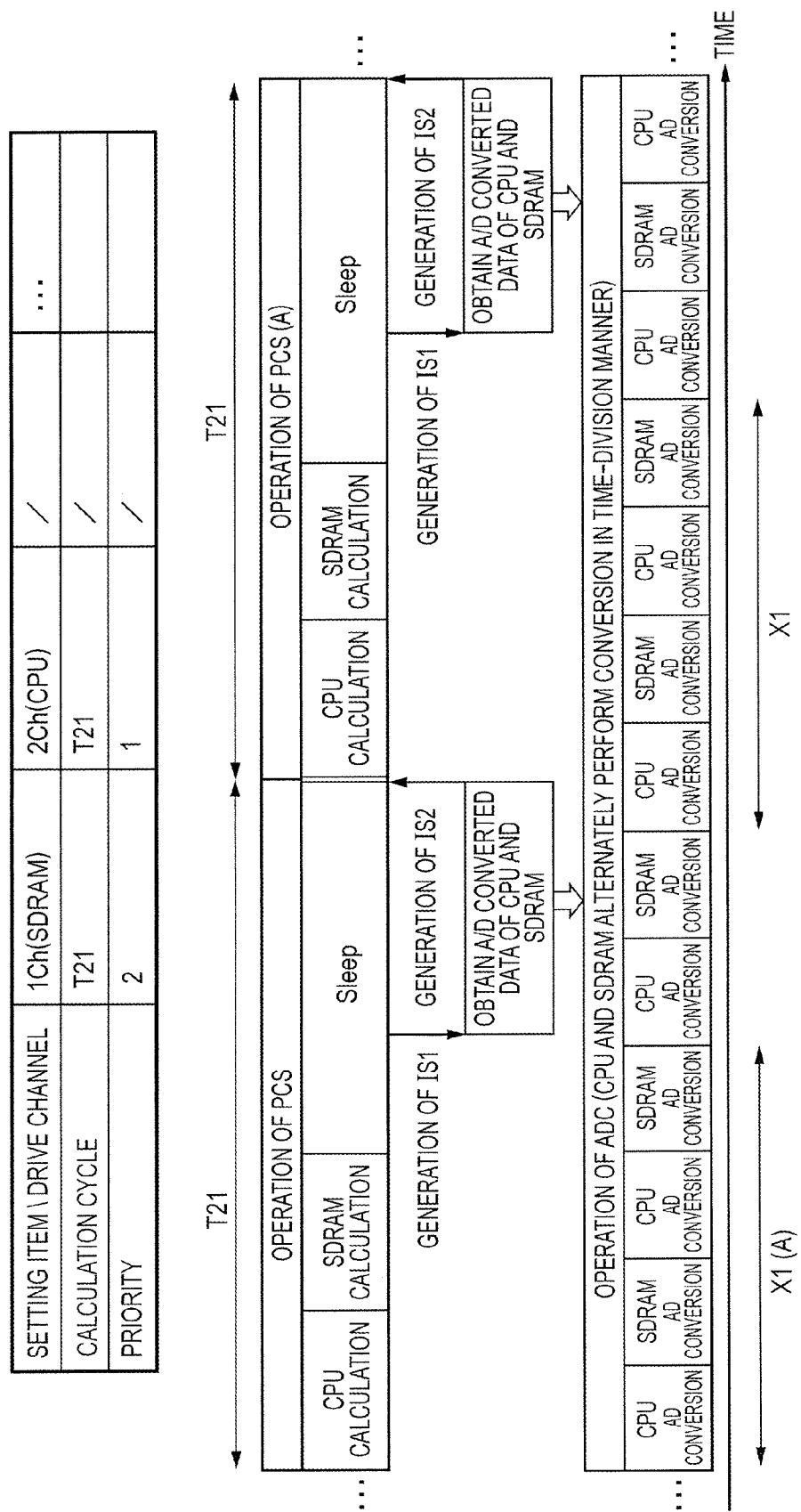
FIG. 35 is a diagram illustrating an example of the relation between control calculation of a processor and AD converting operation.

FIG. 35 is a diagram illustrating an example of the relation between control calculation of the processor 28 and the AD converting operation. It is assumed that, as illustrated in FIG. 35, T21 period as the calculation cycle and 2 as the priority are set in the channel 1 (1Ch) and T21 period as the calculation cycle and 1 as the priority are set in the channel 2 (2Ch). In this case, the processor 28 executes the control calculation for the channel 2, executes the control calculation for the channel 1 and, after that, enters the sleep state. When the first interrupt signal (IS1) is generated from the interrupt controller 32 in accordance with the set value in the power supply channel sequencer 35H in the sleep state, the AD converting process results of the channels 1 and 2 are taken by the take-in circuit TIC. Concretely, "take" means that the take-in circuit TIC stores the AD conversion results based on output voltages corresponding to the channels from the AD converter 10 into a not-illustrated internal memory in the digital controller 5H or the random access memory 30. When the control calculation as in the first embodiment is performed as a method of internal control calculation, AD converting process results in the range (X1) are obtained. Subsequently, a second interrupt signal (IS2) is generated from the interrupt controller 32 in accordance with the set value in the power supply channel sequencer 35H, and the processor 28 executes the control calculation. As illustrated in FIG. 35, AD converting process results in the range (X1) indicated as "A" are used as the error signals ($V_{de1}$ and $V_{de2}$) for the operation of the processor 28.

Figure 36:
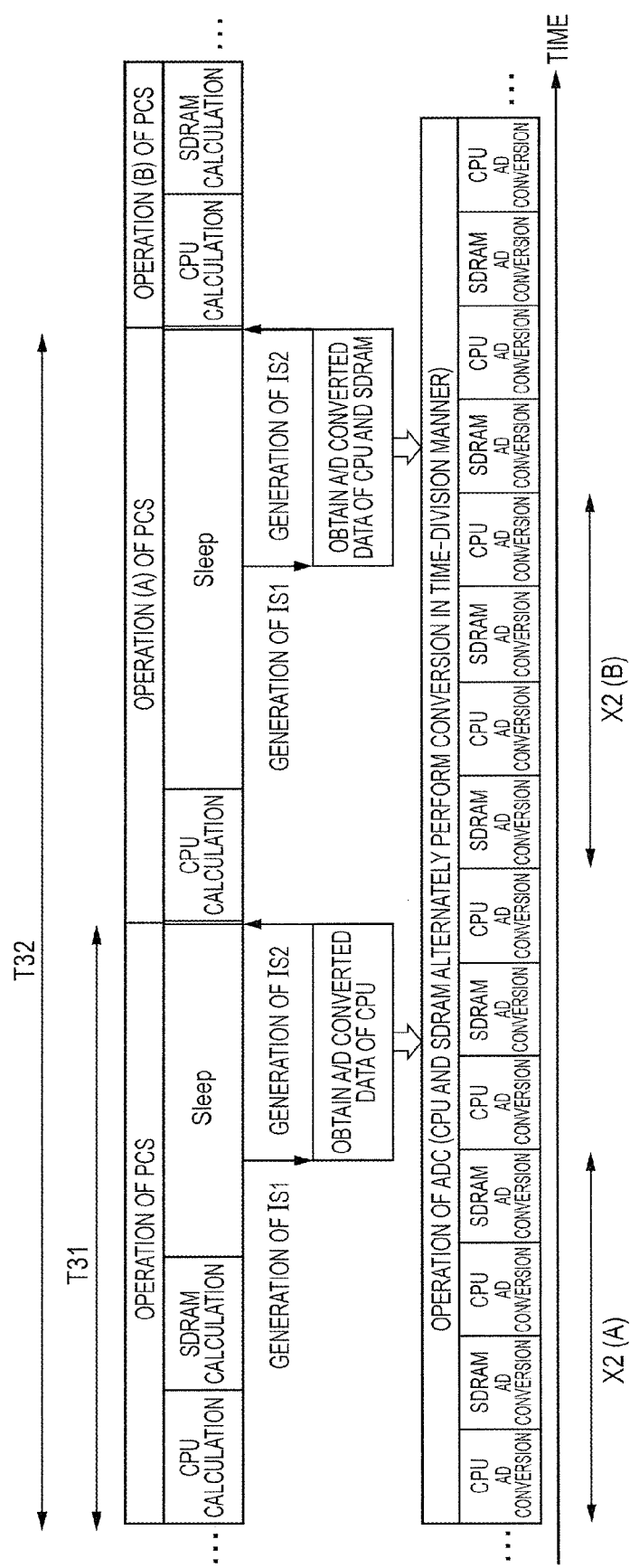
FIG. 36 is a diagram illustrating another example of the relation between the control calculation of the processor and the AD converting operation.

FIG. 36 is a diagram illustrating another example of the relation between the control calculation of the processor and the AD converting operation. As illustrated in FIG. 36, it is assumed that T32 period as the calculation cycle and 2 as the priority are set in the channel 1 (1Ch) and T31 period as the calculation cycle and 1 as the priority are set in the channel 2 (2Ch). Further, there is the relation of T32=2×T31. In this case, the processor 28 executes the control calculation for the channel 2, executes the control calculation for the channel 1 and, after that, enters the sleep state. The first interrupt signal (IS1) is generated from the interrupt controller 32 in accordance with the set value in the power supply channel sequencer 35H in the sleep state, and the AD converting process results of only the channel 1 are obtained. When the control calculation as in the first embodiment is performed as a method of the control calculation, AD converting process results in the range (X2) indicated by (A) are obtained. As illustrated in FIG. 36, AD converting process results in the range (X2) indicated as "A" are used as the error signal ($V_{de2}$) for the operation of the processor 28 indicated as "A". Subsequently, a second interrupt signal (IS2) is generated from the interrupt controller 32 in accordance with the set value in the power supply channel sequencer 35H, and the processor 28 executes the control calculation. The processor 28 executes the control calculation for the channel 2 and then enters the sleep state. When the first interrupt signal (IS1) is generated from the interrupt controller 32 in accordance with the set value in the power supply channel sequencer 35H in the sleep state, the AD converting process results of the channels 1 and 2 are taken by the take-in circuit TIC. As illustrated in FIG. 36, AD converting process results in the range (X2) indicated as "B" are used as the error signals ($V_{de1}$ and $V_{de2}$) for the operation of the processor 28 indicated as "B". Subsequently, the second interrupt signal (IS2) is generated from the interrupt controller 32 in accordance with the set value in the power supply channel sequencer 35H, and the processor 28 executes the control calculation.

As illustrated in FIGS. 35 and 36, the AD converting process for the channel 1 and the AD converting process for the channel 2 are alternately repeated. In the case where there are three or more channels, for example, when there are three channels 1 to 3, the process is repeated in order like channel 1, channel 2, channel 3, channel 1, channel 2, and channel 3. By the repetition in order, the interval for obtaining the AD converting process result for the channel 1 (the interval between $V_{de1}(n)$ and $V_{de1}(n+1)$) and the interval for obtaining the AD converting process result for the channel 2 (the interval between $V_{de2}(n)$ and $V_{de2}(n+1)$) become the same. Therefore, product development for the control calculation becomes easy.

On the other hand, as illustrated in FIGS. 35 and 36, although the AD conversion results in the ranges (X1) and (X2) are used, a large amount of the other results of the AD converting process is discarded, and the AD converter 10 is operated in vain. Particularly, the larger the number of channels to be controlled becomes, the more the AD converting process has to be performed at high speed. Consequently, it becomes important to reduce the power consumption of the AD converter 10.

FIG. 37A is a configuration diagram of an AD conversion sequencer and FIGS. 37B and 37C illustrate an example of the operation flow of the power supply device according to setting of the AD conversion sequencer.

FIG. 37A is a configuration diagram of the AD conversion sequencer. The AD conversion sequencer 38 has a zero-th area (AA0), a first area (AA1), a second area (AA2), . . . , and the N-th area (AAN) (where N denotes a natural number). The zero-th area (AA0) includes an area for determining the number of the final area until which the setting is repeated and an area for determining an AD conversion cycle. Each of the first to N-th areas (AA1 to AAN) includes an area for setting the operation channel and an area for setting conversion time. The precondition of the AD converting process is that the AD converting processes for the channels are repeated in order. As described above, when there are three channels of channel 1 to channel 3, the process is repeated in order like channel 1, channel 2, channel 3, channel 1, channel 2, and channel 3.

FIGS. 37B and 37C concretely illustrate the operation flow of the power supply device 1H in which the values are set in the AD conversion sequencer 38. AA4 (fourth area) as the final area and T40 period as the AD conversion cycle are set in the zero-th area (AA0), and channels 1 and 2 as conversion channels and T41 period as conversion time are set in the first area (AA1). "no operation (NO)" as a conversion channel and T42 period as conversion time are set in the second area (AA2), and channel 1 as a conversion channel and T43 period as conversion time area set in the third area (AA3). "no operation (NO)" as a conversion channel and T44 period as conversion time are set in the fourth area (AA4), and no setting is made in the fifth area (AA5) to the N-th area (AAN). Even if some values are set in the fifth area (AA5) to the N-th area(AAN), since the fourth area (AA4) is set in the zero-th area, no influence is exerted on the operation.

As illustrated in FIG. 37C, first, since channels 1 and 2 and T41 period are set in the first area (A1), the AD converting process is performed in the channels 1 and 2 only for the period T41. Since the T40 period is set in the zero-th area (AA0), the AD converting process in the channel 1 and that in the channel 2 are alternately performed in T40 cycles. Since "NO" (no operation) and T42 period are set in the second area (AA2), the AD converting process is not performed in the period T42. Since the channel 1 and T43 period are set in the third area (AA3), the AD converting process in the channel 1 is performed and the AD converting process in the channel 2 is not performed. Since "NO" (no operation) and T44 period are set in the fourth area (AA4), the AD converting process is not performed in the period T44. Since the fourth area (AA4) is set in the zero-th area, the AD converting processes for the respective channels are repeated in the above-described order. In this case, T45=T41+T42+T43+T44. Therefore, the AD converting processes in the channels are executed in the above-described order every T45 period.

The cycle of the AD converting process and results of the AC converting process for the necessary channels are to be determined according to the values set in the power supply channel sequencer 35H. It is, therefore, sufficient to set the set values according to the setting in the power supply channel sequencer 35H in the AD conversion sequencer 38. Concretely, in the case of making settings such that AD converting process results in the channels 1 and 2 are necessary in a period corresponding to the T41 period and AD converting process results in the channel 1 are necessary in a period corresponding to the T43 period, it is sufficient to set the set values illustrated in FIG. 37 into the AD conversion sequencer 38. The setting of the AD conversion sequencer 38 may be made in the step S12 in FIG. 32. As the error signal ($V_{de}$) used in the processor 28, the latest error signal ($V_{de}$) is used as much as possible. From the necessary number of AD converting process results accompanying the initial "first interrupt signal" (IS1) and time required to take the AD converting process results, how much the start time of the AD converting process has to be earlier than the process start time of the processor 28 is determined. Consequently, an area for determining how much the start time of the AD converting process to be earlier than the process start time of the processor 28 accompanying the initial "first interrupt signal" (IS1) may be provided in the power supply channel sequencer 35H.

In the embodiment, the program stored in the nonvolatile memory 31 in the processor 28, which can execute calculation of the prediction values ($V_{pr}$) in the first to fourth embodiments and the hysteresis control and combination of the calculation and the control as shown in FIGS. 25 and 26 and the description of the diagrams. In the sixth embodiment, calculation of the prediction values ($V_{pr1}$ and $V_{pr2}$) and the hysteresis control are performed by software in the sixth embodiment. When calculation of the prediction values ($V_{pr1}$ and $V_{pr2}$) and the hysteresis control of various types are performed, the circuit scale increases, and the area of the power supply control circuit 5H and the power supply device 1H, particularly, the area of a power supply IC obtained by integrating a part of the power supply device 1H is enlarged, so that the cost increases.

Since the calculation of the prediction values ($V_{pr1}$ and $V_{pr2}$) and the hysteresis control of various types can be performed by adding or changing the program in the embodiment, the area of the power supply IC is not enlarged. The power supply channel sequencer 35H can set the calculation cycle and the priority in each of the channels.

Further, the interrupt control is performed according to the setting of the power supply channel sequencer 35H, and the calculation of the prediction values ($V_{pr1}$ and $V_{pr2}$) and the hysteresis control for each of the channels are executed. With such a configuration, the calculation of the prediction values ($V_{pr1}$ and $V_{pr2}$) and the hysteresis control for each of the channels performed in the process of the processor 28 based on a program can be easily time-controlled, and the program development is also facilitated. Further, by using the interrupt control, the processor 28 can repeat the sleep state and the control calculation state. Therefore, since there is the sleep state, power consumption of the processor 28 is reduced. Further, since there is the AD conversion sequencer 38, discard of the AD converting process results can be suppressed, and power consumption of the power supply control circuit 5H and the power supply device 1H can be reduced.

Further, while performing the control using the prediction values ($V_{pr1}$ and $V_{pr2}$), the processor 28 and the AD converter 10 are commonly used in the channels. Therefore, by the existence of the prediction periods ($T_{pr1}$ and $T_{pr2}$) used for calculating the prediction values ($V_{pr1}$ and $V_{pr2}$), deterioration in response caused by performing the control calculation for the channels in a time sharing manner can be prevented. Particularly, by properly setting the prediction periods ($T_{pr1}$ and $T_{pr2}$), deterioration in response caused by performing the control calculation for channels in a time sharing manner can be prevented.

In the embodiment, deterioration in response can be prevented more effectively under the following conditions.

Prediction period ($T_{pr1}$)≥delay time ($T_{ad1}$) in AD conversion+delay time ($T_{c21}$) by control calculation of prediction+delay time ($T_{c11}$) by control calculation of hysteresis+calculation cycle of channel 1  (1) Channel 1

In FIG. 31, the calculation cycle of channel 1 is the period (T11).

Prediction period ($T_{pr2}$)≥delay time ($T_{ad2}$) in AD conversion+delay time ($T_{c22}$) by control calculation of prediction+delay time ($T_{c12}$) by control calculation of hysteresis+calculation cycle of channel 2+α  (2) Channel 2

In FIG. 31, the calculation cycle of channel 2 is the period (T12). α denotes a term for correcting delay in calculation time caused when the priority is 2 or less.

That is, when the period obtained by adding the difference between calculation periods adjacent to each other in each of the channels is equal to or less than the prediction time ($T_{pr}$), deterioration in response can be prevented.

In the case of performing control which does not use the prediction value ($V_{pr}$), the control calculation cannot be performed in each channel while the control calculation of another channel is performed, and deterioration in response is caused by the period. In the embodiment, such a problem can be prevented.

Further, the processor 28 and the AD converter 10 of each channel are commonly used to perform the control calculation for each channel in time sharing manner. The timings of updating the control signals ($V_{c1}$ and $V_{c2}$) are always deviated among the channels, occurrence of noise accompanying drive of the switching element at the same time in a plurality of channels can be prevented, and noise in the power supply device 1H can be reduced. In the case where noise is desired to be prevented when the hysteresis arithmetic unit 13G for plurality of channels and the AD converter 10 in each of the channels are not commonly used, the timings of updating the control signals ($V_{c1}$ and $V_{c2}$) for the channels have to be deviated, and a device for this purpose is required.

Further, while performing control using the prediction values ($V_{pr1}$ and $V_{pr2}$), the processor 28 and the AD converter 10 of the channels are commonly used, and the control calculation for the channels is performed in time sharing manner. With the configuration, while preventing deterioration in response by performing the control calculation for the channels in time-sharing manner, an effect of reducing noise in the entire power supply device 1H can be also achieved.

Although the invention achieved by the inventors herein has been described concretely on the basis of the embodiments, obviously, the invention is not limited to the embodiments but can be variously changed without departing from the gist.

For example, in the first to seventh embodiments, the register for setting a target voltage of the target voltage setting circuit may be provided in the digital controller.

Although a so-called step-down DC-DC converter is described as the power supply circuit, a boost DC-DC converter may be employed.

What is claimed is:

1. A semiconductor integrated circuit device comprising a plurality of error voltage detecting circuits, an analog-to-digital (AD) converter, and a digital controller,
    wherein each of the error voltage detecting circuits comprises:
    a target voltage generating circuit configured to generate a target voltage; and
    a differential output circuit configured to output an error voltage based on the difference between an output voltage and the target voltage;
    the AD converter being configured to convert the error voltage to a digital value and output the digital value as an error signal,
    wherein the digital controller generates a prediction value of the error signal in accordance with a first error signal generated by converting the error voltage to a digital value at a first timing and a second error signal generated by converting the error voltage to a digital value at a second timing that is before the first timing, the digital controller further generating a control signal so that the prediction value lies between a first control threshold and a second control threshold smaller than the first control threshold, and
    wherein the prediction value is obtained at a third timing that is later than the first timing.

2. The semiconductor integrated circuit device according to claim 1,
    wherein the AD converter outputs the error signals corresponding to the plurality of power supply detecting circuits to the digital controller in a time sharing manner;
    wherein the digital controller has setting circuits of the number at least equal to that of the plurality of error voltage detecting circuits, the setting circuits each having a first register storing the first control threshold, a second register storing the second control threshold, and a third register storing a length of a prediction period between the first error signal and the prediction value, and
    wherein the digital controller generates the control signals corresponding to the plurality of error voltage detecting circuits by using values of the registers of the setting circuits corresponding to the plurality of power error voltage detecting circuits, respectively.

3. The semiconductor integrated circuit device according to claim 2,
    wherein the digital controller comprises a processor;
    wherein the digital controller further comprises a sequencer capable of setting a cycle of generating the control signal corresponding to each of the plurality of error voltage detecting circuits and capable of setting priority of generation of the plurality of control signals, and
    wherein the control signals are generated by the digital controller by outputting an interrupt request signal to the processor based on data set in the sequencer.

4. The semiconductor integrated circuit device according to claim 1, wherein the digital controller determines erroneous operation when the first error signal is larger than the first control threshold and the prediction value is smaller than the second control threshold or when the first error signal is smaller than the second control threshold and the prediction value is larger than the first control threshold, and outputs the determination result.

5. The semiconductor integrated circuit device according to claim 4,
    wherein the digital controller determines a first erroneous operation mode as the erroneous operation when the first error signal is larger than the first control threshold and the prediction value is smaller than the second control threshold, and determines a second erroneous operation mode as the erroneous operation when the first error signal is smaller than the second control threshold and the prediction value is larger than the first control threshold;
    wherein the digital controller controls to decrease the output voltage by the control signal in the first erroneous operation mode, and
    wherein the digital controller controls to increase the output voltage by the control signal in the second erroneous operation mode.

6. The semiconductor integrated circuit device according to claim 1, wherein frequency of sampling the error voltage of the AC converter is higher than switching frequency of the switching element.

7. The semiconductor integrated circuit device according to claim 4, wherein the digital controller further comprises a first register configured to set the first control threshold, a second register configured to set the second control threshold, and a third register configured to set length of a prediction period between the first error signal and the prediction value.

8. The semiconductor integrated circuit device according to claim 7, wherein when the erroneous operation is detected, a value in at least any of the first, second, and third registers is rewritten from the outside.

* * * * *